(12) United States Patent  
Nakagawa et al.

(10) Patent No.: US 10,325,841 B2  
(45) Date of Patent: Jun. 18, 2019

(54) SEMICONDUCTOR DEVICE

(71) Applicant: Renesas Electronics Corporation, Koutou-ku, Tokyo (JP)

(72) Inventors: Kazuyuki Nakagawa, Tokyo (JP); Katsushi Terajima, Tokyo (JP); Keita Tsuchiya, Tokyo (JP); Yoshiaki Sato, Tokyo (JP); Hiroyuki Uchida, Tokyo (JP); Yuji Kayashima, Tokyo (JP); Shuuichi Kariyazaki, Tokyo (JP); Shinji Baba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/063,280

(22) PCT Filed: Feb. 10, 2016

(86) PCT No.: PCT/JP2016/054003  
§ 371 (c)(1),  
(2) Date: Jun. 17, 2018

(87) PCT Pub. No.: WO2017/138121  
PCT Pub. Date: Aug. 17, 2017

(65) Prior Publication Data  
US 2018/0374788 A1 Dec. 27, 2018

(51) Int. Cl.  
*H01L 23/52* (2006.01)  
*H01L 23/498* (2006.01)  
(Continued)

(52) U.S. Cl.  
CPC .... *H01L 23/49827* (2013.01); *H01L 23/5383* (2013.01); *H01L 23/5385* (2013.01);  
(Continued)

(58) Field of Classification Search  
CPC ............ H01L 25/0657; H01L 25/0655; H01L 25/0652; H01L 24/16; H01L 24/06;  
(Continued)

(56) References Cited

U.S. PATENT DOCUMENTS 7,402,901 B2 * 7/2008 Hatano ............... H01L 23/5389  
257/684  
9,041,205 B2 * 5/2015 Karhade ............... H01L 23/538  
257/690  
(Continued)

FOREIGN PATENT DOCUMENTS

JP 2003-345480 A 12/2003  
JP 2008-109331 A 5/2008  
(Continued)

OTHER PUBLICATIONS

International Search Report from International Patent Application No. PCT/JP2016/054003, dated Apr. 26, 2016.

*Primary Examiner* — Luan C Thai  
(74) *Attorney, Agent, or Firm* — Shapiro, Gabor and Rosenberger, PLLC

(57) ABSTRACT

According to an embodiment of the present invention, there is provided a semiconductor device having a first semiconductor component and a second semiconductor component which are mounted on a wiring substrate. The first semiconductor component has a first terminal for transmitting a first signal between the first semiconductor component and the outside and a second terminal for transmitting a second signal between the first semiconductor component and the second semiconductor component. In addition, the second semiconductor component has a third terminal for transmitting the second signal between the second semiconductor component and the first semiconductor component. Further, the first signal is transmitted at a higher frequency than the second signal. Furthermore, the second terminal of the first  
(Continued)

semiconductor component and the third terminal of the second semiconductor component are electrically connected to each other via the first wiring member. In addition, the first terminal of the first semiconductor component is electrically connected to the wiring substrate via a first bump electrode without the first wiring member interposed therebetween.

15 Claims, 25 Drawing Sheets

(51) Int. Cl.
  *H01L 25/065* (2006.01)
  *H01L 25/07* (2006.01)
  *H01L 25/18* (2006.01)
  *H01L 23/538* (2006.01)
  *H01L 23/00* (2006.01)

(52) U.S. Cl.
  CPC .............. *H01L 24/06* (2013.01); *H01L 24/13* (2013.01); *H01L 24/14* (2013.01); *H01L 24/16* (2013.01); *H01L 24/20* (2013.01); *H01L 25/065* (2013.01); *H01L 25/0652* (2013.01); *H01L 25/0655* (2013.01); *H01L 25/07* (2013.01); *H01L 25/18* (2013.01); *H01L 2224/16225* (2013.01); *H01L 2924/15174* (2013.01); *H01L 2924/15192* (2013.01)

(58) Field of Classification Search
  CPC ... H01L 24/14; H01L 24/20; H01L 23/49827; H01L 23/5383; H01L 23/5385
  USPC ......................................................... 257/738
  See application file for complete search history.

(56) References Cited

U.S. PATENT DOCUMENTS

| | | | |
|---|---|---|---|
| 9,651,751 B1* | 5/2017 | Ding | .................... G02B 6/428 |
| 9,666,559 B2* | 5/2017 | Wang | ................. H01L 25/0655 |
| 9,997,446 B2* | 6/2018 | Kim | ..................... H01L 21/6835 |
| 2008/0297221 A1 | 12/2008 | Denda et al. | |
| 2011/0163919 A1 | 7/2011 | Suzuki | |
| 2013/0193587 A1 | 8/2013 | Chen et al. | |
| 2014/0048928 A1 | 2/2014 | Li et al. | |
| 2014/0131854 A1 | 5/2014 | Hawk et al. | |
| 2014/0264791 A1 | 9/2014 | Manusharow et al. | |

FOREIGN PATENT DOCUMENTS

| | | |
|---|---|---|
| JP | 2009-010913 A | 1/2009 |
| JP | 2009-043818 A | 2/2009 |
| JP | 2014-099591 A | 5/2014 |
| JP | 2014-179613 A | 9/2014 |
| WO | WO 2010/026990 A1 | 3/2010 |

* cited by examiner

SEMICONDUCTOR DEVICE

TECHNICAL FIELD

The present invention relates to a semiconductor device, and relates to a technique effectively applied to, for example, a semiconductor device in which a plurality of semiconductor components such as semiconductor chips are electrically connected to one another via a wiring member.

BACKGROUND ART

Japanese Patent Application Laid-Open Publication No. 2014-99591 (Patent Document 1) and Japanese Patent Application Laid-Open Publication No. 2014-179613 (Patent Document 2) each describes a structure in which two semiconductor chips are electrically connected to each other via a member known as a bridging block or a bridge. In addition, Japanese Patent Application Laid-Open Publication No. 2003-345480 (Patent Document 3) describes a structure in which two semiconductor chips are electrically connected to each other via a wiring substrate.

RELATED ART DOCUMENTS

Patent Documents

Patent Document 1: Japanese Patent Application Laid-Open Publication No. 2014-99591
Patent Document 2: Japanese Patent Application Laid-Open Publication No. 2014-179613
Patent Document 3: Japanese Patent Application Laid-Open Publication No. 2003-345480

SUMMARY OF THE INVENTION

Problems to be Solved by the Invention

A known technique for performing signal transmission between semiconductor components is to electrically connect a plurality of semiconductor components mounted on a wiring substrate to one another via a wiring member such as an interposer. However, there is still room for improvement in terms of improving the performance of the semiconductor device utilizing such a technique.

Other problems and novel features will be apparent from the descriptions in the present specification and the attached drawings.

Means for Solving the Problems

According to an embodiment of the present invention, there is provided a semiconductor device having a first semiconductor component and a second semiconductor component which are mounted on a wiring substrate. The first semiconductor component has a first terminal for transmitting a first signal between the first semiconductor component and the outside and a second terminal for transmitting a second signal between the first semiconductor component and the second semiconductor component. In addition, the second semiconductor component has a third terminal for transmitting the second signal between the second semiconductor component and the first semiconductor component. Further, the first signal is transmitted at a higher frequency than the second signal. Furthermore, the second terminal of the first semiconductor component and the third terminal of the second semiconductor component are electrically connected to each other via the first wiring member. In addition, the first terminal of the first semiconductor component is electrically connected to the wiring substrate via a first bump electrode without the first wiring member interposed therebetween.

Effects of the Invention

According to the above-described embodiment, performance of the semiconductor device can be improved.

Figure 1:
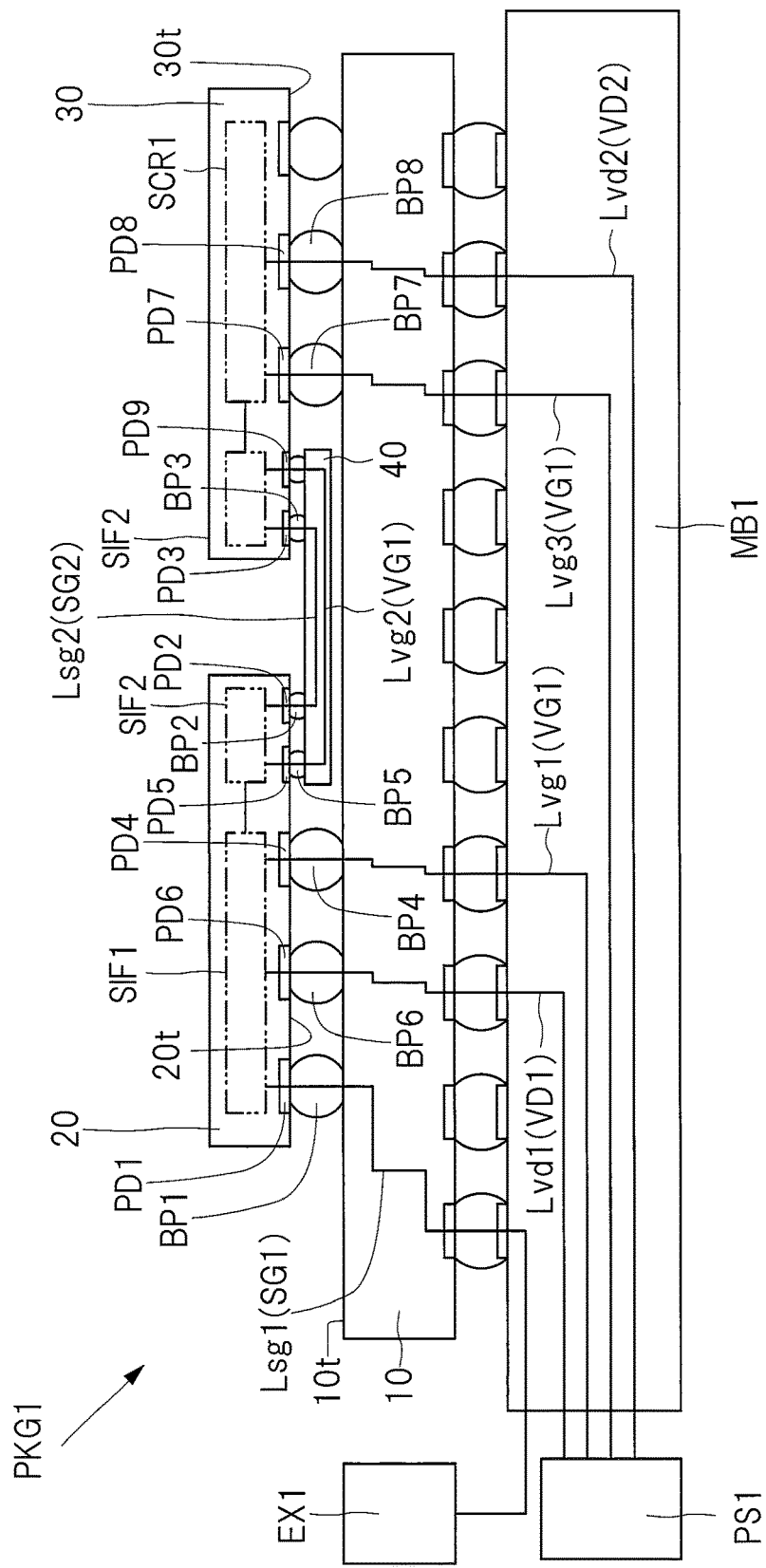
FIG. 1 is an explanatory drawing schematically showing a configuration example of a semiconductor device according to an embodiment of the present invention.

DETAILED DESCRIPTION OF PREFERRED EMBODIMENTS (Explanation of Description Format, Basic Terminology and Usage in Present Application)

In the present application, an embodiment will be described in a plurality of sections or the like when necessary for the sake of convenience. However, these sections or the like are not independent or separate from each other unless otherwise clearly specified, and one portion of an example corresponds to another detailed portion, another portion, an entire modification or the like, regardless of the order of the description. In addition, redundant descriptions of identical portions will be omitted in principal. Further, each of the components in the embodiment is not always indispensable unless otherwise clearly specified, it is theoretically limited to a given number or it is obvious from the context that the component is indispensable.

Likewise, in the description of the embodiment and the like, the wording such as "X made of A" used in association with a material, a composition or the like does not exclude those containing elements other than A unless otherwise clearly specified or it is obvious from the context that the material, the composition or the like only contains A. For instance, "X made of A" used for a component means "X containing A as a main component" or the like. It is needless to say that, for example, a "silicon member" or the like is not limited to a member made of pure silicon but includes a member made of a SiGe (silicon germanium) alloy or a multicomponent alloy containing silicon as a main component, and a member containing other additives and the like. In addition, a gold plating, a Cu layer, a nickel plating or the like is not limited to a member made of a pure component and includes a member respectively containing gold, Cu, nickel or the like as a main component unless otherwise clearly specified.

Further, when referring to a specified numerical value or a quantity, the numerical value may be less than or greater than the specified numerical value unless otherwise clearly specified, it is theoretically limited to the specified value or it is obvious from the context that the value may not be less than or greater than the specified value.

In addition, in all of the drawings of the embodiment, the same or identical portions are denoted by the same or similar symbols or reference numbers, and redundant descriptions of the components are omitted in principle.

Further, in the attached drawings, hatched lines and the like are occasionally omitted even if the drawing is a cross section if the hatched lines make the drawings complicated or a difference between a member and a void is obvious. In this context, contour lines of a background are occasionally omitted even for a closed circle in plan view if it is obvious from the descriptions or the like. Furthermore, hatched lines or stippled dots are occasionally added even if the drawing is not a cross section in order to clarify that the portion is not a void or in order to clarify a boundary of a region.

In addition, in the present application, a semiconductor component obtained by forming an integrated circuit on a semiconductor substrate made of a semiconductor material such as silicon (Si) and cutting it into a plurality of individual pieces is referred to as a "semiconductor chip". Further, a semiconductor component having the semiconductor chip, a base member (such as a wiring substrate or a lead frame) on which the semiconductor chip is mounted and a plurality of external terminals electrically connected to the semiconductor chip is referred to as a "semiconductor package". Furthermore, the semiconductor chip and the semiconductor package may occasionally be referred to as a "semiconductor component" or a "semiconductor device". The terms "semiconductor component" and "semiconductor device" are generic terms for the semiconductor chip and the semiconductor package. In addition, the semiconductor component or the semiconductor device includes those having the plurality of semiconductor components mounted on the base member such as the wiring substrate. For example, the embodiment described below having the plurality of semiconductor components mounted on the wiring substrate is referred to as the "semiconductor device". Therefore, the semiconductor component of the embodiment described below refers to a component which is a semiconductor chip or a semiconductor package.

<Regarding Semiconductor Device on which a Plurality of Semiconductor Components are Mounted>

Efforts to improve performance of the semiconductor device include such efforts for improving data processing speed, diversifying data processing functions and improving communication speed. In addition, when seeking to improve the performance, the device needs to be suppressed from increasing in size by the improvements in order to satisfy a desire to miniaturize the semiconductor device.

Here, in a case where, for example, a large number of functions are built in a single semiconductor chip, a mounting area of the semiconductor chip is increased, causing the semiconductor device to increase in size. In addition, in a case where a large number of functions (such as various types of circuits or a large number of circuits) are built in a single semiconductor chip, the entire design of the semiconductor chip needs to be reviewed when improving the performance of some of the functions of the semiconductor chip, causing the development time to increase.

On the other hand, in a case of a structure in which a plurality of semiconductor components are mounted on a single semiconductor package, the functions (circuit blocks) within each of the semiconductor components can be simplified. Thus, it is possible to suppress the final semiconductor device even if the plurality of semiconductor components are built in the semiconductor package. In addition, when improving the performance of some of the functions of the semiconductor chip, only the design of the semiconductor component having the function in which the performance is improved needs to be reviewed, so that the development time can be shortened.

Further, in a case where the circuits (functions) within each of the semiconductor components are electrically connected to one another, the plurality of semiconductor components need to be electrically connected to one another in order to transmit signals between the plurality of semiconductor components. Accordingly, the plurality of semiconductor components are electrically connected to one another other via, for example, a wiring member such as an interposer 40 described below and shown in FIG. 1, so that the signals can be transmitted via the wiring member.

The wiring member such as the interposer 40 can be formed having a larger number of wirings arranged at a higher density as compared to a wiring substrate (package substrate) serving as a base member of the semiconductor package. Thus, in the case where the plurality of semiconductor components are electrically connected to one another via the interposer, the semiconductor device can be suppressed from increasing in size by the interposer.

However, although the wiring member such as the interposer can have a large number of wiring paths mounted at a high density, impedance properties of each of the wiring paths are deteriorated. For example, since a cross-sectional area of each of the wiring paths is small, wiring resistance is large. Further, for example, since an impedance value of each of the wiring paths is easily affected by the wiring structure, an impedance discontinuity point is likely to generate midway along a signal transmission path. Therefore, in a case where a high-frequency signal is transmitted via the wiring path within the interposer, signal transmission may be interrupted due to the impedance properties of the wiring path.

Hereinafter, a semiconductor device PKG1 of the present embodiment shown in FIG. 1 and a semiconductor device PKGh1 shown in FIG. 28 which is an example studied with respect to FIG. 1 will be described. FIG. 1 is an explanatory drawing schematically showing a configuration example of the semiconductor device according to the present embodiment. In addition, FIG. 28 is an explanatory drawing schematically showing a configuration of a semiconductor device according to an example studied with respect to FIG. 1.

Figure 28:
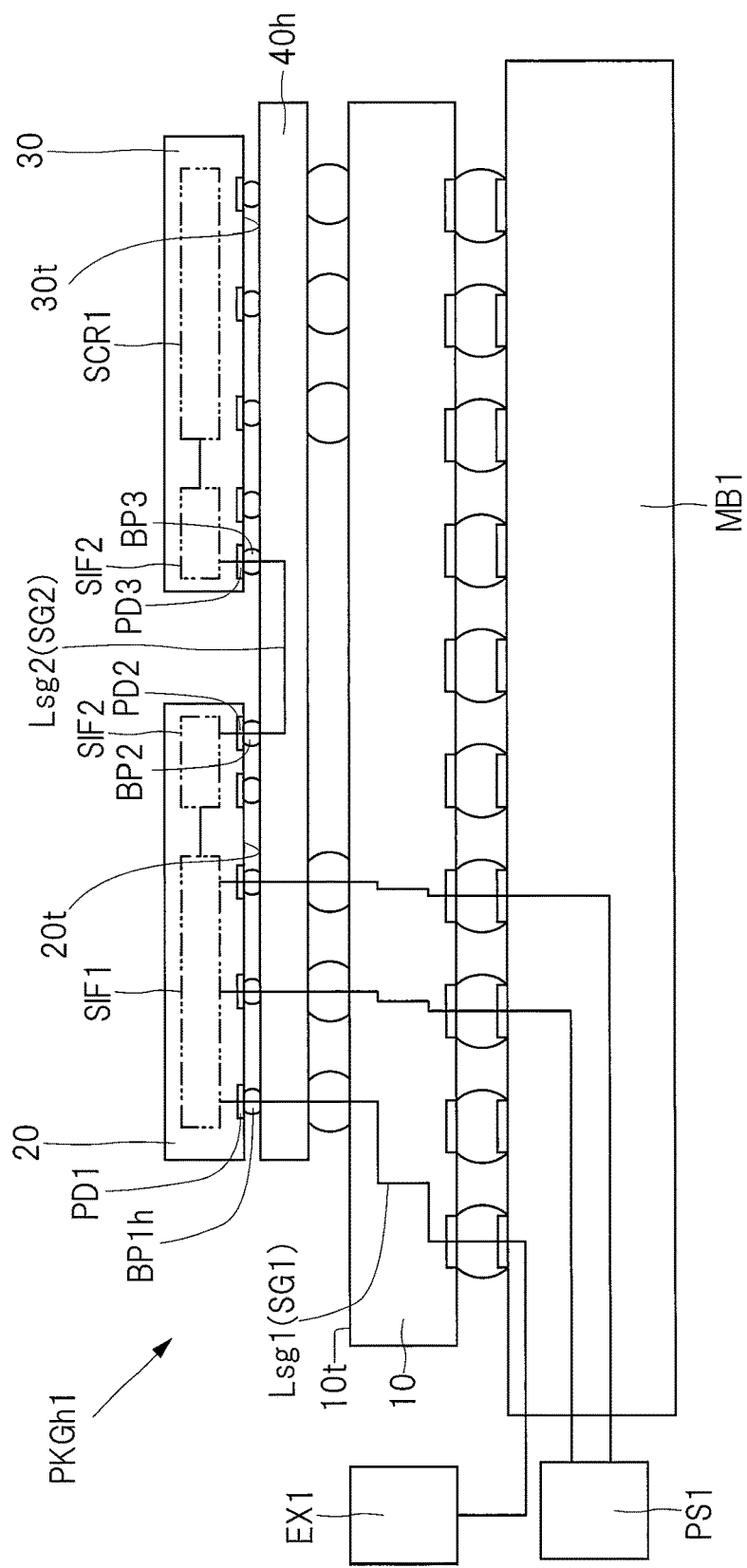
FIG. 28 is an explanatory drawing schematically showing a configuration of a semiconductor device according to an example studied with respect to FIG. 1.

Although each of FIGS. 1 and 28 is a cross-sectional view, hatched lines are omitted in order to easily view the configuration example and a circuit configuration example of the semiconductor device. In addition, circuits within a semiconductor component 20 and a semiconductor component 30 are schematically indicated by two-dot chain lines and signal transmission paths connected to each of the circuits are indicated by solid lines.

Further, FIGS. 1 and 28 schematically show a state in which the semiconductor device is mounted on a mounting board (motherboard) MB1 and is connected to an external device EX1 and a potential-supply unit PS1 via the mounting board MB1. In other words, FIG. 1 shows a configuration of an electronic device in which the semiconductor device PKG1 is mounted on the mounting board MB1 and is electrically connected to the external device EX1 via the mounting board MB1.

In addition, each of FIGS. 1 and 28 shows representative wiring paths within the semiconductor device PKG1 (semiconductor device PKGh1 in FIG. 28). Therefore, the actual number of wiring paths within the semiconductor device PKG1 (semiconductor device PKGh1 in FIG. 28) may be greater than or equal to the number of wiring paths shown in FIG. 1 or 28.

Each of the semiconductor device PKG1 shown in FIG. 1 and semiconductor device PKGh1 (see FIG. 28) has a wiring substrate 10 which is the package substrate, the semiconductor component and the semiconductor component 30 mounted on an upper surface 10t of the wiring substrate 10, and the interposer 40 (interposer 40h in FIG. 28) which is a wiring member for electrically connecting the semiconductor component 20 and the semiconductor component 30 to each other. The interposer (bridge chip) 40 is a wiring member comprising a plurality of wiring paths electrically connecting the semiconductor component 20 and the semiconductor component 30 to each other without the wiring substrate 10 interposed therebetween.

In addition, each of the semiconductor device PKG1 and semiconductor device PKGh1 (see FIG. 28) comprises a core circuit (main circuit) SCR1 and an external interface circuit (external input/output circuit) SIF1 for performing signal transmission between the semiconductor device and the external device EX1. An arithmetic processing circuit (arithmetic processing unit) for arithmetically processing data signals is provided in the core circuit SCR1. In addition, circuits other than the arithmetic processing circuit may also be provided in the core circuit SCR1.

In the examples shown in FIGS. 1 and 28, the semiconductor component 30 comprises the core circuit SCR1 and the semiconductor component 20 comprises the external interface circuit SIF1. In addition, each of the semiconductor component 20 and semiconductor component 30 has an internal interface circuit SIF2 electrically connected to each other via the interposer 40. The internal interface circuit SIF2 of the semiconductor component 30 is electrically connected to the arithmetic processing circuit of the core circuit SCR1. In addition, the internal interface circuit SIF2 of the semiconductor component 20 is electrically connected to the external interface circuit SIF1. In other words, the arithmetic processing circuit of the core circuit SCR1 within the semiconductor component 30 is electrically connected to the external device EX1 via the internal interface circuit SIF2 and the external interface circuit SIF1 within the semiconductor component 30.

In addition, a signal SG1 is transmitted by a serial communication method via a signal transmission path Lsg1 electrically connecting the semiconductor component 20 and the external device EX1 to each other. In other words, the signal SG1 is a serial signal configured to be transmitted by the serial communication method. On the other hand, a signal SG2 is transmitted by a parallel communication method via a signal transmission path Lsg2 electrically connecting the semiconductor component 20 and the semiconductor component 30 to each other. In other words, the signal SG2 is a parallel signal configured to be transmitted by the parallel communication method.

The serial communication method is a communication method that allows data constituted by a plurality of bits to be sequentially transmitted one bit at a time via the signal transmission path. On the other hand, the parallel communication method is a communication method that allows a plurality of constituent data to be concurrently transmitted as a bit group via the plurality of signal transmission paths.

When considering a case where the data transfer rate required for the semiconductor device PKG1 is fixed, the parallel communication method allows data to be transferred via the plurality of signal transmission paths, so that transmission speed (transmission frequency, clock rate) in each of the signal transmission paths can be set lower as compared to the serial communication method. In addition, the parallel communication method allows the input/output circuit to have a structure that is simpler as compared to the serial communication method. Thus, a structure of the internal interface circuit SIF2 can be simplified in the case where the signal SG2 shown in FIG. 1 is transmitted by the parallel communication method. In this case, an area occupied by the internal interface circuit SIF2 can be reduced, so that the semiconductor device PKG1 can be miniaturized.

Note that a signal transmission distance in the parallel communication method has an upper limit that is typically lower as compared to the serial communication method. For example, the parallel communication method allows data to be simultaneously transferred via the plurality of signal transmission paths, causing a distance of high-speed signal transmission to increase and make synchronization difficult as clock skew increases. In addition, in the parallel communication method, data transfer speed is defined by, for example, a bus width (number of signal transmission paths). Thus, in the case of the parallel communication method, a large number of signal transmission paths are provided at a high density. In this manner, when a large number of signal transmission paths are provided at a high density, the signal transmission distance is increased, causing a problem regarding crosstalk noise to occur between the parallel signal paths.

On the other hand, in the case of the serial communication method, the input/output circuit would need a conversion circuit for converting signals between the serial communication method and the parallel communication method, causing the circuit structure to become more complicated than in the parallel communication method. For example, in the semiconductor component 20 shown in FIG. 1, an area occupied by the external interface circuit SIF1 is larger than an area occupied by the internal interface circuit SIF2 in plan view. In the conversion circuit, the signal inputted by the serial communication method is converted into a signal for the parallel communication method and is outputted, and the signal inputted by the parallel communication method is converted into a signal for the serial communication method and is outputted. This conversion circuit is known as "SerDes" (Serializer/Deserializer).

However, in the case of the serial communication method, the data constituted by the plurality of bits is sequentially transmitted one bit at a time, so that a synchronization problem caused by the clock skew is less likely to occur even if the signal transmission distance is increased. In addition, in the case of the serial communication method, by increasing transmission speed (transmission frequency, clock rate) of each of the signal transmission paths, data transfer speed can be increased, so that the number of signal transmission paths can be reduced as compared to the parallel communication method. Thus, countermeasures for reducing an adverse effect caused by crosstalk noise between adjacent signal transmission paths can be easily implemented. For example, a shield conductor layer that allows a fixed potential to be supplied may be arranged in a periphery of the signal transmission path, so that the adverse effect caused by crosstalk noise between adjacent signal transmission paths can be reduced.

As described above, each of the parallel communication method and serial communication method has its own advantages. The parallel communication method is used at a portion where the signal transmission distance is short as in the signal transmission path Lsg2 shown in FIG. 1 or the like, so that the semiconductor device PKG1 can be miniaturized. On the other hand, the signal transmission distance becomes relatively long at a portion for transmitting a signal between the semiconductor component and the outside of the semiconductor device PKG1 as in the signal transmission path Lsg1. Thus, the serial communication method is applied to the signal transmission path Lsg1, so that signal transmission can be stably performed.

For example, consider a case where the data transfer speed between the semiconductor device PKG1 and the external device EX1 is 1.05 TB/s (terabits per second). FIG. 1 representatively shows the signal transmission path Lsg1 of a differential pair and one signal transmission path Lsg2. In a case where the transmission speed of the signal transmission path Lsg1 of the differential pair is 56 Gbps (gigabits per second), the data transfer speed of 1.05 TB/s can be achieved by providing 150 pairs of signal transmission paths Lsg1. Each of the signal transmission paths Lsg1 of the differential pair is constituted by a pair of wiring paths. Therefore, when considering a sending signal transmission path and a receiving signal transmission path, the number of terminals necessary to achieve the data transfer speed of 1.05 TB/s is 150×2×2=600 terminals. In addition, in a case where the transmission speed of one signal transmission path Lsg2 is 2 Gbps, the data transfer speed of 1.05 TB/s can be achieved by providing 4,200 signal transmission paths Lsg2.

Note that, in a case where two bits of data are transmitted at one wavelength of a signal waveform, the relation between the transmission speed and the frequency becomes 2:1. Therefore, when the above-described examples are converted to frequency, the frequency of the signal waveform of the signal SG1 becomes 28 GHz (gigahertz) in the case where the transmission speed of the signal transmission path Lsg1 is 56 Gbps. In addition, the frequency of the signal waveform of the signal SG1 becomes 1 GHz (gigahertz) in the case where the transmission speed of the signal transmission path Lsg2 is 2 Gbps.

As in the case described above where a large number of signal transmission paths Lsg1 are connected to the external interface circuit SIF1, an area occupied by the external interface circuit SIF1 is increased. Thus, in a case where all signal transmission paths Lsg1 are connected to the semiconductor component 30, the layout of each of the core circuit SCR1 and external interface circuit SIF1 is greatly restricted, causing a plane area of the semiconductor component (area of main surface 30t) to increase. However, by providing a structure as in the present embodiment in which at least some of the signal transmission paths Lsg1 are connected to the semiconductor component 20 and in which signal transmission is performed between the core circuit SCR1 of the semiconductor component 30 and the outside via the semiconductor component 20, the layout of each of the semiconductor component 20 and semiconductor component 30 can be simplified.

Here, as in the semiconductor device PKGh1 shown in FIG. 28, a method in which the interposer 40h is mounted on the wiring substrate 10 and in which the semiconductor component 20 and the semiconductor component 30 are mounted on the interposer 40*h* is conceivable as a method of electrically connecting the semiconductor component 20 and the semiconductor component 30 to each other. In the case of the semiconductor device PKGh1, the entire semiconductor component 20 and the entire semiconductor component 30 are mounted on the interposer 40*h*. In other words, each of the semiconductor component 20 and semiconductor component 30 within the semiconductor device PKGh1 is electrically connected to the wiring substrate 10 via the interposer 40*h*.

Thus, in the case of the semiconductor device PKGh1, a portion of the signal transmission path Lsg1 for transmitting the signal SG1 by the serial communication method passes through the interposer 40*h*. The interposer 40*h* is a wiring member on which the signal transmission path Lsg2 for transmitting the signal SG2 by the parallel communication method is formed. Thus, fine wirings having a smaller cross-sectional area as compared to the wiring substrate 10 are arranged on the interposer 40*h* at a high density. In other words, design rules applied to the wiring design of the interposer 40*h* differs from the design rules applied to the wiring design of the wiring substrate 10 in that design standard values of a wiring thickness, a wiring width and a distance between adjacent wirings are shorter in the interposer 40*h* as compared to the wiring substrate 10. For example, in the example shown in FIG. 28, a volume of a bump electrode BPh1 connected to a terminal PD1 of the semiconductor component 20 partially configuring the signal transmission path Lsg1 is smaller than a volume of a bump electrode (conductive member) BP1 shown in FIG. 1 and is approximately equal to a volume of each of a bump electrode (conductive member) BP2 and bump electrode (conductive member) BP3.

Thus, a wiring resistance of the wiring path within the interposer 40*h* is relatively high as compared to a wiring resistance of the wiring path within the wiring substrate 10. Therefore, signal loss caused by the wiring resistance is more likely to occur in the interposer 40*h* as compared to the wiring substrate 10. In addition, since the impedance value of each of the wiring paths is easily affected by the wiring structure, an impedance discontinuity point is likely to generate midway along the signal transmission path. Further, transmission loss caused by reflection of the signal occurs at the impedance discontinuity point.

In addition, the degree of signal loss in the case where the signal transmission is performed with utilizing a fine wiring path having a small cross-sectional area varies according to the wavelength of the signal to be transmitted, that is, the frequency. Namely, in a case where a low-frequency signal has a long signal wavelength, loss that occurs when the signal passes through the fine wiring path is small. On the other hand, in a case where a high-frequency signal has a short signal wavelength, signal loss is large since the signal is easily affected by the loss caused by the wiring resistance and the reflection at the impedance discontinuity point. In other words, in the example shown in FIG. 28, the signal loss that occurs when the signal SG1 having a relatively high transmission speed (that is, a high frequency) and being transmitted through the signal transmission path Lsg1 passes through the interposer 40*h* is larger than the signal loss that occurs when the signal SG2 being transmitted through the signal transmission path Lsg2 passes through the interposer 40*h*.

When the signal loss is increased, amplitude of the signal waveform is reduced. In addition, when the signal loss is increased, distortion occurs in the signal waveform. Thus, the signal waveform on the receiving end of the signal is distorted, causing communication reliability to decrease.

Therefore, as shown in FIG. 1, the present embodiment is configured such that the signal transmission path Lsg1 for transmitting the signal SG1 electrically connects the external interface circuit SIF1 of the semiconductor component 20 and the external device EX1 to each other without the interposer 40 interposed therebetween.

Namely, as shown in FIG. 1, the semiconductor component within the semiconductor device PKG1 comprises a main surface 20*t* on which the terminal PD1 for transmitting a signal between the semiconductor component 20 and the outside (external device EX1) and a terminal PD2 for transmitting the signal SG2 between the semiconductor component 20 and the semiconductor component 30 are arranged. In addition, the semiconductor component 30 within the semiconductor device PKG1 comprises the main surface 30*t* on which a terminal PD3 for transmitting the signal SG2 between the semiconductor component 30 and the semiconductor component 20 is arranged. Further, the signal SG1 is transmitted at a higher frequency (higher transmission speed) than the signal SG2. Furthermore, the terminal PD1 of the semiconductor component 20 is electrically connected to the wiring substrate 10 via the bump electrode BP1 without the interposer 40 interposed therebetween. In addition, the terminal PD2 of the semiconductor component 20 and the terminal PD3 of the semiconductor component 30 are electrically connected to each other via the interposer 40.

According to the present embodiment, the signal transmission path Lsg1 for transmitting the signal SG1 at a high speed (high frequency) by using the serial communication method is connected to the wiring substrate 10 via the bump electrode BP1 without the interposer 40 interposed therebetween, so that signal loss in the high-speed transmission path can be reduced. On the other hand, the signal transmission path Lsg2 for transmitting the signal SG2 between the semiconductor component 20 and the semiconductor component 30 passes through the interposer 40 having a plurality of wirings arranged at a high density. Thus, the plane area of the semiconductor device PKG1 can be suppressed from increasing in size even if the parallel communication method is applied and the number of signal transmission paths Lsg2 is increased.

As described above, the transmission speed of the signal transmission path Lsg2 is, for example, approximately 2 Gbps, and the frequency of the signal waveform of the signal SG2 is approximately 1 GHz. In a case where signal transmission is performed by a signal waveform having a frequency of approximately 1 GHz and with a transmission distance in which the semiconductor component 20 and the semiconductor component 30 are barely connected to each other, waveform quality of the signal transmission is hardly affected even if the signal passes through the interposer 40. However, in a case where the transmission speed is 10 GHz or more, transmission loss in a high-frequency band is increased and a signal cycle is shortened. This eliminates a timing margin, making it necessary to suppress deterioration of the waveform quality. For example, as long as the frequency is approximately 1 GHz, the signal can be transmitted via the interposer 40 even by the serial communication method. On the other hand, in the case where signal transmission is performed through the signal transmission path at a frequency of 10 GHz or more, signal loss can be significantly reduced by adopting a structure in which the signal transmission path Lsg1 does not pass through the interposer 40 as shown in FIG. 1, so that a satisfactory waveform quality can be obtained while an impedance mismatch is suppressed.

In addition, as shown in FIG. 1, a separation distance between the terminal PD2 of the semiconductor component 20 and the terminal PD3 of the semiconductor component 30 is shorter than a separation distance between the terminal PD1 of the semiconductor component 20 and the terminal PD3 of the semiconductor component 30. In other words, the terminal PD2 of the semiconductor component 20 is arranged between the terminal PD1 of the semiconductor component 20 and the terminal PD3 of the semiconductor component 30 in plan view. In this case, a transmission distance between the terminal PD2 and the terminal PD3 at each end portion of the signal transmission path Lsg2 for transmitting the signal SG2 via the interposer 40 can be shortened. As described above, when the transmission distance is increased in the case of the parallel communication method, the synchronization problem caused by the clock skew, the problem in which transmission loss increases and the problem in which crosstalk noise occurs become apparent. Therefore, from the viewpoint of solving these problems corresponding to the parallel communication method, it is preferable that the separation distance between the terminal PD2 and the terminal PD3 is shortened, so that the transmission distance of the signal transmission path Lsg2 is shortened.

In addition, the following configuration is preferable from the viewpoint of shortening the transmission distance of the signal transmission path Lsg2. Namely, as shown in FIG. 1, the separation distance between the terminal PD2 of the semiconductor component 20 and the terminal PD3 of the semiconductor component 30 is shorter than the separation distance between the terminal PD1 and the terminal PD2 of the semiconductor component 20. In other words, the terminal PD2 of the semiconductor component 20 is arranged at a position closer to the terminal PD3 of the semiconductor component 30 than to the terminal PD1 of the semiconductor component 20 in plan view. In this manner, the above-described problems corresponding to the parallel communication method can be solved by setting the separation distance between the terminal PD2 of the semiconductor component 20 and the terminal PD3 of the semiconductor component 30 to be just shorter than the separation distance between the terminal PD1 and the terminal PD2 of the semiconductor component, so that the transmission distance of the signal transmission path Lsg2 is shortened.

In addition, in the example shown in FIG. 1, the interposer and each of the semiconductor component 20 and semiconductor component 30 are electrically connected to each other via the bump electrodes. More specifically, the terminal PD2 of the semiconductor component 20 is electrically connected to the interposer 40 via the bump electrode BP2. In addition, the terminal PD3 of the semiconductor component 30 is electrically connected to the interposer 40 via the bump electrode BP3. Each of the bump electrode BP2 and bump electrode BP3 is a conductive member formed into, for example, a solder ball or a pillar-like shape as described below. In this manner, it is preferable that the wiring member and the semiconductor component are electrically connected to each other via the bump electrode, so that the transmission distance between the semiconductor component and the wiring member can be shortened.

In addition, a transmission path other than the above-described signal transmission path Lsg1 and signal transmission path Lsg2 may be connected to the semiconductor component 20 as the wiring path. For example, in the example shown in FIG. 1, a terminal PD4 and a terminal PD5 that allow a ground potential VG1 to be supplied are arranged on the semiconductor component 20. A wiring path Lvg1 that allows the ground potential VG1 to be supplied from the outside (potential-supply unit PS1 in the example shown in FIG. 1) and a wiring path Lvg2 that allows the ground potential VG1 to be transmitted between the semiconductor component 20 and the semiconductor component 30 are connected to the semiconductor component 20. In the example shown in FIG. 1, the ground potential VG1 can be supplied from the potential-supply unit PS1 to the external interface circuit SIF1 and the internal interface circuit SIF2 via the terminal PD4. In addition, the terminal PD5 is connected to the internal interface circuit SIF2, and the ground potential VG1 is supplied to the terminal PD5 via the internal interface circuit SIF2.

The wiring path Lvg1 that allows the ground potential VG1 to be supplied may be used as a reference path for transmitting a reference potential corresponding to a signal waveform of the signal transmission path Lsg1. In addition, in a case where the wiring path Lvg1 is arranged in the periphery of the signal transmission path Lsg1 to which the ground potential is supplied, the wiring path Lvg1 may be used as a shield conductor that suppresses transmission of noise generated in the signal transmission path Lsg1 or noise corresponding to the signal transmission path Lsg1.

Likewise, the wiring path Lvg2 that allows the ground potential VG1 to be transmitted between the semiconductor component 20 and the semiconductor component 30 may be used as a reference path for transmitting a reference potential corresponding to a signal waveform of the signal transmission path Lsg2. In addition, the wiring path Lvg2 may be used as a shield conductor that suppresses transmission of noise generated in the signal transmission path Lsg2 or noise corresponding to the signal transmission path Lsg2.

Further, the terminal PD4 of the semiconductor component 20 is electrically connected to the wiring substrate 10 via a bump electrode BP4 without the interposer 40 interposed therebetween. Furthermore, the terminal PD5 of the semiconductor component 20 is electrically connected to the interposer 40 via a bump electrode BP5. In the example shown in FIG. 1, the wiring path Lvg2 of the interposer 40 is connected to the wiring substrate 10 via the semiconductor component 20 and is not directly connected to the wiring substrate 10. In this case, a terminal does not need to be provided on a lower surface 40b side of the interposer 40 (see FIG. 5 described below).

Note that, as a modification for a method of supplying the ground potential VG1 to the wiring path Lvg2 of the interposer 40, a terminal may be provided between the interposer 40 and the wiring substrate 10, that is, on the lower surface 40b side of the interposer 40, and the wiring substrate 10 and the wiring path Lvg2 may be directly connected to each other via this terminal. Since more supply paths for the ground potential VG1 can be provided if the ground potential VG1 is supplied from the terminal connected to the wiring substrate 10, the potential of the wiring path Lvg2 can be stabilized.

In addition, in the example shown in FIG. 1, the terminal PD4 of the semiconductor component 20 is arranged on the main surface 20t at a position between the terminal PD1 and the terminal PD2. In other words, the terminal PD1 for transmitting the signal SG1 between the semiconductor component 20 and the outside is arranged at a position farther away from the interposer 40 as compared to the terminal PD2 or the terminal PD4. In the example shown in FIG. 1, the signal transmission path Lsg1 is lead out in a direction away from the semiconductor component 30. Hence, sufficient space can be provided for arranging a large number of signal transmission paths Lsg1.

On the other hand, in a case where the terminal PD4 for supplying the ground potential VG1 to the semiconductor component 20 is arranged close to the terminal PD5, the distance of the supply path for the ground potential VG1 supplied to the terminal PD5 via the terminal PD4 is shortened. Hence, the potential of the wiring path Lvg2 can be stabilized.

Note that, in the case where the wiring path Lvg1 is used as the reference path for transmitting the reference potential corresponding to the signal waveform of the signal transmission path Lsg1, it is preferable that a constant separation distance is maintained between the signal transmission path Lsg1 and the wiring path Lvg1 used as the reference path. Therefore, some of the terminals PD4 may be provided in the vicinity of the plurality of terminals PD2. For example, in the case where the plurality of terminals PD1 are provided on the main surface 20t of the semiconductor component 20, some of the terminals PD4 may be provided between the plurality of terminals PD1 and plurality of terminals PD2.

In addition, in the example shown in FIG. 1, a terminal PD6 that allows a power-supply potential VD1 to be supplied from the outside (potential-supply unit PS1 in the example shown in FIG. 1) is arranged on the main surface 20t of the semiconductor component 20. A wiring path Lvd1 that allows the power-supply potential VD1 to be supplied from the outside is connected to the semiconductor component 20. The terminal PD6 of the semiconductor component 20 is electrically connected to the wiring substrate 10 via a bump electrode BP6 without the interposer 40 interposed therebetween.

The power-supply potential VD1 is a power-supply potential for driving, for example, the external interface circuit SIF1 of the semiconductor component 20, the internal interface circuit SIF2 of the semiconductor component 20, or both. As shown in FIG. 1, by directly supplying the power-supply potential VD1 from the wiring substrate 10 without the interposer 40 interposed therebetween, impedance of the wiring path Lvd1 can be reduced, so that the power-supply potential VD1 can be stabilized.

In addition, in the example shown in FIG. 1, the terminal PD6 of the semiconductor component 20 is arranged on the main surface 20t at a position between the terminal PD1 and the terminal PD2. In other words, the terminal PD1 for transmitting the signal SG1 between the semiconductor component 20 and the outside is arranged at a position farther away from the interposer 40 as compared to the terminal PD2 or the terminal PD6. In the example shown in FIG. 1, the signal transmission path Lsg1 is lead out in a direction away from the semiconductor component 30. Hence, sufficient space can be provided for arranging a large number of signal transmission paths Lsg1.

In addition, in the example shown in FIG. 1, the terminal PD6 of the semiconductor component 20 is arranged on the main surface 20t at a position between the terminal PD1 and the terminal PD4. In other words, the terminal PD4 that supplies the ground potential VG1 to the semiconductor component 20 is arranged at a position closer to the terminal PD5 connected to the interposer 40 as compared to the terminal PD1 and the terminal PD6. In such a case where the terminal PD4 that supplies the ground potential VG1 to the semiconductor component 20 is arranged close to the terminal PD5, the distance of the supply path for the ground potential VG1 supplied to the terminal PD5 via the terminal PD4 is shortened. Hence, the potential of the wiring path Lvg2 can be stabilized.

In addition, as described above, the core circuit SCR1 of the semiconductor component 30 communicates with the outside via the external interface circuit SIF1 of the semiconductor component 20, meaning that the semiconductor component 30 does not need to be electrically connected to the wiring substrate 10 via the interposer 40. For example, in the example shown in FIG. 1, a terminal PD7 that allows the ground potential VG1 to be supplied from the outside (potential-supply unit PS1 in the example shown in FIG. 1) and a terminal PD8 that allow a power-supply potential VD2 to be supplied are arranged on the semiconductor component 30. A wiring path Lvg3 that allows the ground potential VG1 to be supplied from the outside and a wiring path Lvd2 that allows the power-supply potential VD2 to be supplied from the outside are connected to the semiconductor component 30. The terminal PD7 of the semiconductor component 30 is electrically connected to the wiring substrate 10 via a bump electrode BP7 without the interposer 40 interposed therebetween. In addition, the terminal PD8 of the semiconductor component 30 is electrically connected to the wiring substrate 10 via a bump electrode BP8 without the interposer 40 interposed therebetween. The power-supply potential VD2 is a power-supply potential for driving, for example, the core circuit SCR1 of the semiconductor component 30, the internal interface circuit SIF2 of the semiconductor component 30, or both. As shown in FIG. 1, by directly supplying the power-supply potential VD2 from the wiring substrate 10 without the interposer 40 interposed therebetween, impedance of the wiring path Lvd2 can be reduced, so that the power-supply potential VD2 can be stabilized.

In addition, as an example of a modification of FIG. 1, the semiconductor component 30 and the wiring substrate 10 may not be directly connected to each other, and the power-supply potential VD2 and the ground potential VG1 may be supplied via the interposer 40.

Further, in the example shown in FIG. 1, a terminal PD9 that allows the ground potential VG1 to be supplied is arranged on the semiconductor component 30 and is connected to the interposer 40. The terminal PD9 partially configures the wiring path Lvg2 that allows the ground potential VG1 to be transmitted between the semiconductor component 20 and the semiconductor component 30. The wiring path Lvg2 that allows the ground potential VG1 to be transmitted between the semiconductor component 20 and the semiconductor component 30 may be used as the reference path for transmitting the reference potential corresponding to the signal waveform of the signal transmission path Lsg2. In addition, the wiring path Lvg2 may be used as a shield conductor for suppressing transmission of noise generated in the signal transmission path Lsg2 or noise corresponding to the signal transmission path Lsg2.

<Structure of Semiconductor Device>

Figure 2:
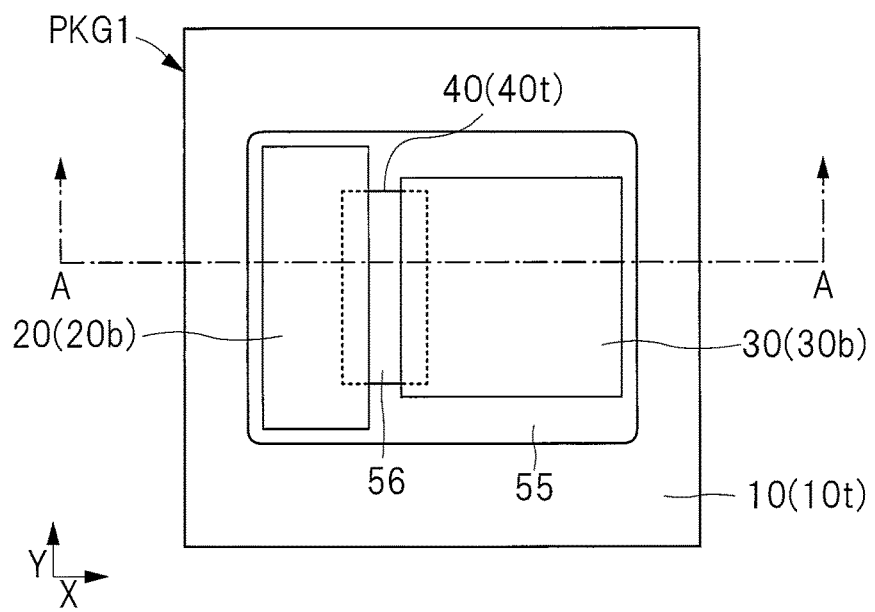
FIG. 2 is a top view of the semiconductor device shown in FIG. 1.
Figure 3:
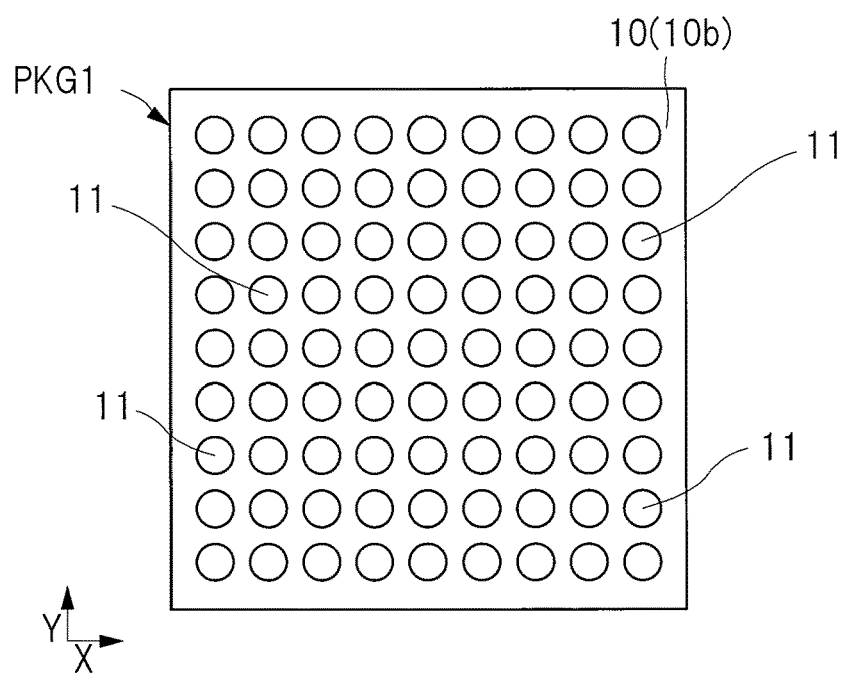
FIG. 3 is a bottom view of the semiconductor device shown in FIG. 2.
Figure 4:
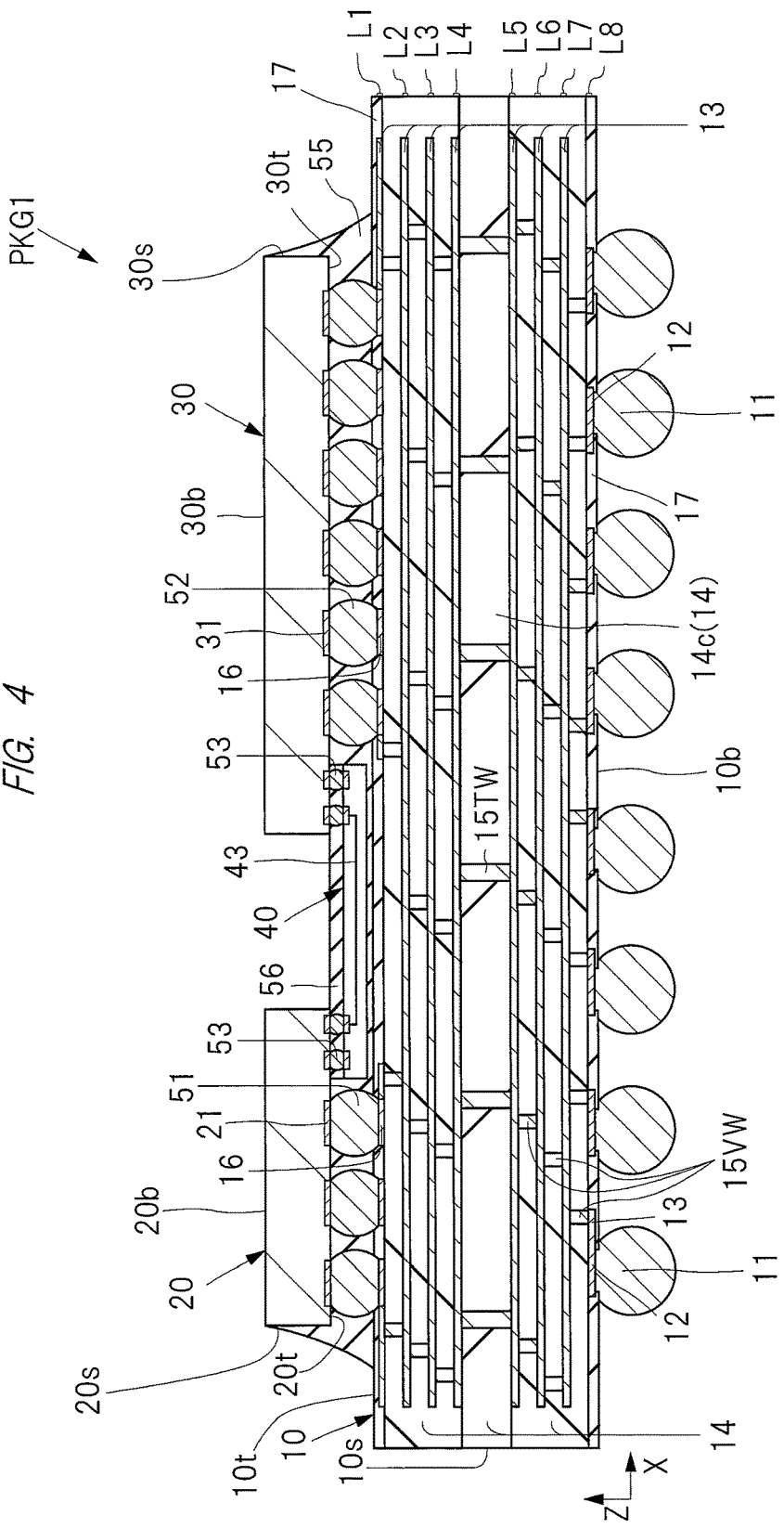
FIG. 4 is a cross-sectional view taken along line A-A of FIG. 2.
Figure 5:
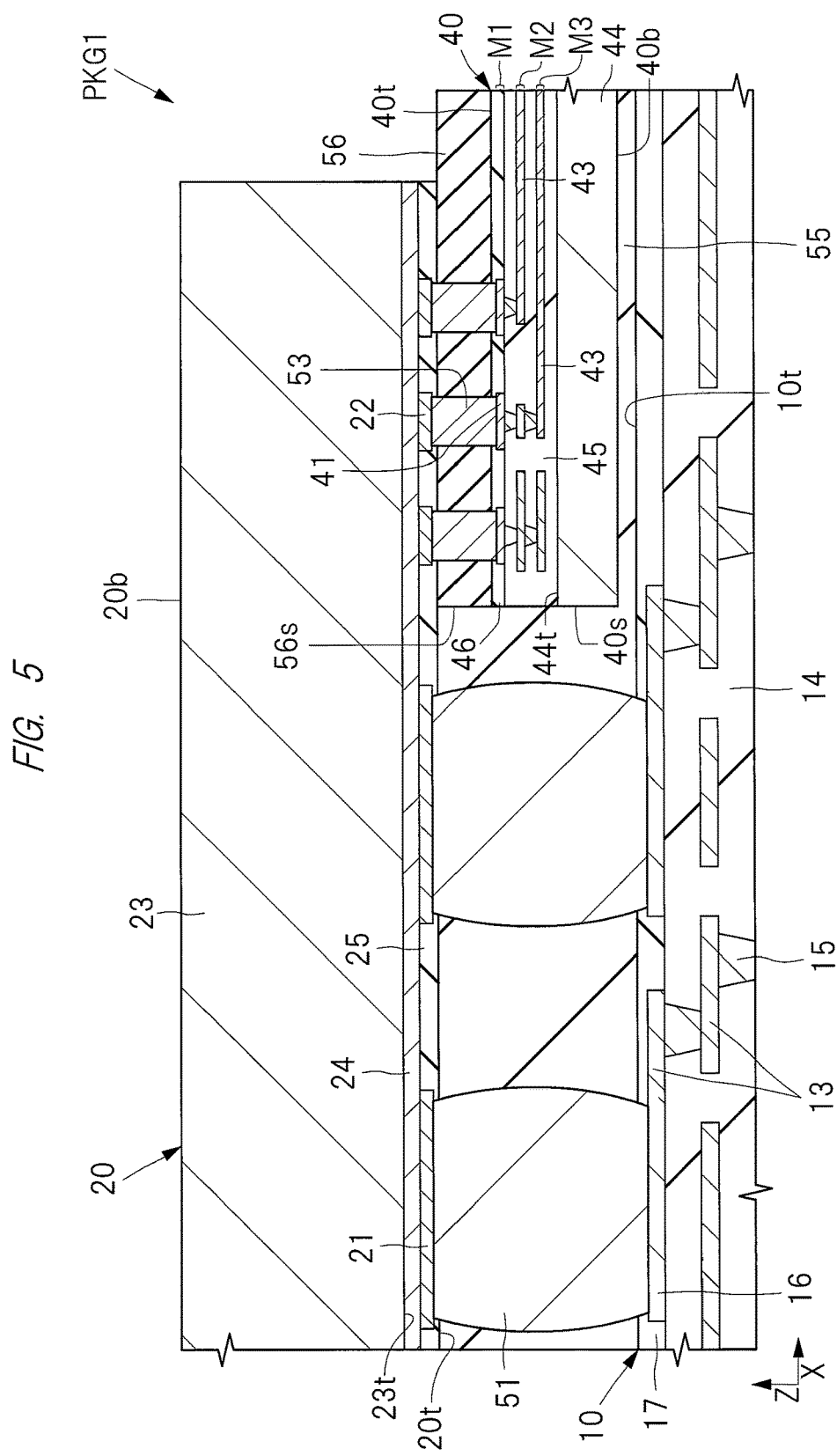
FIG. 5 is an enlarged cross-sectional view showing a periphery of a connection portion between an interposer and a semiconductor component shown in FIG. 4.
Figure 6:
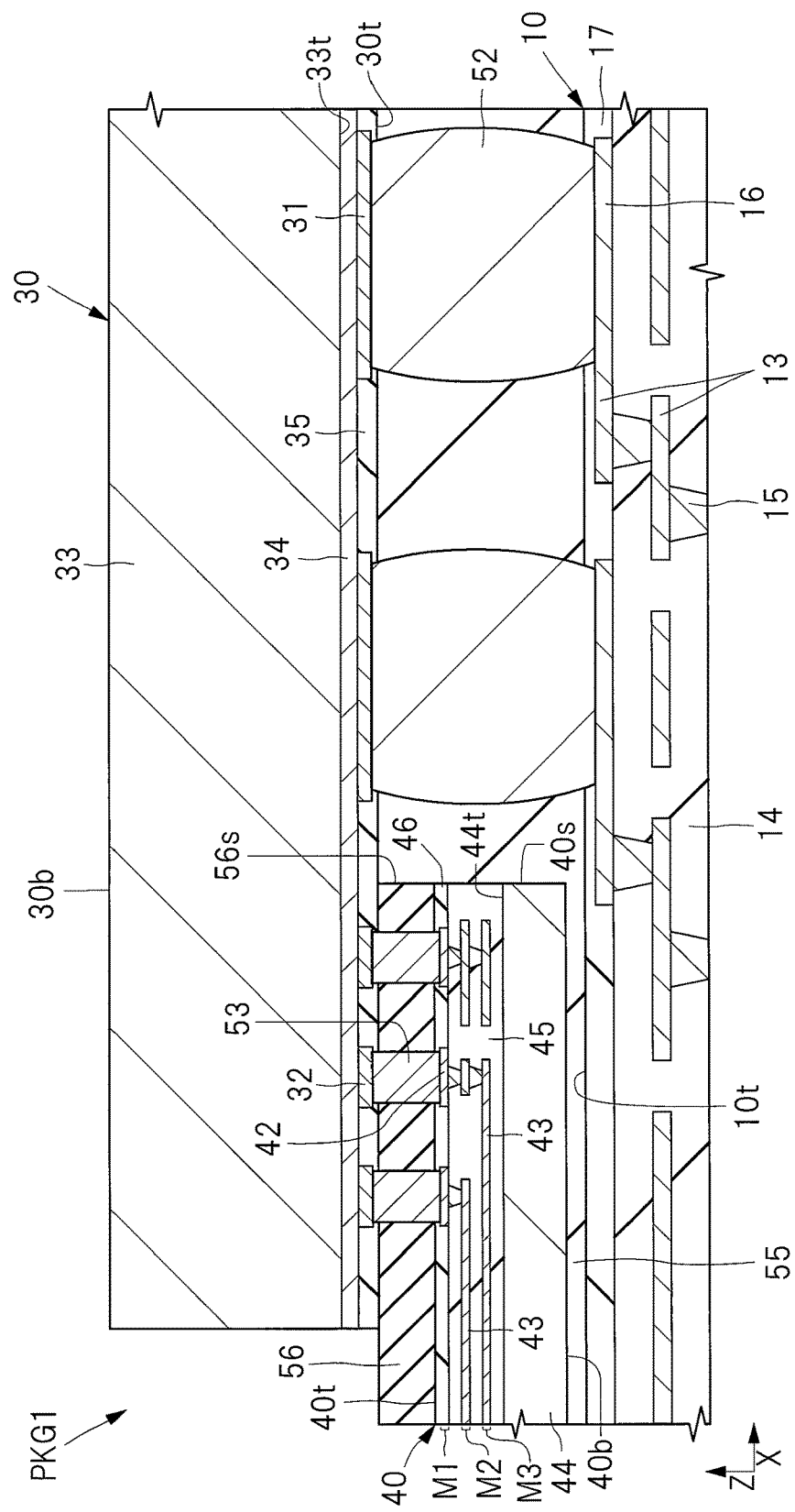
FIG. 6 is an enlarged cross-sectional view showing a periphery of a connection portion between an interposer and another semiconductor component shown in FIG. 4 that is separate from the semiconductor component shown in FIG. 5.

Next, a configuration example of the semiconductor device PKG1 shown in FIG. 1 will be described. FIG. 2 is a top view of the semiconductor device shown in FIG. 1, and FIG. 3 is a bottom view of the semiconductor device shown in FIG. 2. In addition, FIG. 4 is a cross-sectional view taken along line A-A of FIG. 2. Further, FIG. 5 is an enlarged cross-sectional view showing a periphery of a connection portion between one semiconductor component and the interposer shown in FIG. 4. FIG. 6 is an enlarged cross-sectional view showing a periphery of a connection portion between the interposer and another semiconductor component shown in FIG. 4 that is separate from the semiconductor component shown in FIG. 5.

In each plan view and cross-sectional view of FIGS. 3 to 28, the number of terminals shown is reduced for the sake of clarity. However, the number of terminals may vary from those shown in FIGS. 3 to 28. For example, the number of solder balls 11 may be greater than that shown in FIG. 3. As a further example, in the case described above with reference to FIG. 1 where 150 differential pairs of signal transmission paths Lsg1 are provided on the semiconductor component 20, 600 or more terminals PD1 and solder balls 11 are necessary for transmitting the signals SG1. In addition, in the case where 4,200 signal transmission paths Lsg2 are provided, 4,200 or more terminals PD2 are necessary for transmitting the signals SG2. Further, plurality of terminals PD4 that allow the ground potential VG1 to be supplied and plurality of terminals PD6 that allow the power-supply potential VD1 to be supplied may be additionally provided to the above. In addition, FIG. 4 shows representative wiring layers within each of the wiring substrate 10 and interposer 40.

As shown in FIG. 2, each of the semiconductor component and semiconductor component 30 within the semiconductor device PKG1 of the present embodiment is mounted on the upper surface 10t of the wiring substrate 10. In the example shown in FIG. 2, each of the semiconductor component 20 and semiconductor component 30 has a quadrangular shape and are arranged side-by-side so as to be opposite to each other in plan view. In addition, in the example shown in FIG. 2, the wiring substrate 10 has a quadrangular shape in plan view.

In the example shown in FIGS. 2 and 4, each of the semiconductor component 20 and semiconductor component 30 is a semiconductor chip comprising, for example, a semiconductor substrate made of a semiconductor material such as silicon, a plurality of semiconductor elements formed on a main surface of the semiconductor substrate, a wiring layer stacked over the main surface of the semiconductor substrate, and a plurality of terminals electrically connected to the plurality of semiconductor elements via the wiring layer. However, the semiconductor component 20 and the semiconductor component 30 are not limited to such a semiconductor chip and may have various modifications. For example, a semiconductor chip stacked body in which a plurality of semiconductor chips are stacked or a semiconductor package in which the semiconductor chip is mounted on a wiring material such as the wiring substrate may be used as the semiconductor component 20 or the semiconductor component 30 shown in FIGS. 2 and 4. In addition, as in the semiconductor device PKG3 described below with reference to FIG. 13 as a modification, the semiconductor device may further include a semiconductor component 60 in addition to the semiconductor component 20 and the semiconductor component 30B.

In addition, the interposer 40 is arranged between the semiconductor component 20 and the semiconductor component 30 in plan view. More specifically, a portion of the interposer 40 is arranged between the semiconductor component 20 and the semiconductor component 30, another portion of the interposer 40 and the semiconductor component 20 overlap each other, and still another portion of the interposer 40 and the semiconductor component 30 overlap each other. The interposer and the semiconductor component 20 are electrically connected at the portion where the interposer 40 and the semiconductor component 20 overlap each other, and the interposer 40 and the semiconductor component 30 are electrically connected at the portion where the interposer 40 and the semiconductor component 30 overlap each other.

In addition, in the example shown in FIG. 2, a plane area (area of rear surface 20b) of the semiconductor component 20 is smaller than a plane area (area of rear surface 30b) of the semiconductor component 30. As described above with reference to FIG. 1, the semiconductor component 30 comprises the core circuit SCR1 that includes the arithmetic processing circuit. In addition to the arithmetic processing circuit, the core circuit SCR1 is provided with various circuits necessary to execute functions within the semiconductor device PKG1. For example, there may be provided a memory circuit for temporarily saving received data or data to be transmitted. Further, there may be provided an external interface circuit that is separate from the external interface circuit SIF1 of the semiconductor component 20 for transmitting a signal between the semiconductor component 30 and the outside without passing through the semiconductor component 20. In addition, the semiconductor device may have a circuit for supplying power in order to drive various circuits. Such a semiconductor device in which circuits necessary for operating certain devices or systems are collectively formed on a single semiconductor is known as "SoC" (System on a Chip). The plurality of circuits are provided in the core circuit SCR1 of the semiconductor component 30, causing an area occupied by the circuits to increase. Thus, in the example shown in FIG. 2, the plane area of the semiconductor component 30 is increased.

On the other hand, the external interface circuit SIF1 is formed on the semiconductor component 20 and mainly serves as a relay component for relaying a signal transmission between the external device EX1 and the semiconductor component 20. The area occupied by the external interface circuit SIF1 may be smaller than the area occupied by the core circuit SCR1 of the semiconductor component 30 depending on the number of the signal transmission path Lsg1 connected. Thus, in the example shown in FIG. 2, the plane area of the semiconductor component is smaller than the plane area of the semiconductor component 30.

Note that the plane area may vary for each of the semiconductor component 20 and semiconductor component 30. For example, the core circuit SCR1 may be formed on the semiconductor component 20. In this case, the plane area of the semiconductor component 20 is increased. In addition, in a case where only a small number of circuit types are necessary for the semiconductor component 30, the plane area of the semiconductor component 30 can be reduced. In this context, there may be a case where the plane area of each of the semiconductor component 20 and semiconductor component 30 are equal to each other. Alternatively, there may be a case where the plane area of the semiconductor component 20 is larger than the plane area of the semiconductor component 30.

In addition, in the example shown in FIG. 2, the plane area of the interposer 40 is smaller than the plane area of the semiconductor component 20 and the plane area of the semiconductor component 30. As described above, in the case of the parallel communication method, it is preferable that the transmission path distance of the signal transmission path Lsg2 (see FIG. 1) connecting the semiconductor component 20 and the semiconductor component 30 to each other is shortened. In the case where the plane area of the interposer 40 is small as shown in FIG. 2, the path distance of the wiring path connecting the semiconductor component 20 and the semiconductor component 30 to each other is shortened. Therefore, from the viewpoint of shortening the signal transmission distance, it is preferable that the plane area of the interposer 40 is smaller than the plane area of the semiconductor component 20 and the plane area of the semiconductor component 30.

Note that the plane area of the interposer 40 may vary depending on the layout or the number of signal transmission paths formed on the interposer 40. For example, when the routing space for the wiring is increased, the plane area of the interposer 40 may become larger. In this context, there may be a case where the plane area of the interposer 40 is larger than the plane area of the semiconductor component 20 or semiconductor component 30. In such a case where the plane area of the interposer 40 is larger than the plane area of the semiconductor component 20 or semiconductor component 30, it is preferable that the semiconductor component 20 has a portion that does not overlap the interposer 40 in plan view.

In addition, as shown in FIG. 4, the semiconductor component 20 and the wiring substrate 10 are electrically connected to each other via a plurality of bump electrodes (conductive members) 51. Each of the bump electrodes 51 is a conductive member for electrically connecting the semiconductor component 20 and the wiring substrate 10 to each other and is arranged between the semiconductor component 20 and the wiring substrate 10. The bump electrode BP1 connected to the terminal PD1 shown in FIG. 1 is included in the plurality of bump electrodes 51. In addition, the bump electrode BP4 connected to the terminal PD4 shown in FIG. 1 is included in the plurality of bump electrodes 51. Further, the bump electrode BP6 connected to the terminal PD6 shown in FIG. 1 is included in the plurality of bump electrodes 51.

In addition, the semiconductor component 30 and the wiring substrate 10 are electrically connected to each other via a plurality of bump electrodes (conductive members) 52. Each of the bump electrodes 52 is a conductive member for electrically connecting the semiconductor component 30 and the wiring substrate 10 to each other and is arranged between the semiconductor component 30 and the wiring substrate 10. In addition, the bump electrode BP7 connected to the terminal PD7 shown in FIG. 1 is included in the plurality of bump electrodes 52. Further, the bump electrode BP8 connected to the terminal PD8 shown in FIG. 1 is included in a plurality of bump electrodes 53.

In the present embodiment, while in a state where the main surface 20t of the semiconductor component 20 and the upper surface 10t of the wiring substrate 10 are facing each other, the semiconductor component 20 is mounted on the wiring substrate 10 by the so-called "face-down mounting technique". In addition, while in a state where the main surface 30t of the semiconductor component 30 and the upper surface 10t of the wiring substrate 10 are facing each other, the semiconductor component 30 is mounted on the wiring substrate 10 by the so-called "face-down mounting technique". Further, each of the bump electrodes 51 and bump electrodes 52 shown in FIG. 4 is a metal member formed into, for example, a solder ball or a pillar-like shape. The bump electrodes 51 and the bump electrodes 52 can be aligned in a narrow gap (for example, approximately 100 µm) between the wiring substrate 10 and each of the semiconductor components 20 and 30 so as to have a narrow pitch therebetween (for example, distance ranging from approximately 150 µm to 200 µm from center to center).

In the example shown in FIG. 4, a terminal 21 of the semiconductor component 20 and a bonding pad 16 of the wiring substrate 10 arranged so as to face each other are electrically connected to each other via the bump electrode 51. In addition, a terminal 31 of the semiconductor component 30 and the bonding pad 16 of the wiring substrate 10 arranged so as to face each other are electrically connected to each other via the bump electrode 52. This method in which the terminals facing each other are electrically connected to each other via the bump electrode is known as a "flip-chip connecting method".

In addition, as shown in FIG. 4, the semiconductor component 20 and the interposer 40 along with the semiconductor component 30 and the interposer 40 are electrically connected to one another via the plurality of bump electrodes (conductive members) 53. Each of the bump electrodes 53 is a conductive member for electrically connecting the interposer 40 and the semiconductor component 20 or the semiconductor component 30 to each other and is arranged between the interposer 40 and the semiconductor component 20 as well as between the interposer 40 and the semiconductor component 30. The bump electrode BP2 connected to the terminal PD2 shown in FIG. 1 is included in the plurality of bump electrodes 53. In addition, the bump electrode BP3 connected to the terminal PD3 shown in FIG. 1 is included in the plurality of bump electrodes 53. Further, the bump electrode BP5 connected to the terminal PD5 shown in FIG. is included in the plurality of bump electrodes 53. Furthermore, the bump electrode 53 is a metal member formed into a solder ball or a pillar-like shape.

In the present embodiment, the semiconductor component 20 and the interposer 40 along with the semiconductor component 30 and the interposer 40 are electrically connected to one another by the flip-chip connecting method. Namely, as shown in FIG. 5, a terminal 22 of the semiconductor component 20 and a bonding pad (terminal, relay board terminal) 41 of the interposer 40 arranged so as to face each other are electrically connected to each other via the bump electrode 53. In addition, as shown in FIG. 6, a terminal 32 of the semiconductor component 30 and a bonding pad (terminal, relay board terminal) 42 of the interposer 40 arranged so as to face each other are electrically connected to each other via the bump electrode 53. Note that, among the plurality of bonding pads (terminals, relay board terminals) within the interposer 40, the bonding pad 41 is arranged at a position where the interposer 40 and the semiconductor component 20 overlap each other in the thickness direction as shown in FIG. 5, and the bonding pad 42 is arranged at a position where the interposer 40 and the semiconductor component 30 overlap each other in the thickness direction as shown in FIG. 6.

In addition, the bonding pad 41 shown in FIG. 5 and the bonding pad 42 shown in FIG. 6 are electrically connected to each other via a wiring 43 within the interposer 40. In other words, the semiconductor component 20 and the semiconductor component 30 shown in FIG. 4 are electrically connected to each other via the wiring 43 of the interposer 40.

In addition, in the present embodiment, the interposer 40 has a portion located between the semiconductor component 20 and the wiring substrate 10 and a portion located between the semiconductor component 30 and the wiring substrate 10 in the thickness direction (that is, a Z direction orthogonal to the upper surface 10t of the wiring substrate 10). Further, as shown in FIG. 5, a gap is present between the lower surface 40b of the interposer 40 and the upper surface 10t of the wiring substrate 10, and a resin body 55 is arranged in this gap. In such a case where a portion of the interposer 40 is arranged between the wiring substrate 10 and each of the semiconductor components 20 and 30, a height of the bump electrode 53 (a length of the bump electrode 53 in the Z direction shown in FIG. 4) is shorter than a height of each of the bump electrode 51 and bump electrode 52 (a length of each of the bump electrode 51 and bump electrode 52 in the Z direction shown in FIG. 4). For example, the height (thickness) of each of the bump electrode 51 and bump electrode 52 is approximately 100 μm. On the other hand, the height (thickness) of each of the bump electrodes 53 is approximately 30 μm.

In addition, each of the bump electrodes 53 partially configures the signal transmission path Lsg2 described above with reference to FIG. 1, so that a large number of bump electrodes 53 are arranged at a high density. The plurality of bump electrodes 53 are aligned so as to have a pitch having a distance ranging from, for example, approximately 10 μm to 30 μm from center to center. Thus, a width of the bump electrode 53, that is, a length in an X direction orthogonal to the Z direction shown in FIGS. 5 and 6, ranges from approximately 5 μm to 20 μm. Therefore, a volume of the bump electrode 53 is smaller than a volume of each of the bump electrode 51 (see FIG. 5) and bump electrode 52 (see FIG. 6).

In addition, as shown in FIG. 4, each of the bump electrodes 51, bump electrodes 52 and bump electrodes 53 is encapsulated in resin bodies. More specifically, in the present embodiment, each of the bump electrodes 51 and bump electrodes 52 is encapsulated in the resin body 55. In addition, each of the bump electrodes 53 is encapsulated in another resin body 56 that is separate from the resin body 55. Each of the resin body 55 and resin body 56 has a lower elasticity than the bump electrode 51, bump electrode 52 and bump electrode 53.

Thus, for example, in a case where a temperature cycle load is applied to the semiconductor device PKG1, stress generated in the vicinity of the bump electrode 51, bump electrode 52 or bump electrode 53 is alleviated by the resin body 55 or the resin body 56. In other words, the resin body 55 and the resin body 56 serve as stress-alleviating layers for suppressing an occurrence of stress concentration on any of the bump electrode 51, bump electrode 52 and bump electrode 53. Further, by suppressing the occurrence of stress concentration on any of the bump electrode 51, bump electrode 52 and bump electrode 53, it is possible to suppress disconnection or degradation of properties of the signal transmission path Lsg1 and signal transmission path Lsg2 described above with reference to FIG. 1. In other words, according to the present embodiment, each of the bump electrodes configuring the signal transmission path is encapsulated with resin, so that reliability of the signal transmission path can be improved.

In addition, in the present embodiment, the bump electrode 53 is encapsulated in the resin body 56 that is separate from the resin body 55 encapsulating the bump electrode 51 and the bump electrode 52. The resin body 55 and the resin body 56 may be constituted by, for example, structural components that differ from each other. Alternatively, the resin body 55 and the resin body 56 may be constituted by, for example, components having mixing ratios that differ from each other. Alternatively, the resin body 55 and the resin body 56 may be formed at, for example, different timings, and a boundary surface 56s may be formed between the resin body 55 and the resin body 56 as shown in FIGS. 5 and 6. Alternatively, the resin body 55 and the resin body 56 may have several of the above-described differences. In addition, as a modification of the present embodiment, the resin bodies 55 and 56 may be made of the same resin material.

As shown in FIG. 4, the bump electrode 53 has a height and volume that differ from those of the bump electrode 51 and the bump electrode 52. Thus, conditions for resin-encapsulating the bump electrode 53 differ from conditions for resin-encapsulating the bump electrode 51 and the bump electrode 52. Therefore, as long as the bump electrode 53 is encapsulated in the resin body 56 that is separate from the resin body 55 encapsulating the bump electrode 51 and the bump electrode 52 as in the present embodiment, the above-described stress alleviating function of the resin body 55 and the resin body 56 can be optimized.

<Configuration of Each Component>

Figure 7:
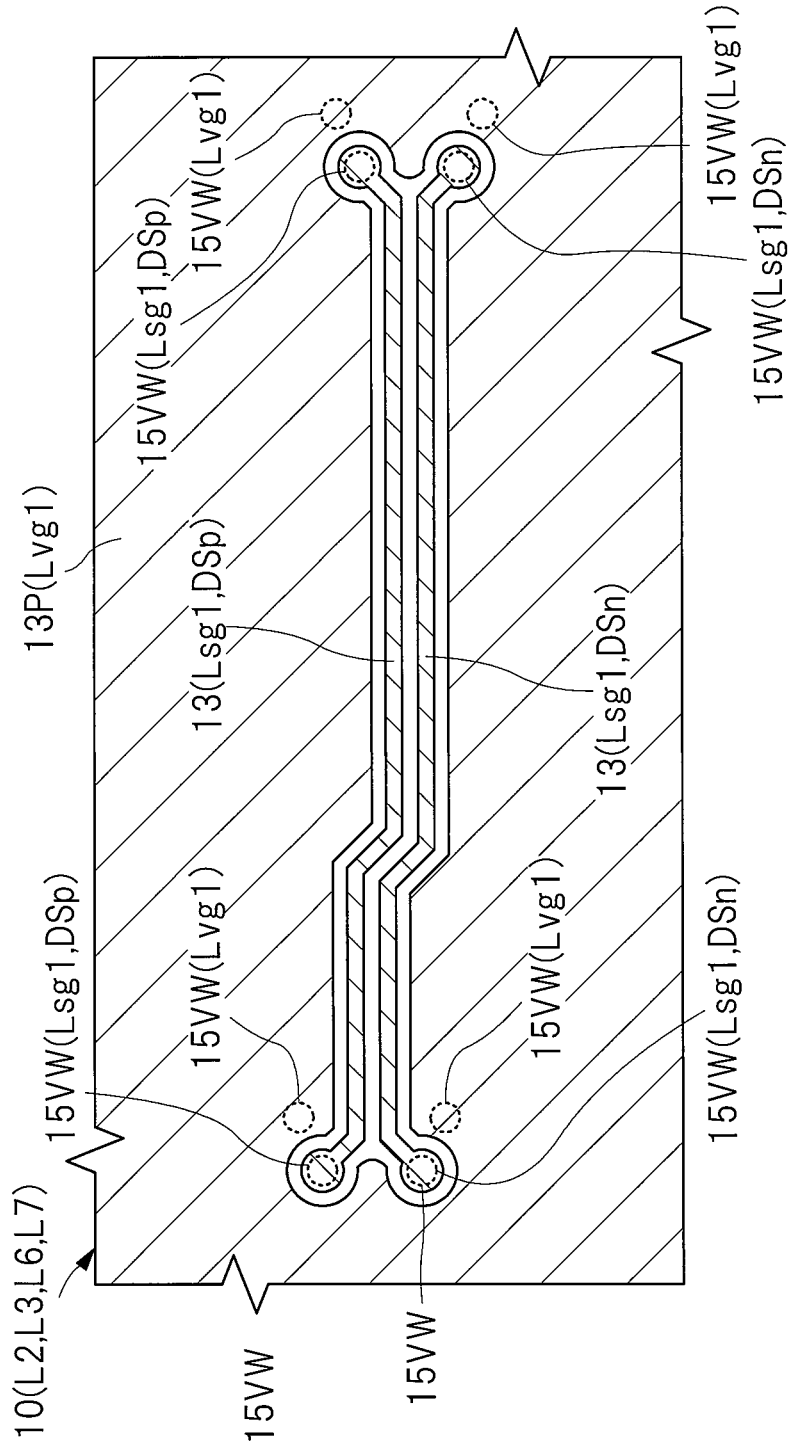
FIG. 7 is an enlarged plan view showing an example of a wiring layout of one of the wiring layers within a wiring substrate shown in FIG. 4.
Figure 8:
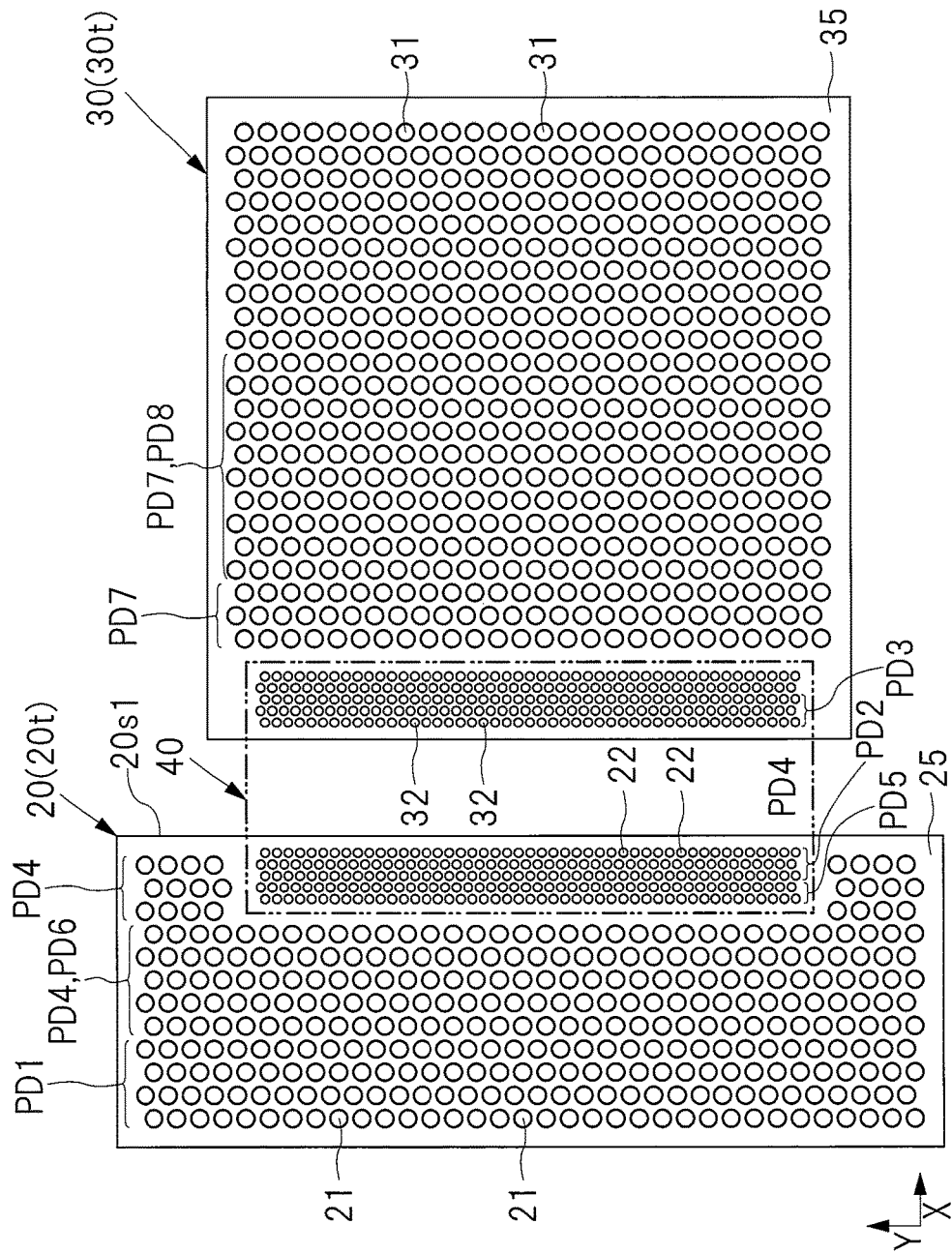
FIG. 8 is a plan view showing an example of a terminal arrangement on a main surface side of each of the semiconductor components shown in FIG. 2.
Figure 9:
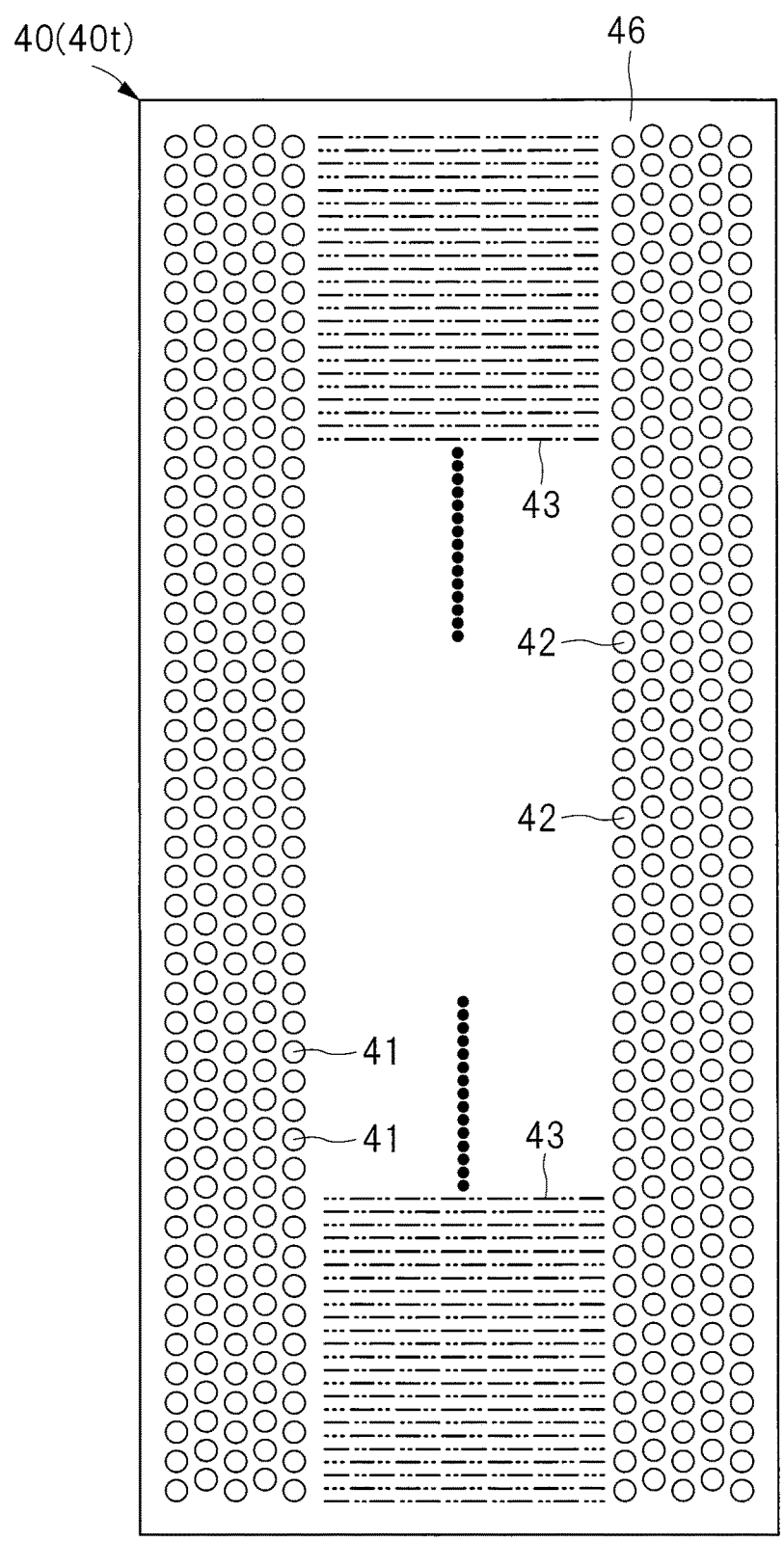
FIG. 9 is a plan view showing an example of an upper surface side of the interposer shown in FIGS. 4 to 6.

Next, details on structures of the main components configuring the semiconductor device PKG1 will be sequentially described. FIG. 7 is an enlarged plan view showing an example of a wiring layout of one of the wiring layers within the wiring substrate shown in FIG. 4. FIG. 8 is a plan view showing an example of a terminal arrangement on the main surface side of each of the semiconductor components shown in FIG. 2. In FIG. 8, a contour of the interposer 40 is indicated by a two-dot chain line in order to show a positional relation between the interposer 40 and each of the semiconductor component 20 and semiconductor component 30. In addition, FIG. 9 is a plan view showing an example of an upper surface side of the interposer shown in FIGS. 4 to 6. In FIG. 9, the plurality of wirings 43 arranged on a wiring layer M2 or a wiring layer M3 shown in FIG. 5 or 6 are indicated by two-dot chain lines.

<Wiring Substrate>

As shown in FIG. 4, the wiring substrate 10 of the semiconductor device PKG1 comprises a lower surface (surface, board mounting surface) 10b located opposite to the upper surface (surface, chip mounting surface) 10t. As shown in FIG. 3, the plurality of solder balls (external terminals) 11 which are external terminals of the semiconductor device PKG1 are arranged in a matrix-like manner (array-like manner) on the lower surface 10b of the wiring substrate 10 which is the board mounting surface of the semiconductor device PKG1. Each of the solder balls 11 is connected to a land (external terminal) 12 (see FIG. 4).

The semiconductor device in which the plurality of external terminals (solder balls 11, lands 12) are arranged in a matrix-like manner on the board mounting surface side as in the semiconductor device PKG1 is called an "area-array type semiconductor device". The area-array type semiconductor device PKG1 is preferable in that the board mounting surface (lower surface 10b) side of the wiring substrate 10 can be effectively utilized as the arrangement space for the external terminals, so that the mounting area of the semiconductor device PKG1 can be suppressed from increasing in size even if the number of external terminals is increased. In other words, the semiconductor device PKG1 in which the number of external terminals is increased as the semiconductor device PKG1 becomes more functional and more integrated can be mounted in a space-saving manner.

In addition, as shown in FIG. 4, the wiring substrate 10 has a side surface 10s arranged between the upper surface 10t and the lower surface 10b. The wiring substrate 10 is a substrate comprising the plurality of wiring paths that transmit electric signals and potentials (power-supply potential, reference potential or ground potential) between the semiconductor device PKG1 and the mounting board MB1 (see FIG. 1). The wiring substrate 10 has a plurality of wiring layers (eight layers in the example shown in FIG. 4) electrically connecting the upper surface 10t side and the lower surface 10b side to each other. The plurality of wirings 13 provided on each of the wiring layers are covered by an insulating layer 14 for insulation between the plurality of wirings 13 and between adjacent wiring layers.

The wiring substrate 10 shown in FIG. 4 is a so-called "multilayer wiring substrate" comprising a plurality of stacked wiring layers. In the example shown in FIG. 4, the wiring substrate 10 comprises a total of eight wiring layers consisting of wiring layers L1, L2, L3, L4, L5, L6, L7 and L8 in this order from the upper surface 10t side. Each of the wiring layers has a conductive pattern such as the wiring 13, and adjacent conductive patterns are covered by the insulating layer 14. Note that the number of wiring layers within the wiring substrate 10 is not limited to that of the example shown in FIG. 4, and may be, for example, less than or greater than eight layers.

In addition, in the example shown in FIG. 4, the wiring substrate 10 has a structure in which a plurality of wiring layers are stacked on each of upper and lower surfaces of a core layer (core layer material, core insulating layer, insulating layer) 14c serving as a base member. The core layer 14c is an insulating layer which is the base member of the wiring substrate 10 and is made of an insulating material in which, for example, a fiber material such as glass fiber is impregnated with a resin material such as epoxy resin. In addition, the insulating layer 14 stacked on each of the upper and lower surfaces of the core layer 14c is made of an organic insulating material such as, for example, thermosetting resin. Further, the plurality of wiring layers stacked on each of the upper and lower surfaces of the core layer 14c are formed by, for example, a build-up process. Note that the so-called "core-less substrate" having no core layer 14c may be utilized as a modification of FIG. 4.

In addition, the wiring substrate 10 has a via wiring 15VW which is an interlayer conductive path provided between each of the wiring layers for connecting the stacked wiring layers to one another in the thickness direction and a through-hole wiring 15TW which is a conductive path penetrating the core layer 14c in the thickness direction. The through-hole wiring 15TW does not need to be provided in the case where the core-less substrate is utilized as a modification as described above. In addition, the plurality of bonding pads (substrate terminals, semiconductor component connecting terminals) 16 are formed on the upper surface 10t of the wiring substrate 10.

The wiring 13 provided on the uppermost wiring layer (wiring layer L1 closest to the upper surface 10t) among the plurality of wiring layers within the wiring substrate 10 is integrally formed with the bonding pad 16. In other words, the bonding pad 16 can be considered as a portion of the wiring 13. In addition, when it is necessary to distinguish between the bonding pad 16 and the wiring 13, the portion exposed through an insulating film 17 on the upper surface 10t of the wiring substrate 10 can be defined as the bonding pad 16, and the portion covered by the insulating film 17 can be defined as the wiring 13.

Further, the plurality of lands (external terminals, solder ball connecting pads) 12 are formed on the lower surface 10b of the wiring substrate 10. The solder ball 11 is connected to each of the lands 12, and the mounting board MB1 and the semiconductor device PKG1 shown in FIG. 1 are electrically connected to each other via the solder ball 11 shown in FIG. 4. Namely, the plurality of solder balls 11 serve as external connection terminals of the semiconductor device PKG1.

The plurality of solder balls 11 and the plurality of lands 12 are electrically connected to the plurality of bonding pads 16 on the upper surface 10t side via the plurality of wirings 13 of the wiring substrate 10. Note that the wiring 13 provided on the lowermost wiring layer (wiring layer closest to the lower surface 10b) among the plurality of wiring layers within the wiring substrate 10 is integrally formed with the land 12. In other words, the land 12 can be considered as a portion of the wiring 13. In addition, when it is necessary to distinguish between the land 12 and the wiring 13, the portion exposed through the insulating film 17 on the lower surface 10b of the wiring substrate 10 can be defined as the land 12, and the portion covered by the insulating film 17 can be defined as the wiring 13.

Further, as a modification of FIG. 4, there may be a case where the land 12 itself serves as the external connection terminal. In this case, the solder ball 11 is not connected to the land 12, and each of the lands 12 is exposed through the insulating film 17 on the lower surface 10b of the wiring substrate 10. In addition, as another modification of FIG. 4, there may be a case where a thin solder film serving as the external connection terminal is connected to the land 12 instead of the ball-shaped solder ball 11. Alternatively, there may be a case where a gold (Au) film formed on the exposed surface by, for example, a plating method serves as the external connection terminal. Further, there may be a case where the external connection terminal is formed into a pin-like (bar-like) shape.

In addition, the upper surface 10t and the lower surface 10b of the wiring substrate 10 are covered by the insulating film (solder-resist film) 17. The wiring 13 formed on the upper surface 10t of the wiring substrate 10 is covered by the insulating film 17. An opening is formed in the insulating film 17, and at least a portion (bonding area) of each of the bonding pads 16 is exposed through the insulating film 17 from this opening. In addition, the wiring 13 formed on the lower surface 10b of the wiring substrate 10 is covered by the insulating film 17. An opening is formed in the insulating film 17, and at least a portion (bonding portion for the solder ball 11) of each of the lands 12 is exposed through the insulating film 17 at this opening.

In addition, in the present embodiment, a differential signal is transmitted through the signal transmission path Lsg1 shown in FIG. 1. In the differential signal, signals having opposite phases from each other are transmitted to a pair of wiring paths. As shown in FIG. 7, the signal transmission path Lsg1 is constituted by a differential signal transmission path DSp and a differential signal transmission path DSn that configure a differential pair. It is preferable that the differential signal transmission path DSp and the differential signal transmission path DSn configuring the differential pair are equally spaced apart from each other as much as possible. Thus, the wirings 13 configuring each of the differential signal transmission path DSp and differential signal transmission path DSn extend along each other. In addition, it is preferable that the wiring path distances of the differential signal transmission path DSp and the differential signal transmission path DSn configuring the differential pair are equal to each other. Thus, each of the via wirings 15VW and the wirings 13 configuring each of the differential signal transmission path DSp and differential signal transmission path DSn is laid out such that the path distances of the differential signal transmission path DSp and the differential signal transmission path DSn are equal to each other.

In addition, in the example shown in FIG. 7, a periphery of the conductive pattern (wiring 13 and via wiring 15VW) configuring the signal transmission path Lsg1 is, in plan view, surrounded by the wiring path Lvg1 that allows the ground potential VG1 to be supplied. The wiring path Lvg1 is constituted by a conductive plane 13P which is a conductive pattern having a larger area than the wiring 13. In this manner, the conductive plane 13P which is a portion of the wiring path Lvg1 in the periphery of the signal transmission path Lsg1 to which the ground potential is supplied may be used as a shield conductor for suppressing transmission of noise generated in the signal transmission path Lsg1 or noise corresponding to the signal transmission path Lsg1. In addition, the wiring path Lvg1 in the periphery of the signal transmission path Lsg1 to which the ground potential is supplied is provided along the wiring path of the signal transmission path Lsg1. Thus, the conductive plane 13P which is a portion of the wiring path Lvg1 in the periphery of the signal transmission path Lsg1 to which the ground potential is supplied may be used as the reference path for transmitting the reference potential corresponding to the signal waveform of the signal transmission path Lsg1.

<Semiconductor Components>

As shown in FIG. 5, the semiconductor component 20 has a semiconductor substrate (base member) 23 that includes a main surface 23t and a wiring layer 24 that is arranged between the main surface 23t and the main surface 20t. In addition, as shown in FIG. 6, the semiconductor component 30 has a semiconductor substrate (base member) 33 that includes a main surface 33t and a wiring layer 34 that is arranged between the main surface 33t and the main surface 30t. In each of FIGS. 5 and 6, only one wiring layer 24 or 34 is shown for the sake of clarity; however a plurality of wiring layers each having a thickness that is less than or approximately equal to the thickness of each of the wiring layers M1, M2 and M3 of the interposer 40 are stacked on the wiring layer 24 or 34. In addition, a plurality of wirings not illustrated for the sake of clarity are formed on each of the wiring layers 24 and 34. Further, the plurality of wirings are covered by an insulating layer for insulation between the plurality of wirings and between adjacent wiring layers. The insulating layer is an inorganic insulating layer made of an oxide semiconductor material such as, for example, silicon oxide (SiO).

In addition, a plurality of semiconductor elements such as, for example, transistor elements or diode elements are formed on each of the main surfaces 23t and 33t of the semiconductor substrates 23 and 33 within each of the semiconductor components 20 and 30. In the semiconductor component 20 shown in FIG. 5, the plurality of semiconductor elements are electrically connected to the plurality of terminals 21 and the plurality of terminals 22 formed on the main surface 20t side with the plurality of wirings of the wiring layer 24 interposed therebetween. In addition, in the semiconductor component 30 shown in FIG. 6, the plurality of semiconductor elements are electrically connected to the plurality of terminals 31 and the plurality of terminals 32 formed on the main surface 30t side with the plurality of wirings of the wiring layer 34 interposed therebetween.

Further, the plurality of terminals (electrodes, component electrodes, pads) 21 and the plurality of terminals (electrodes, component electrodes, pads) 22 are formed on the wiring layer 24 of the semiconductor component 20 shown in FIG. 5. Each of the terminals 21 is a terminal electrically connected to the bonding pad 16 of the wiring substrate 10 via the bump electrode 51. In addition, each of the terminals 22 is a terminal electrically connected to the bonding pad 41 of the interposer 40 via the bump electrode 53. A portion of each of the terminals 21 and terminals 22 is exposed through a passivation film 25 which is a protective insulating film on the main surface 20t of the semiconductor component 20. The bump electrode 51 is bonded to the portion of the terminal 21 that is exposed through the passivation film 25.

Further, the plurality of terminals (electrodes, component electrodes, pads) 31 and the plurality of terminals (electrodes, component electrodes, pads) 32 are formed on the wiring layer 34 of the semiconductor component 30 shown in FIG. 6. Each of the terminals 31 is a terminal electrically connected to the bonding pad 16 of the wiring substrate 10 via the bump electrode 52. In addition, each of the terminals 32 is a terminal electrically connected to the bonding pad 42 of the interposer 40 via the bump electrode 53. A portion of each of the terminals 31 and terminals 32 is exposed through a passivation film 35 which is a protective insulating film on the main surface 30t of the semiconductor component 30. The bump electrode 52 is bonded to the portion of the terminal 31 that is exposed through the passivation film 35.

As shown in FIG. 8, each of the terminals 22 is arranged at a position closer to the terminals 32 of the semiconductor component 30 than to the terminals 21. In addition, each of the terminals 32 is arranged at a position closer to the terminals 22 of the semiconductor component 20 than to the terminals 31. By shortening a separation distance between each of the terminals 22 and terminals 32 electrically connected to one another via the interposer 40, a transmission path distance within the interposer 40 can be shortened.

In the example shown in FIG. 8, the plurality of terminals PD1, the plurality of terminals PD4, and the plurality of terminals PD6 described above with reference to FIG. 1 are included in the plurality of terminals 21 within the semiconductor component 20. In addition, the plurality of terminals PD2 and the plurality of terminals PD5 described above with reference to FIG. 1 are included in the plurality of terminals 22 within the semiconductor component 20. Further, the plurality of terminals PD7 and the plurality of terminals PD8 described above with reference to FIG. 1 are included in the plurality of terminals 31 within the semiconductor component 30. Furthermore, the plurality of terminals PD3 described above with reference to FIG. 1 are included in the plurality of terminals 32 within the semiconductor component 30.

The terminal PD1 is a terminal for transmitting a signal between the semiconductor component 20 and the outside (external device EX1 shown in FIG. 1). As shown in FIG. 8, each of the terminals PD1 is arranged on the main surface 20t of the semiconductor component 20 at a position where a distance to the semiconductor component 30 or the interposer 40 is relatively long as compared to the other terminals. In other words, the main surface 20t of the semiconductor component 20 has a side 20s1 facing the semiconductor component and a side 20s2 opposite to the side 20s1, and each of terminals PD1 is arranged closer to the side 20s2 than to the side 20s1. Hence, as described above with reference to FIG. 1, sufficient space can be provided for arranging the signal transmission path Lsg1 connected to each of the terminals PD1, so that the wiring layout of the signal transmission path Lsg1 can be simplified.

In addition, the terminal PD2 is a terminal for transmitting a signal between the semiconductor component 20 and the semiconductor component 30. As shown in FIG. 8, each of the terminals PD2 is arranged on the main surface 20t of the semiconductor component 20 at a position where the distance to the semiconductor component 30 is relatively short as compared to the other terminals. In other words, each of terminals PD1 is arranged closer to the side 20s1 than to the side 20s2 of the main surface 20t of the semiconductor component 20. In the example shown in FIG. 8, each of the terminals PD2 is arranged between the plurality of terminals PD1 of the semiconductor component 20 and the plurality of terminals PD3 of the semiconductor component 30 in plan view. Hence, as described above with reference to FIG. 1, the transmission distance of the signal transmission path Lsg2 connected to each of the terminals PD2 can be shortened. Further, by shortening the transmission distance of the signal transmission path Lsg2 for transmitting a signal by the parallel communication method, it is possible to suppress the synchronization problem caused by the clock skew, the problem in which transmission loss increases and the problem in which crosstalk noise occurs.

In addition, in the example shown in FIG. 8, each of the terminals PD2 of the semiconductor component 20 is arranged at a position closer to the plurality of terminals PD3 of the semiconductor component 20 than to the plurality of terminals PD1 of the semiconductor component 20 in plan view. As the separation distance between the terminal PD2 of the semiconductor component 20 and the terminal PD3 of the semiconductor component 30 is shortened, the transmission distance of the signal transmission path Lsg2 shown in FIG. 1 can be shortened. Further, by shortening the transmission distance of the signal transmission path Lsg2, it is possible to suppress the synchronization problem caused by the clock skew, the problem in which transmission loss increases and the problem in which crosstalk noise occurs.

In addition, each of the terminal PD4 and terminal PD5 is a terminal that allows the ground potential VG1 to be supplied. In the example shown in FIG. 8, each of the terminals PD4 is arranged between the plurality of terminals PD1 and the plurality of terminals PD5 in plan view. As described above with reference to FIG. 1, in the case where the terminal PD4 for supplying the ground potential VG1 to the semiconductor component 20 is arranged close to the terminal PD5, the distance of the supply path for the ground potential VG1 supplied to the terminal PD5 via the terminal PD4 is shortened. Hence, the potential of the wiring path Lvg2 can be stabilized.

Note that, in the case where the wiring path Lvg1 described above with reference to FIG. 1 is used as the reference path for transmitting the reference potential corresponding to the signal waveform of the signal transmission path Lsg1, it is preferable that a constant separation distance is maintained between the signal transmission path Lsg1 and the wiring path Lvg1 used as the reference path. Therefore, some of the terminals PD4 may be provided in the vicinity of the plurality of terminals PD2. For example, in the case where the plurality of terminals PD1 are provided on the main surface 20t of the semiconductor component 20, some of the terminals PD4 may be provided between the plurality of terminals PD1.

In addition, in the example shown in FIG. 8, the plurality of terminals PD5 and the plurality of terminals PD2 are arranged on the main surface 20t of the semiconductor component 20 along the X direction in this order from the side 20s2. In this case, the plurality of terminals PD2 can be arranged closer to the side 20s1, so that the transmission distance of the signal transmission path Lsg2 shown in FIG. 1 can be shortened.

Note that, in the case where the wiring path Lvg2 shown in FIG. 1 is used as the reference path for transmitting the reference potential corresponding to the signal waveform of the signal transmission path Lsg2, it is preferable that a constant separation distance is maintained between the signal transmission path Lsg2 and the wiring path Lvg2 used as the reference path. Therefore, some of the terminals PD5 may be provided in the vicinity of the plurality of terminals PD2. For example, in the case where the plurality of terminals PD2 are provided on the main surface 20t of the semiconductor component 20, some of the terminals PD5 may be provided between the plurality of terminals PD2.

In addition, the terminal PD6 is a terminal that allows the power-supply potential VD1 to be supplied. In the example shown in FIG. 8, the plurality of terminals PD6 of the semiconductor component 20 are arranged between the plurality of terminals PD1 and the plurality of terminals PD2 in plan view. In such a case where the plurality of terminals PD6 are arranged between the plurality of terminals PD1 and the plurality of terminals PD2, the terminals PD1 can be preferentially arranged closer to the side 20s2 of the main surface 20t, and the terminals PD2 can be preferentially arranged closer to the side 20s1 of the main surface 20t.

In addition, in the example shown in FIG. 8, the plurality of terminals PD6 of the semiconductor component 20 are arranged between the plurality of terminals PD1 and the plurality of terminals PD4 in plan view. As described above with reference to FIG. 1, in the case where the terminal PD4 for supplying the power-supply potential VD1 to the semiconductor component 20 is arranged close to the terminal PD5, the distance of the supply path for the ground potential VG1 supplied to the terminal PD5 via the terminal PD4 is shortened. Hence, the potential of the wiring path Lvg2 can be stabilized.

Note that, in FIG. 8, alignment of each of the terminals 21, terminals 22, terminals 31 and terminals 32 are shown by way of example. As shown in FIG. 4, the bump electrode 51 is connected at a position facing the terminal 21. In addition, the bump electrode 52 is connected at a position facing the terminal 31. Further, the bump electrode 53 is connected at a position facing the terminal 22 (see FIG. 5) or the terminal 32 (see FIG. 6). Therefore, the layout of each of the terminals 21, terminals 22, terminals 31 and terminals 32 shown in FIG. 8 can be regarded as having the same layout as each of the bump electrodes 51, bump electrodes 52 and bump electrodes 53 shown in FIG. 4 in plan view.

<Interposer>

As shown in FIG. 4, the interposer 40 has an upper surface (surface, relay terminal positioning surface) 40t on which the plurality of bonding pads 41 connected to the semiconductor component 20 (see FIG. 5) and the plurality of bonding pads 42 connected to the semiconductor component 30 (see FIG. 6) are arranged, a lower surface (surface, rear surface) 40b opposite to the upper surface 40t, and a side surface 40s (see FIGS. 5 and 6) arranged between the upper surface 40t and the lower surface 40b. In addition, as shown in FIGS. 2 and 8, the interposer 40 has a quadrangular outer shape in plan view.

As shown in FIGS. 5 and 6, the interposer 40 has a semiconductor substrate (base member) 44 that includes a main surface 44t and a plurality of wiring layers that are arranged between the main surface 44t and the upper surface 40t. In the example shown in each of FIGS. 5 and 6, the interposer 40 comprises a total of three wiring layers consisting of the wiring layers M1, M2 and M3 in this order from the upper surface 40t side. Note that the number of wiring layers within the interposer 40 is not limited to that of the example shown in FIG. 5, and may be, for example, less than or greater than three layers.

Each of the wiring layers has a plurality of conductive patterns such as the wirings 43, and each of the conductive patterns are covered by an insulating layer 45 for insulation between the plurality of wirings and between adjacent wiring layers. The insulating layer 45 is an inorganic insulating layer made of, for example, an oxide semiconductor material such as silicon oxide (SiO). In addition, the plurality of bonding pads 41 (see FIG. 5) and the plurality of bonding pads 42 (see FIG. 6) are arranged on the wiring layer M1 provided in the uppermost layer (layer closest to the upper surface 40*t*) among the plurality of wiring layers. The wiring layer M1 is provided on the insulating layer 45 and is covered by a passivation film 46 which is a protective insulating film.

As shown in FIG. 9, a portion of each of the bonding pads 41 and bonding pads 42 is exposed through the passivation film 46 from an opening formed in the passivation film 46. The bump electrode 52 shown in FIG. 5 or 6 is bonded to the portion of the bonding pad 41 (see FIG. 5) or bonding pad 42 (see FIG. 6) that is exposed through the passivation film 46.

In addition, the plurality of bonding pads 41 and the plurality of bonding pads 42 are electrically connected to one another via the plurality of wirings 43. The plurality of signal transmission paths Lsg2 described above with reference to FIG. 1 are included in the plurality of wiring paths constituted by the plurality of bonding pads 41, the plurality of bonding pads 42 and the plurality of wirings 43 electrically connecting the bonding pads to one another. In addition, the wiring path Lvg2 described above with reference to FIG. 1 is included in the plurality of wiring paths constituted by the plurality of bonding pads 41, the plurality of bonding pads 42 and the plurality of wirings 43 electrically connecting the bonding pads to one another.

A technique for forming an integrated circuit on a semiconductor wafer can be used for a technique for forming a plurality of conductive patterns on a wiring layer provided on the main surface 44*t* of the semiconductor substrate 44 of the present embodiment, so that the wiring width and arrangement spacing of the plurality of wirings 43 can easily be reduced.

In addition, by forming the interposer 40 with using the semiconductor wafer, a large number of interposers 40 can be manufactured at once to improve manufacturing efficiency.

<Bump Electrode>

Figure 10:
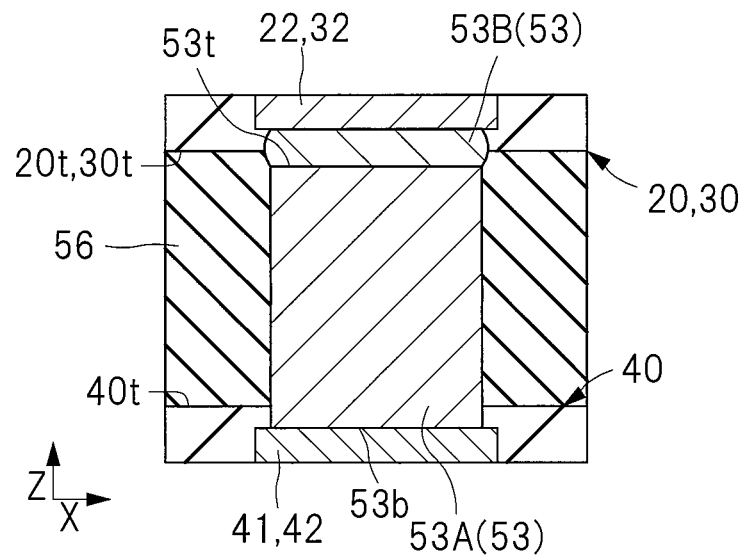
FIG. 10 is an enlarged cross-sectional view of a bump electrode electrically connecting the semiconductor components and the interposer shown in FIGS. 5 and 6 to each other.
Figure 11:
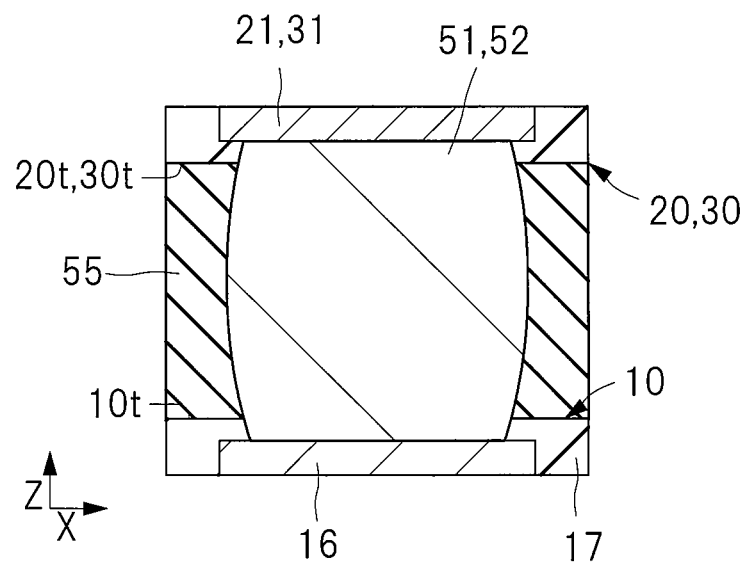
FIG. 11 is an enlarged cross-sectional view of a bump electrode electrically connecting the semiconductor components and the wiring substrate shown in FIGS. 5 and 6 to each other.

FIG. 10 is an enlarged cross-sectional view of the bump electrode electrically connecting the semiconductor components and the interposer shown in FIGS. 5 and 6 to each other. In addition, FIG. 11 is an enlarged cross-sectional view of the bump electrode electrically connecting the semiconductor component and the interposer shown in FIGS. 5 and 6 to each other.

Among the bump electrode 51, bump electrode 52 and bump electrode 53 shown in FIG. 4 according to the example of the present embodiment, the bump electrode 53 electrically connecting the interposer 40 and the semiconductor component 20 or the semiconductor component 30 to each other has, for example, a conductive pillar 53A and a solder layer 53B as shown in FIG. 10. The conductive pillar 53A is a portion of the bump electrode 53 containing a metal material such as, for example, copper (Cu) or nickel (Ni) as a main component and is called a "pillar bump". A width of the conductive pillar 53A (length in a planar direction (X direction of FIG. 10) along an extending direction of the main surface 20*t* or the main surface 30*t*) is less than a height of the conductive pillar 53A (length in a thickness direction (Z direction of FIG. 10) orthogonal to the thickness direction). The conductive pillar 53A is formed by, for example, a method of depositing, plating or printing a conductor in an opening formed in a mask that is not illustrated. Thus, by using, for example, a photolithography technique used for forming an integrated circuit on a semiconductor wafer, a large number of conductive pillars 53A can be formed with narrow arrangement spacings therebetween.

In addition, the solder layer 53B is a conductive connection member electrically connecting the conductive pillar 53A and the target terminal (terminal 22 or terminal 32 in FIG. 10) to each other and is connected to at least one of an upper surface 53*t* and a lower surface 53*b* of the conductive pillar 53A. In the example shown in FIG. 10, the solder layer 53B is bonded to the upper surface 53*t* of the conductive pillar 53A, and the lower surface 53*b* of the conductive pillar 53A is bonded to the bonding pad 41 (or bonding pad 42). After the bump electrode 53 is formed on the interposer 40, the bump electrode 53 formed on the interposer 40 and the semiconductor component 20 (or semiconductor component 30) are connected to each other so as to have a shape as shown in FIG. 10.

In addition, various modifications are applicable to the structure of the bump electrode 53. For example, the solder layer 53B may be bonded to the lower surface 53*b* of the conductive pillar 53A, and the upper surface 53*t* of the conductive pillar 53A may be bonded to the terminal 22 (or terminal 32). In addition, the bump electrode 53 may be made of a solder material as in, for example, the bump electrode 51 or 52 shown in FIG. 11.

Further, among the bump electrode 51, bump electrode 52 and bump electrode 53 shown in FIG. 4 according to the example of the present embodiment, the bump electrode 51 or the bump electrode 52 electrically connecting the wiring substrate 10 and the semiconductor component 20 or the semiconductor component 30 to each other is made of, for example, a solder material formed into a ball-like shape as shown in FIG. 11. Each of the bump electrode 51 and bump electrode 52 made of a solder material is called a "solder ball".

Each of the bump electrode 51 and bump electrode 52 constituted by the solder ball comprises properties in which the solder ball is more likely to deform when heated as compared to the conductive pillar 53A. Thus, even if the separation distances between the plurality of terminals 21 and the plurality of bonding pads 16 vary, the plurality of terminals 21 and the plurality of bonding pads 16 can be connected to one another by the deformation of the solder ball. In other words, the bump electrode constituted by the solder ball has a larger margin that allows more variations in the distances between the plurality of terminals as compared to the bump electrode constituted by a conductive pillar. As shown in FIGS. 5 and 6, a portion of the interposer 40 of the present embodiment is arranged between the semiconductor component 20 and the wiring substrate 10 in the thickness direction, and another portion is arranged between the semiconductor component and the wiring substrate 10 in the thickness direction. Thus, the separation distance between the terminal 21 and the bonding pad 16 shown in FIG. 11, or the separation distance between the terminal 31 and the bonding pad 16 is greater than a thickness of the interposer 40. Further, since the distances between the plurality of terminals are more likely to vary as the separation distances between the terminals is increased, it is effective to apply a method of electrically connecting the wiring substrate 10 and the semiconductor component 20 or the semiconductor component 30 to each other via the bump electrode 51 or the bump electrode 52 constituted by the solder ball.

Note that various modifications are applicable to the structures of the bump electrode 51 and the bump electrode 52. For example, the bump electrode 51 and the bump electrode 52 may have structures comprising the conductive pillar 53A and the solder layer 53B as in the bump electrode 53 shown in FIG. 10. In this case, a large number of bump electrodes 51 and 52 can be aligned with narrower arrangement spacings as compared to the case where the solder ball is used. Thus, the semiconductor device PKG1 (see FIG. 4) can be suppressed from increasing in size even if the number of bump electrodes 51 and 52 is increased.

MODIFICATIONS

A plurality of modification have been described above in the description of the present embodiment. Hereinafter, modifications other than those described above will be described.

First Modification

Figure 12:
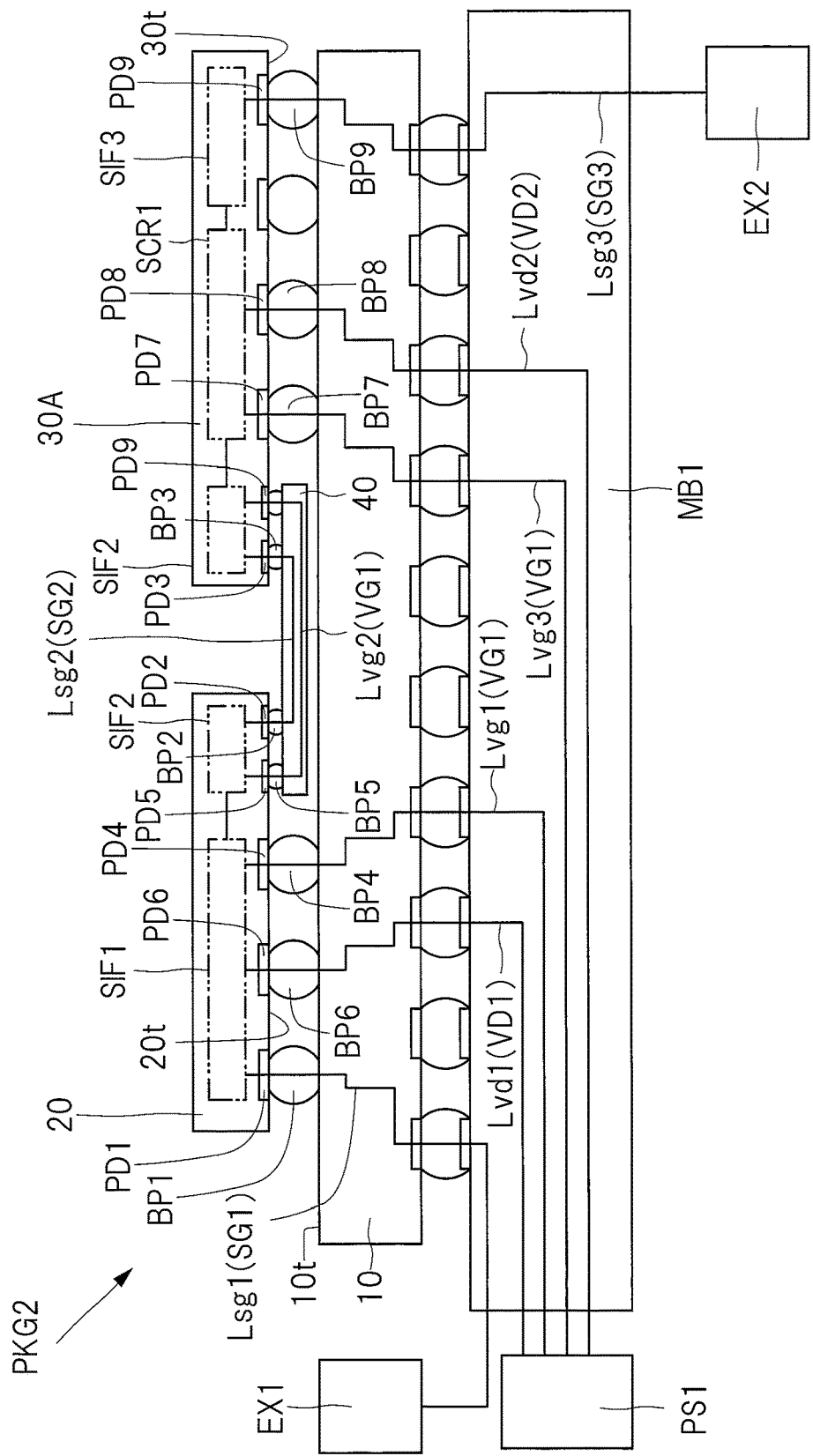
FIG. 12 is an explanatory drawing schematically showing a configuration example of a semiconductor device according to a modification of FIG. 1.

FIG. 12 is an explanatory drawing schematically showing a configuration example of the semiconductor device according to a modification of FIG. 1. The semiconductor device PKG2 shown in FIG. 12 differs from the semiconductor device PKG1 shown in FIG. 1 in that the semiconductor component 30A which is a modification of the semiconductor component 30 shown in FIG. 1 has an external interface circuit SIF3 in addition to the core circuit SCR1.

In FIG. 1, an example in which the arithmetic processing circuit within the core circuit SCR1 of the semiconductor component 30 communicates with the outside via the external interface circuit SIF1 of the semiconductor component 20 has been described. However, the semiconductor component 30A may comprise the external interface circuit SIF3 as in the semiconductor device PKG2 shown in FIG. 12. For example, the semiconductor component 30A may comprise the core circuit SCR1 having a plurality of circuits that include the plurality of arithmetic processing circuits. In this case, some of the arithmetic processing circuits within the plurality of core circuits SCR1 may allow a signal SG3 to be transmitted between the semiconductor component 30A and the outside (external device EX2 in the example shown in FIG. 12) via the terminal PD9 arranged on the main surface 30t of the semiconductor component 30A as shown in FIG. 12.

As in the signal transmission path Lsg1, it is preferable that the serial communication method is used for the method of transmitting the signal SG3 between the external device EX2 and the external interface circuit SIF3 with using a signal transmission path Lsg3. In this case, the signal SG3 is transmitted at a higher frequency (higher transmission speed) than the signal SG2. In addition, the terminal PD9 of the semiconductor component 30A is electrically connected to the wiring substrate 10 via a bump electrode BP9 without the interposer 40 interposed therebetween. Hence, signal loss in the signal transmission path Lsg3 which is a high-speed transmission path can be reduced.

In addition, when the number of signal transmission paths Lsg3 is increased, an area occupied by the external interface circuit SIF3 is increased, so that the area of the semiconductor component 30A is increased. Therefore, in a case where the plurality of signal transmission paths Lsg1 and the plurality of signal transmission paths Lsg3 are connected to the semiconductor device PKG2, it is preferable that the number of signal transmission paths Lsg3 is less than the number of signal transmission paths Lsg1. In other words, in a case where the plurality of terminals PD1 are arranged on the main surface 20t of the semiconductor component 20 and the plurality of terminals PD9 are arranged on the main surface 30t of the semiconductor component 30A, it is preferable that the number of terminals PD9 is less than the number of terminals PD1. Thus, the semiconductor device PKG2 can be suppressed from increasing in size.

The semiconductor device PKG2 shown in FIG. 12 is identical to the semiconductor device PKG1 described above with reference to FIGS. 1 to 11 with the exception of the above-described differences. In addition, the semiconductor component 30A shown in FIG. 12 is identical to the semiconductor component 30 described above with reference to FIGS. 1 to 11 with the exception of the above-described differences. Since the above-described semiconductor component 30 can be replaced with the semiconductor component 30A and the above-described semiconductor device PKG1 can be replaced with the semiconductor device PKG2 with the exception of the above-described differences, redundant descriptions will be omitted.

Second Modification

Figure 13:
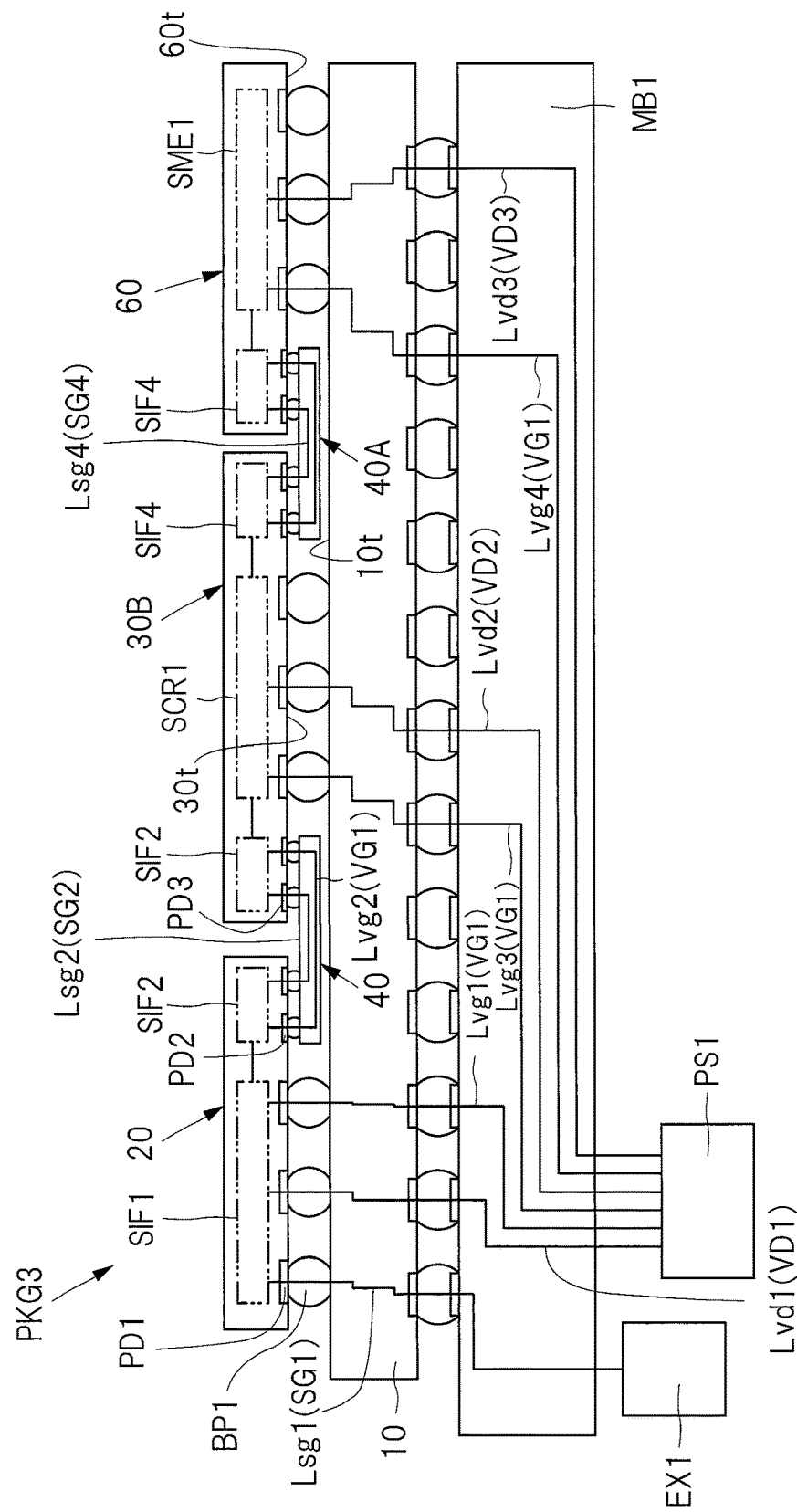
FIG. 13 is an explanatory drawing schematically showing a configuration example of a semiconductor device according to another modification of FIG. 1.
Figure 14:
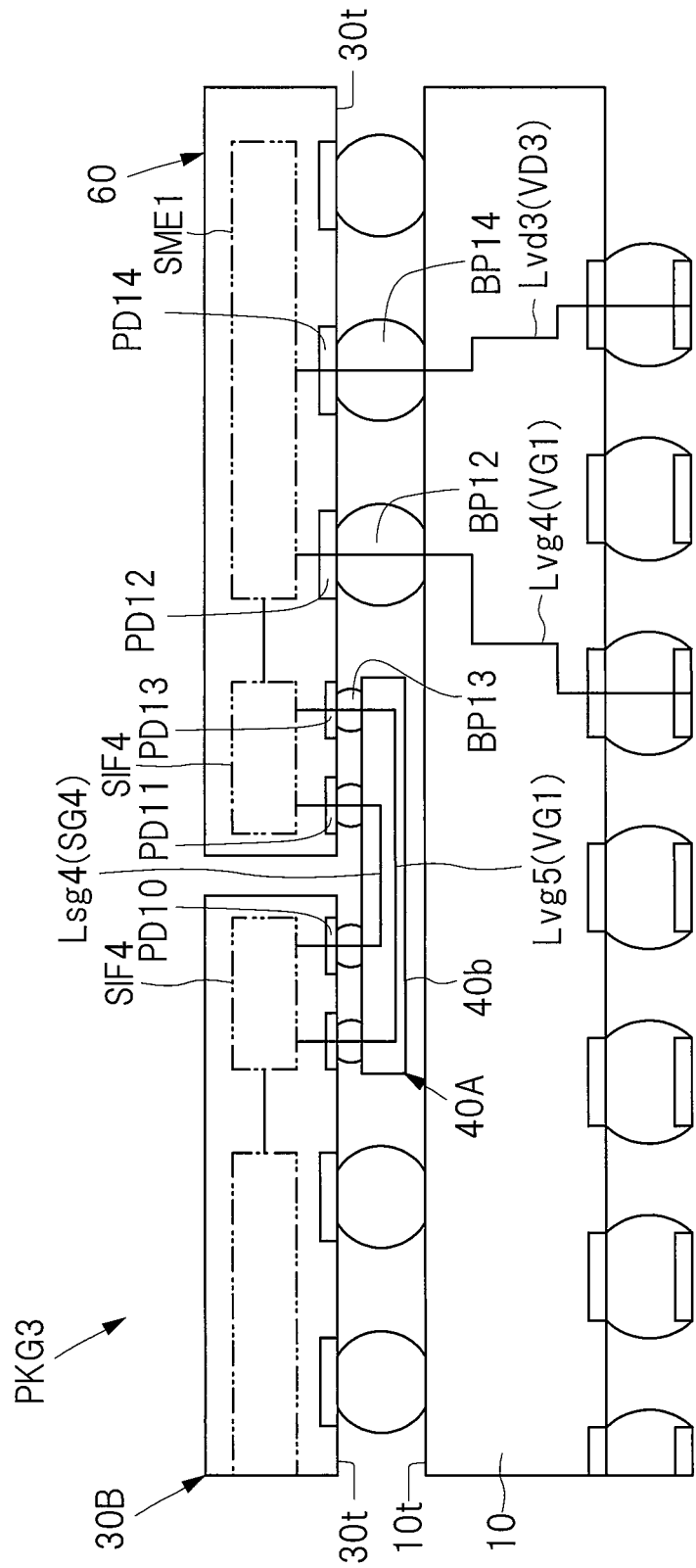
FIG. 14 is an explanatory drawing showing an enlarged periphery of the interposer connected to a memory package shown in FIG. 13.

In addition, in FIG. 1, an embodiment in which two semiconductor components are mounted on the wiring substrate 10 has been described. However, three or more semiconductor components may be mounted on the wiring substrate 10. For example, in the semiconductor device PKG3 shown in FIG. 13, the semiconductor component 20, the semiconductor component 30B and the semiconductor component 60 are mounted on the upper surface 10t of the wiring substrate 10. FIG. 13 is an explanatory drawing schematically showing a configuration example of the semiconductor device according to another modification of FIG. 1. In addition, FIG. 14 is an explanatory drawing showing an enlarged periphery of the interposer connected to a memory package shown in FIG. 13.

In the example shown in FIG. 13, the semiconductor component 60 is a memory package comprising a memory circuit (main memory circuit), and the semiconductor component 30B comprises a control circuit for controlling the memory circuit. The control circuit is included in, for example, the core circuit SCR1 shown in FIG. 13.

In addition, in the example of the present embodiment, the semiconductor component 60 and the semiconductor component 30B are electrically connected to each other via the interposer 40A which is a wiring member identical to the interposer 40. In other words, the semiconductor device PKG3 comprises a system that is operational by signals being transmitted between the semiconductor component 30B and the semiconductor component 60.

The semiconductor component 60 comprises the memory circuit (main memory circuit, memory circuit) SME1 for storing data to be communicated between the semiconductor component 60 and the semiconductor component 30B. In addition, the semiconductor component 30B comprises the control circuit for controlling the operation of the main memory circuit of the semiconductor component 60. Further, the semiconductor component 30B comprises the arithmetic processing circuit for arithmetically processing the received data signal. In FIG. 13, main circuits such as the arithmetic processing circuit, the control circuit and the like are each shown as an example of the core circuit SCR1. Note that circuits other than the above-described circuits may be included in the core circuit SCR1. For example, an auxiliary memory circuit (memory circuit) having a smaller storage capacity than the main memory circuit of the semiconductor component 60, as in a cache memory for temporarily storing data, may be formed on the semiconductor component 30B.

In addition, the semiconductor component 30B comprises an internal interface circuit SIF4 for transmitting a signal SG4 between the semiconductor component 30B and the semiconductor component 60 in addition to the internal interface circuit SIF2 for transmitting the signal SG2 between the semiconductor component 30B and the semiconductor component 20. Further, the semiconductor component 60 comprises an internal interface circuit SIF4 for transmitting the signal SG4 between the semiconductor component 60 and the semiconductor component 30B in addition to the memory circuit SME1. The control circuit of the semiconductor component 30B allows a signal to be transmitted between the semiconductor component 30B and the semiconductor component 60 via the internal interface circuit SIF4 and the interposer 40A (more specifically, a plurality of signal transmission paths Lsg4 within the interposer 40A) connected to the internal interface circuit SIF4.

Figure 27:
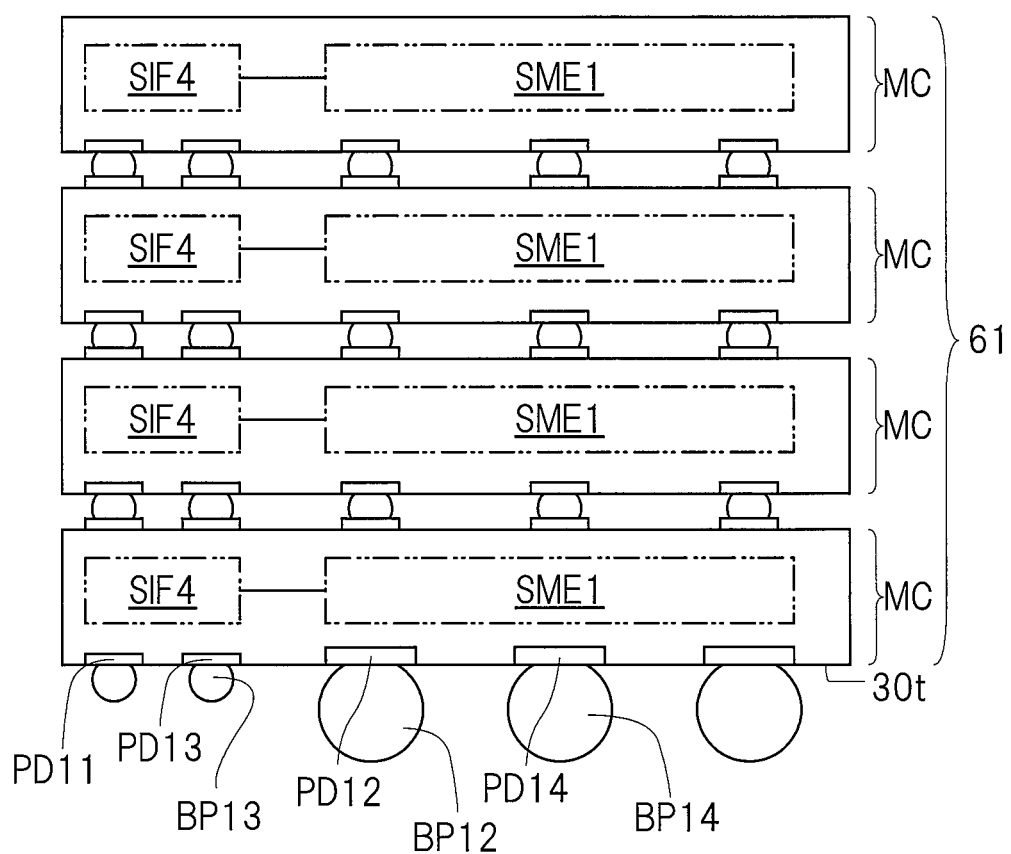
FIG. 27 is an explanatory drawing showing a modification of a memory package shown in FIG. 14.

The memory circuit SME1 shown in FIG. 13 can be formed on the core circuit SCR1 of the semiconductor component 30B. However, it is preferable that the memory circuit SME1 is formed on the semiconductor component 60 that is separate from the semiconductor component 30B for the following reason. Namely, the area occupied by the memory circuit SME1 increases as the storage capacity increases. Thus, in the case where the memory circuit SME1 is formed on the semiconductor component 30B, a plane area (area of main surface 30t) of the semiconductor component 30B significantly changes according to the necessary storage capacity. On the other hand, in the case of a configuration in which the memory circuit SME1 is formed on the semiconductor component 60 as in the semiconductor device PKG3, a substantially constant plane area of the semiconductor component 30B can be maintained without being affected by the storage capacity necessary for the system. In addition, the semiconductor component 60 on which the memory circuit SME1 is formed has the memory circuit SME1, the internal interface circuit SIF4 and a power-supply circuit, and does not have complicated circuits such as, for example, the arithmetic processing circuit. In this case, the degree of freedom of the layout for the memory circuit SME1 is high, so that the plane area (area of main surface 60t) of the semiconductor component 60 can be suppressed from increasing in size by the storage capacity. For example, in the case of a structure in which a plurality of memory chips MC each having the memory circuits SME1 are stacked as in the semiconductor component 61 shown in FIG. 27, the plane area of the semiconductor component 61 can be suppressed from increasing in size while the storage capacity is increased. FIG. 27 is an explanatory drawing showing a modification of a memory package shown in FIG. 14.

A signal transmission path Lsg4 is a wiring path for transmitting the signal SG4 by, for example, the parallel communication method as in the signal transmission path Lsg2. Thus, the interposer 40A may have a structure that is identical to the interposer 40. In the example shown in each of FIGS. 13 and 14, a terminal PD10 (see FIG. 14) for transmitting the signal SG4 between the semiconductor component 30B and the semiconductor component 60 is arranged on the main surface 30t of the semiconductor component 30B in addition to the terminal PD3 (see FIG. 13) for transmitting the signal SG2 between the semiconductor component 30B and the semiconductor component 20 (see FIG. 13). In addition, as shown in FIG. 14, the semiconductor component 60 has the main surface 60t on which a terminal PD11 for transmitting the signal SG4 between the semiconductor component 60 and the semiconductor component 30B is arranged.

Further, the wiring path connected to the semiconductor component 60 may be connected to a transmission path that is separate from the signal transmission path Lsg4. For example, in the example shown in FIG. 14, a terminal PD12 and a terminal PD13 that allow the ground potential VG1 to be supplied are arranged on the main surface 60t of the semiconductor component 60. A wiring path Lvg4 that allows the ground potential VG1 to be supplied from the outside (potential-supply unit PS1 in the example shown in FIG. 14) and a wiring path Lvg5 that allows the ground potential VG1 to be transmitted between the semiconductor component 60 and the semiconductor component 30B are connected to the semiconductor component 60. In the example shown in FIG. 14, the ground potential VG1 can be supplied from the potential-supply unit PS1 to the memory circuit SME1 and the internal interface circuit SIF4 via the terminal PD12. In addition, the terminal PD13 is connected to the internal interface circuit SIF4, and the ground potential VG1 is supplied to the terminal PD13 via the internal interface circuit SIF4.

The wiring path Lvg5 that allows the ground potential VG1 to be supplied may be used as a reference path for transmitting a reference potential corresponding to a signal waveform of the signal transmission path Lsg4. In addition, in the case where the wiring path Lvg5 to which the ground potential is supplied is arranged in the periphery of the signal transmission path Lsg4, the wiring path Lvg5 may be used as a shield conductor for suppressing transmission of noise generated in the signal transmission path Lsg4 or noise corresponding to the signal transmission path Lsg4.

Further, the terminal PD12 of the semiconductor component 60 is electrically connected to the wiring substrate 10 via a bump electrode BP12 without the interposer 40A interposed therebetween. Furthermore, the terminal PD13 of the semiconductor component 60 is electrically connected to the interposer 40A via a bump electrode BP13. In the example shown in FIG. 14, the wiring path Lvg5 of the interposer 40A is connected to the wiring substrate 10 via the semiconductor component 30B and the semiconductor component 60 and is not directly connected to the wiring substrate 10. In this case, the terminal does not need to be provided on the lower surface 40b side of the interposer 40A.

Note that, as a modification for the method of supplying the ground potential VG1 to the wiring path Lvg5 of the interposer 40A, a terminal may be provided between the interposer 40A and the wiring substrate 10, that is, on the lower surface 40b side of the interposer 40, and the wiring substrate 10 and the wiring path Lvg5 may be directly connected to each other via this terminal. Since more supply paths for the ground potential VG1 can be provided if the ground potential VG1 is supplied from the terminal connected to the wiring substrate 10, the potential of the wiring path Lvg5 can be stabilized.

In addition, in the example shown in FIG. 14, a terminal PD14 that allows the power-supply potential VD1 to be supplied from the outside (potential-supply unit PS1 in the example shown in FIG. 13) is arranged on the main surface 60t of the semiconductor component 60. A wiring path Lvd3 that allows a power-supply potential VD3 to be supplied from the outside is connected to the semiconductor component 60. The terminal PD14 of the semiconductor component 60 is electrically connected to the wiring substrate 10 via a bump electrode BP14 without the interposer 40A interposed therebetween. The power-supply potential VD3 is a power-supply potential for driving, for example, the memory circuit SME1 of the semiconductor component 60, the internal interface circuit SIF4 of the semiconductor component 60, or both. As shown in FIG. 14, by directly supplying the power-supply potential VD3 from the wiring substrate 10 without the interposer 40A interposed therebetween, impedance of the wiring path Lvd3 can be reduced, so that the power-supply potential VD3 can be stabilized.

In addition, in the example shown in FIG. 14, the terminal PD12 of the semiconductor component 60 is arranged on the main surface 20t at a position between the terminal PD14 and the terminal PD13. In a case where the terminal PD12 for supplying the ground potential VG1 to the semiconductor component 60 is arranged close to the terminal PD13, the distance of the supply path for the ground potential VG1 supplied to the terminal PD13 via the terminal PD12 is shortened. Hence, the potential of the wiring path Lvg5 can be stabilized.

The semiconductor device PKG3 shown in FIG. 13 is identical to the semiconductor device PKG1 described above with reference to FIGS. 1 to 11 with the exception of the above-described differences. In addition, the semiconductor component 30B shown in FIG. 13 is identical to the semiconductor component 30 described above with reference to FIGS. 1 to 11 with the exception of the above-described differences. Further, the interposer 40A shown in FIG. 13 is identical to the interposer 40 described above with reference to FIGS. 1 to 11 with the exception of the above-described differences. Since the above-described semiconductor component 30 can be replaced with the semiconductor component 30A, the interposer 40 can be replaced with the interposer 40A and the above-described semiconductor device PKG1 can be replaced with the semiconductor device PKG3 with the exception of the above-described differences, redundant descriptions will be omitted.

Third Modification

Figure 15:
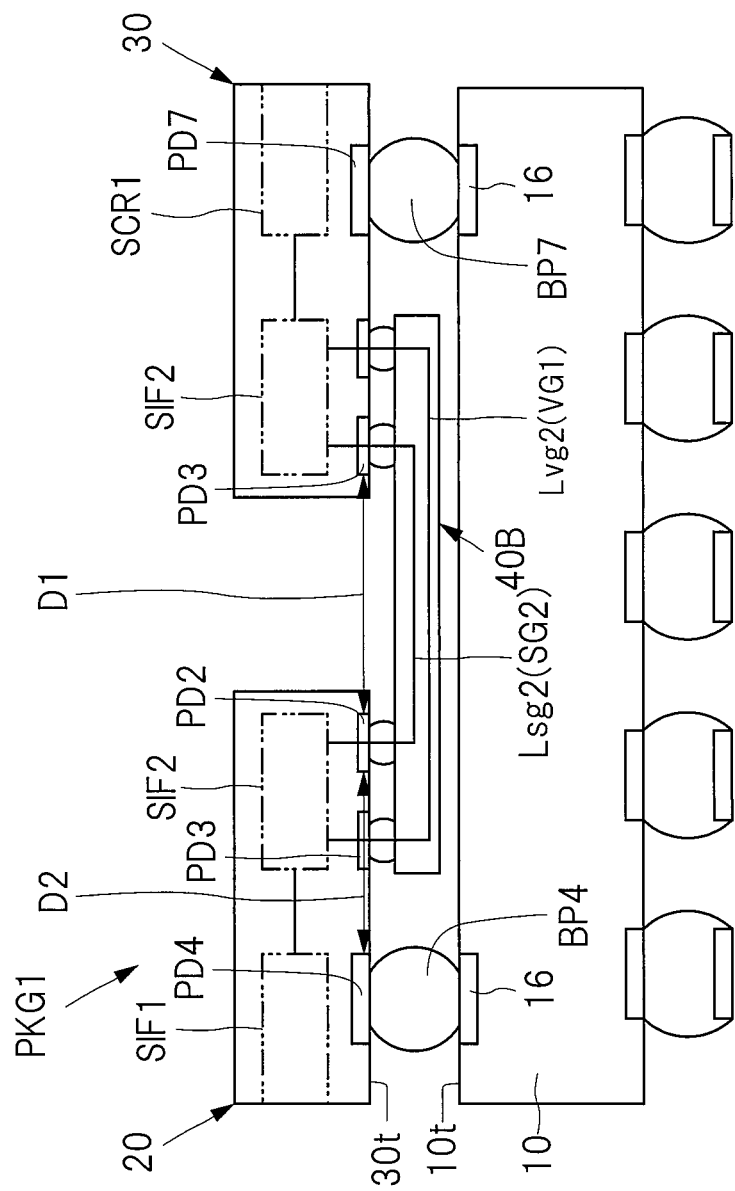
FIG. 15 is an explanatory drawing showing an enlarged periphery of the interposer shown in FIG. 1.
Figure 16:
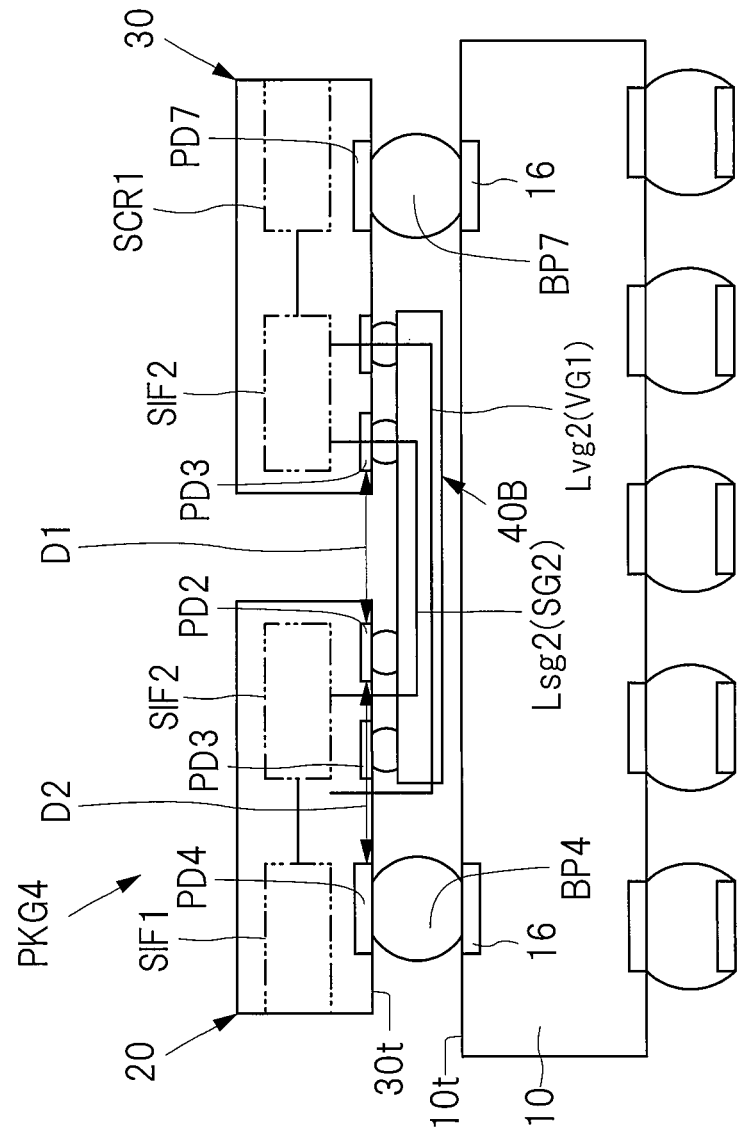
FIG. 16 is an explanatory drawing showing an enlarged periphery of an interposer according to a modification of FIG. 15.

In addition, as a modification of FIG. 1, the wiring path distance of the signal transmission path Lsg2 may be further shortened. FIG. 15 is an explanatory drawing showing an enlarged periphery of the interposer shown in FIG. 1. FIG. 16 is an explanatory drawing showing an enlarged periphery of an interposer according to a modification of FIG. 15.

As shown in FIG. 15, a separation distance D1 between the terminal PD2 of the semiconductor component 20 and the terminal PD3 of the semiconductor component 30 is longer than or equal to a separation distance D2 between the terminal PD2 and the terminal PD4 of the semiconductor component 20. By increasing the separation distance D1 between the terminal PD2 of the semiconductor component 20 and the terminal PD3 of the semiconductor component 30, the routing space for the wiring that configures the signal transmission path Lsg2 can be increased.

On the other hand, in the case of the semiconductor device PKG4 shown in FIG. 16, the separation distance D1 between the terminal PD2 of the semiconductor component 20 and the terminal PD3 of the semiconductor component 30 is shorter than the separation distance D2 between the terminal PD2 and the terminal PD4 of the semiconductor component 20. In other words, the transmission path distance of the signal transmission path Lsg2 of the interposer 40B within the semiconductor device PKG4 shown in FIG. 16 is shorter than the transmission path distance of the signal transmission path Lsg2 of the interposer 40 within the semiconductor device PKG1 shown in FIG. 15. Further, by shortening the transmission distance of the signal transmission path Lsg2 for transmitting a signal by the parallel communication method, it is possible to suppress the synchronization problem caused by the clock skew, the problem in which transmission loss increases and the problem in which crosstalk noise occurs.

The semiconductor device PKG4 shown in FIG. 16 is identical to the semiconductor device PKG1 described above with reference to FIGS. 1 to 11 with the exception of the above-described differences. In addition, the interposer 40B shown in FIG. 16 is identical to the interposer 40 described above with reference to FIGS. 1 to 11 with the exception of the above-described differences. Since the interposer 40 can be replaced with the interposer 40B and the above-described semiconductor device PKG1 can be replaced with the semiconductor device PKG4 with the exception of the above-described differences, redundant descriptions will be omitted.

Fourth Modification

Figure 17:
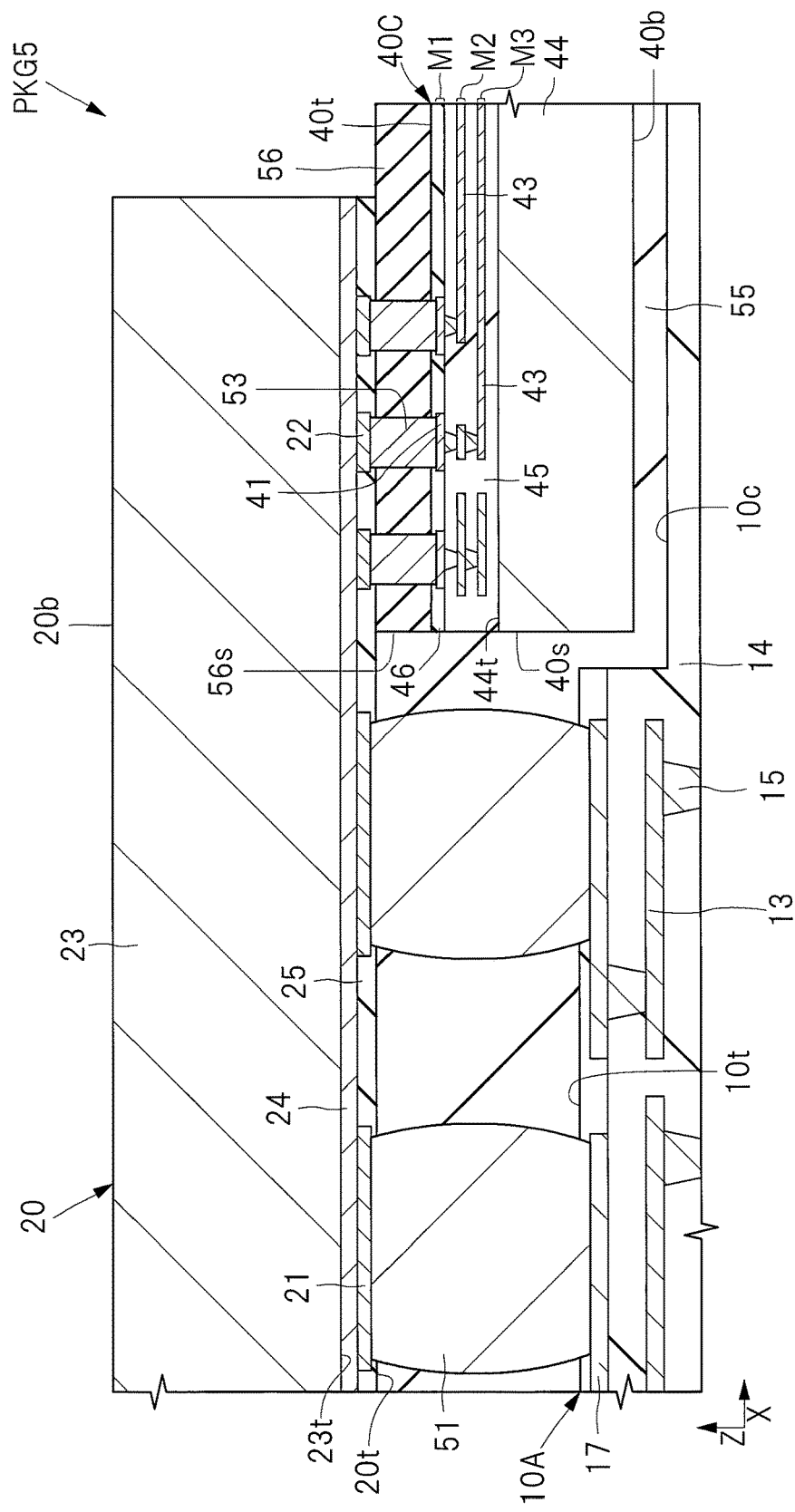
FIG. 17 is an enlarged cross-sectional view showing a periphery of a connection portion between a semiconductor component and an interposer of a semiconductor device according to a modification of FIG. 5.

In addition, in the example shown in FIG. 5, an embodiment in which the resin body 55 is arranged in a gap between the lower surface 40b of the interposer 40 and the upper surface 10t of the wiring substrate 10 has been described. However, there may be a case where it is difficult to arrange a portion of the interposer 40 in the gap between the semiconductor component 20 and the wiring substrate 10 depending on the thickness of the interposer 40 or the height of the bump electrode 53. In this case, a portion of the interposer 40C may be arranged inside a cavity (opening, stepped portion) 10c formed in a portion of the upper surface 10t side of the wiring substrate 10A as in the semiconductor device PKG5 shown in FIG. 17. FIG. 17 is an enlarged cross-sectional view showing a periphery of a connection portion between the semiconductor component and the interposer of the semiconductor device according to a modification of FIG. 5.

The semiconductor device PKG5 shown in FIG. 17 differs from the semiconductor device PKG1 shown in FIG. 5 in that the cavity 10c is formed in a portion of the upper surface 10t side of the wiring substrate 10A. In addition, the thickness of the semiconductor substrate 44 within the interposer 40C shown in FIG. 17 is greater than the thickness of the semiconductor substrate 44 within the interposer 40 shown in FIG. 5. In this case, strength of the interposer 40C is higher than the strength of the interposer 40. Thus, a sum between the thickness of the interposer 40C and the height of the bump electrode 53 is greater than the separation distance between the upper surface 10t of the wiring substrate 10 and the main surface 20t of the semiconductor component 20. However, by forming the cavity 10c as in the wiring substrate 10A and arranging a portion (portion that includes at least the lower surface 40b) of the interposer 40C inside the cavity 10c, the interposer 40C and the semiconductor component 20 can be connected to each other.

The thickness of the semiconductor substrate 44 is not the only reason that the sum between the thickness of the interposer 40C and the height of the bump electrode 53 as shown in FIG. 17 becomes greater than the separation distance between the upper surface 10t of the wiring substrate 10 and the main surface 20t of the semiconductor component 20. For example, there may be a case where an increase in the number of wiring layers of the interposer 40 causes the thickness of the interposer 40 to increase. As a further example, there may be a case where the height of the bump electrode 53 is greater than that of the example shown in FIG. 5. In addition, in the case where the separation distance between the upper surface 10t of the wiring substrate 10 and the main surface 20t of the semiconductor component 20 is shorter than that of the example shown in FIG. 5, the sum between the thickness of the interposer 40 and the height of the bump electrode 53 becomes greater than the separation distance between the upper surface 10t of the wiring substrate 10 and the main surface 20t of the semiconductor component 20. In any of these cases, as long as the cavity 10c is formed in a portion of the upper surface 10t of the wiring substrate 10A as in the semiconductor device PKG5 shown in FIG. 17, a structure in which a portion of the interposer 40 is arranged between the wiring substrate 10 and the semiconductor component 20 can be provided.

FIG. 17 has been described as a modification of FIG. 5; however, the same relation may be applied to the semiconductor component 30 shown in FIG. 6. Namely, the portions described as the semiconductor component 20 in the present modification may instead be read as the semiconductor component 30.

In addition, the semiconductor device PKG5 shown in FIG. is identical to the semiconductor device PKG1 described above with reference to FIGS. 1 to 11 with the exception of the above-described differences. Further, the interposer 40C shown in FIG. 17 is identical to the interposer 40 described above with reference to FIGS. 1 to 11 with the exception of the above-described differences. Since the interposer 40 can be replaced with the interposer 40C and the above-described semiconductor device PKG1 can be replaced with the semiconductor device PKG5 with the exception of the above-described differences, redundant descriptions will be omitted.

Fifth Modification

Figure 18:
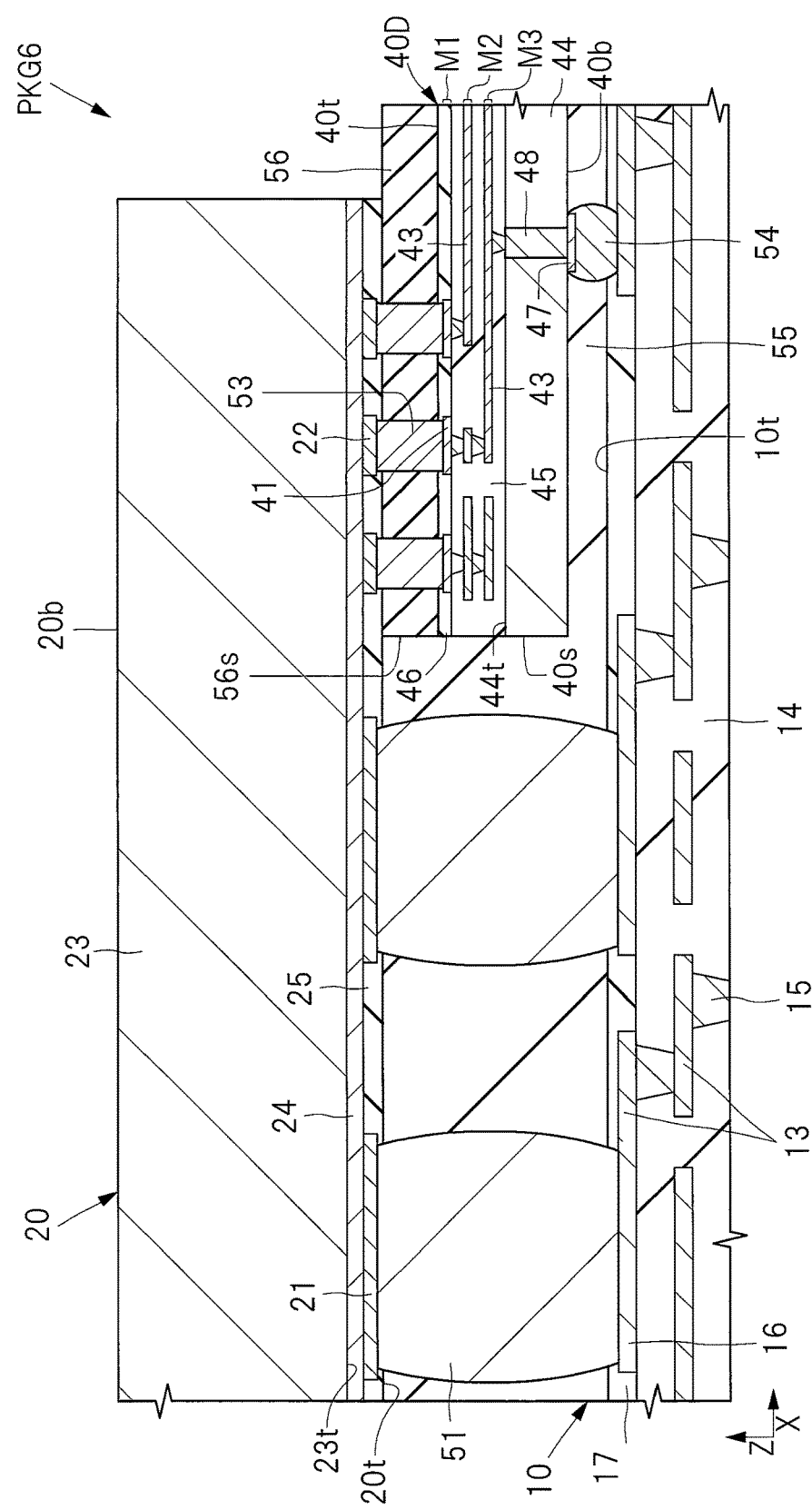
FIG. 18 is an enlarged cross-sectional view showing a periphery of a connection portion between a semiconductor component and an interposer of a semiconductor device according to another modification of FIG. 5.

In the example shown in each of FIGS. 5 and 6, terminals, electrodes and the like are not provided on the lower surface 40b of the interposer 40. All of the terminals of the interposer 40 are arranged on the upper surface 40t side. However, as a modification of FIGS. 5 and 6, a terminal 47 may be provided on the lower surface 40b as in the interposer 40D within the semiconductor device PKG6 shown in FIG. 18. FIG. 18 is an enlarged cross-sectional view showing a periphery of a connection portion between the semiconductor component and the interposer of the semiconductor device according to another modification of FIG. 5.

The interposer 40D comprises a plurality of through electrodes 48 penetrating the semiconductor substrate 44 in the thickness direction (direction from one surface to the other surface among the main surface 44t and lower surface 40b). The plurality of through electrodes 48 are conductive paths formed by filling a conductor such as, for example, copper (Cu) in through holes formed so as to penetrate the semiconductor substrate 44 in the thickness direction. Each through electrode 48 has one end connected to the terminal 47 formed on the lower surface 40b and the other end connected to the wiring 43 of the wiring layer M3. In the case of the interposer 40D, the power-supply potential VD1, VD2, the ground potential VG1 or the like shown in, for example, FIG. 1 can be supplied via the terminal 47 arranged on the lower surface 40b and a bump electrode 54 connected to the terminal 47. In this case, the power-supply potential VD1, VD2 or the ground potential VG1 supplied via the terminal 47 can be stabilized. The bump electrode 54 is, for example, a solder ball described above with reference to FIG. 11 or a conductive pillar described above with reference to FIG. 10.

Note that, even in such a case, the signal transmission path Lsg1 shown in FIG. 1 is connected to the terminal PD1. Namely, it is preferable that the signal transmission path Lsg1 is connected to the semiconductor component 20 without the interposer 40D interposed therebetween. As long as the signal transmission path Lsg1 for transmitting the signal SG1 at a high speed (high frequency) by the serial communication method is connected to the wiring substrate 10 via the bump electrode BP1 without the interposer 40D interposed therebetween, signal loss in the high-speed transmission path can be reduced.

FIG. 18 has been described as a modification of FIG. 5; however, the same relation may be applied to the semiconductor component 30 shown in FIG. 6. Namely, the portions described as the semiconductor component 20 in the present modification may instead be read as the semiconductor component 30.

In addition, the semiconductor device PKG6 shown in FIG. is identical to the semiconductor device PKG1 described above with reference to FIGS. 1 to 11 with the exception of the above-described differences. Further, the interposer 40D shown in FIG. 18 is identical to the interposer 40 described above with reference to FIGS. 1 to 11 with the exception of the above-described differences. Since the interposer 40 can be replaced with the interposer 40D and the above-described semiconductor device PKG1 can be replaced with the semiconductor device PKG6 with the exception of the above-described differences, redundant descriptions will be omitted.

Sixth Modification

Figure 19:
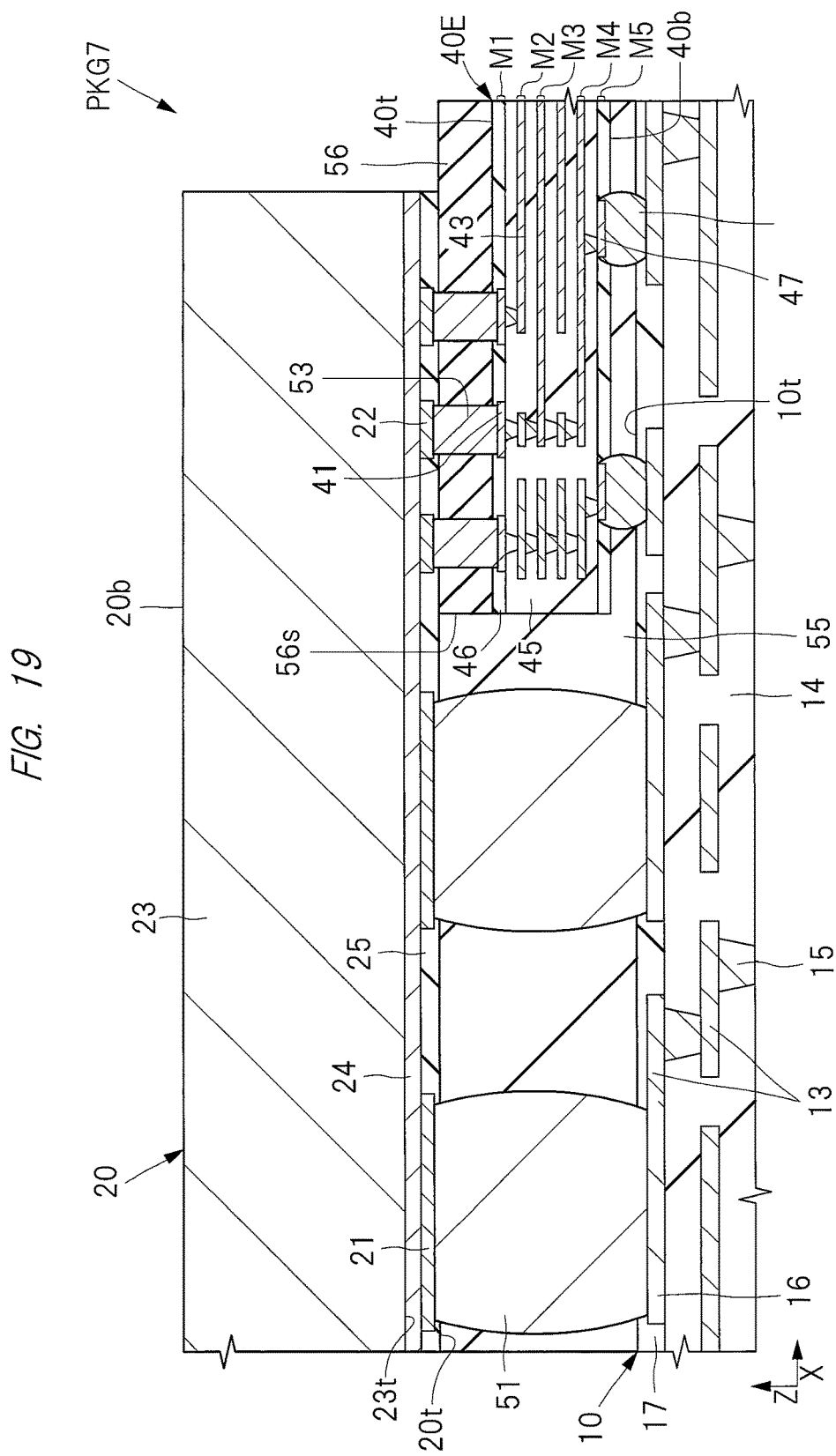
FIG. 19 is an enlarged cross-sectional view showing a periphery of a connection portion between a semiconductor component and an interposer of a semiconductor device according to another modification of FIG. 5.

In addition, the embodiment in which terminals are provided on the lower surface side of the interposer includes another modification of the interposer 40D described above with reference to FIG. 18. FIG. 19 is an enlarged cross-sectional view showing a periphery of a connection portion between the semiconductor component and the interposer of the semiconductor device according to another modification of FIG. 5.

The interposer 40E within the semiconductor device PKG7 shown in FIG. 19 is a so-called "multilayer wiring substrate" comprising a plurality of stacked wiring layers. In the example shown in FIG. 19, the interposer 40E comprises a total of five wiring layers consisting of wiring layers M1, M2, M3, M4 and M5 in this order from the upper surface 40t side. Each of the wiring layers has a conductive pattern such as the wiring 43, and adjacent conductive patterns are covered by the insulating layer 45. Note that the number of wiring layers within the interposer 40E is not limited to that of the example shown in FIG. 19, and may be, for example, less than or greater than five layers. In addition, the plurality of wiring layers within the interposer 40E are electrically connected to one another via the via wirings which are interlayer conductive paths.

The insulating layer 45 is made of an organic insulating material such as, for example, thermosetting resin. Alternatively, the insulating layer 45 may be formed of a glass material (inorganic insulating material) such as, for example, silicon dioxide ($SiO_2$). In the case where the insulating layer 45 is formed of an inorganic insulating material, a flatness of the insulating layer 45 configuring the base of each of the wiring layers can be improved, so that the wiring width of the plurality of wirings 43 can be reduced and the arrangement density of the plurality of wirings 43 can be increased such that the arrangement density is higher than that of the wirings 13 of the wiring substrate 10.

In addition, the plurality of bonding pads 41 are formed on the upper surface 40t of the interposer 40E. Although illustrations are omitted in FIG. 19, the bonding pads 42 described above with reference to FIGS. 6 and 9 are also formed on the upper surface 40t of the interposer 40E. Further, each of the bonding pads 41 (and each of the bonding pads 42) is electrically connected to the semiconductor component 20 via the bump electrode 53. In addition, the plurality of terminals 47 are formed on the lower surface 40b of the interposer 40E. Further, each of the terminals 47 is electrically connected to the wiring substrate 10 via the bump electrode 54. The bonding pads 41 (and bonding pads 42) and the terminals 47 are electrically connected to one another via the plurality of wiring layers of the interposer 40E. In other words, the semiconductor device PKG7 has a wiring path in which the wiring substrate 10 and the semiconductor component 20 are electrically connected to each other via the interposer 40E.

In the case of the interposer 40E, the power-supply potential VD1, VD2, the ground potential VG1 or the like shown in, for example, FIG. 1 can be supplied via the terminal 47 arranged on the lower surface 40b and the bump electrode 54 connected to the terminal 47. In this case, the power-supply potentials VD1, VD2 or the ground potential VG1 supplied via the terminal 47 can be stabilized.

Note that the signal transmission path Lsg1 shown in FIG. 19 is connected to the terminal PD1 as in the above-described fifth modification. Namely, it is preferable that the signal transmission path Lsg1 is connected to the semiconductor component 20 without the interposer 40E interposed therebetween. As long as the signal transmission path Lsg1 for transmitting the signal SG1 at a high speed (high frequency) by the serial communication method is connected to the wiring substrate 10 via the bump electrode BP1 without the interposer 40E interposed therebetween, signal loss in the high-speed transmission path can be reduced.

In addition, although illustrations are omitted, there are various modifications of the semiconductor device PKG7 shown in FIG. 19. For example, a core insulating layer made of an insulating material in which, for example, a fiber material such as glass fiber is impregnated with a resin material such as epoxy resin may be arranged between the plurality of wiring layers shown in FIG. 19. In this case, strength of the interposer 40E can be improved. In addition, in the case where the core insulating layer is arranged, the bonding pad 41 and the terminal 47 are electrically connected to each other via a through-hole wiring penetrating the core insulating layer.

FIG. 19 has been described as a modification of FIG. 5; however, the same relation may be applied to the semiconductor component 30 shown in FIG. 6. Namely, the portions described as the semiconductor component 20 in the present modification may instead be read as the semiconductor component 30.

In addition, the semiconductor device PKG7 shown in FIG. is identical to the semiconductor device PKG1 described above with reference to FIGS. 1 to 11 with the exception of the above-described differences. Further, the interposer 40E shown in FIG. 19 is identical to the interposer 40 described above with reference to FIGS. 1 to 11 with the exception of the above-described differences. Since the interposer 40 can be replaced with the interposer 40E and the above-described semiconductor device PKG1 can be replaced with the semiconductor device PKG7 with the exception of the above-described differences, redundant descriptions will be omitted.

Seventh Modification

Figure 20:
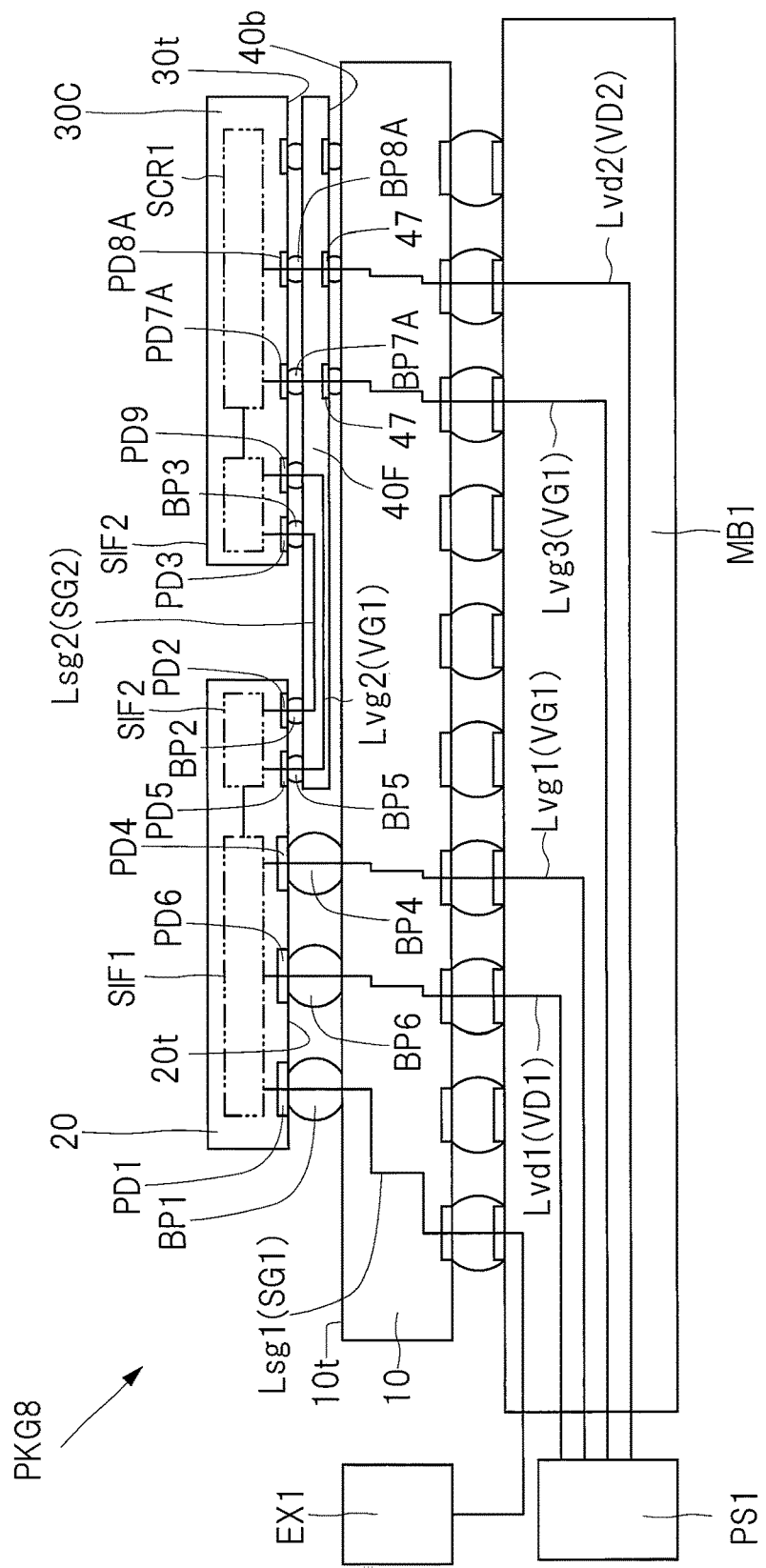
FIG. 20 is an explanatory drawing schematically showing a configuration example of a semiconductor device according to another modification of FIG. 1.

In addition, by utilizing the technique in which the terminal 47 is arranged on the lower surface 40b side of the interposer as in the above-described interposer 40D of the fifth modification and the above-described interposer 40E of the sixth modification, a structure in which all of the wiring paths are connected to the semiconductor component 30 via the interposer 40F as in the semiconductor device PKG8 shown in FIG. may be provided. FIG. 20 is an explanatory drawing schematically showing a configuration example of the semiconductor device according to another modification of FIG.

The semiconductor device PKG8 shown in FIG. 20 differs from the semiconductor device PKG1 shown in FIG. 1 in that each of the terminals PD7A and terminals PD8A of the semiconductor component 30 is electrically connected to the wiring substrate 10 via the interposer 40F.

The plurality of terminals 47 are arranged on the lower surface 40b of the interposer 40F. Since the structure of the interposer 40D described above with reference to FIG. 18 or the structure of the interposer 40E described above with reference to FIG. 19 can be applied to the details of the structure of the plurality of terminals 47, redundant descriptions will be omitted.

In addition, the terminal PD7A that allows the ground potential VG1 to be supplied from the outside (potential-supply unit PS1 in the example shown in FIG. 20) and the terminal PD8A that allows the power-supply potential VD2 to be supplied are arranged on the semiconductor component 30C. The terminal PD7 of the semiconductor component 30A is electrically connected to the interposer 40F via the bump electrode BP7A. In addition, the terminal PD7A is electrically connected to the wiring substrate 10 via the terminal 47 of the interposer 40F. Further, the terminal PD8A of the semiconductor component 30C is electrically connected to the interposer 40F via the bump electrode BP8A. Furthermore, the terminal PD8A is electrically connected to the wiring substrate 10 via the terminal 47 of the interposer 40F.

The semiconductor device PKG8 shown in FIG. 20 is identical to the semiconductor device PKG1 described above with reference to FIGS. 1 to 11 with the exception of the above-described differences. In addition, the semiconductor component 30C shown in FIG. 20 is identical to the semiconductor component 30 described above with reference to FIGS. 1 to 11 with the exception of the above-described differences. Further, the interposer 40F shown in FIG. 20 is identical to the interposer 40 described above with reference to FIGS. 1 to 11 with the exception of the above-described differences. Since the above-described semiconductor component 30 can be replaced with the semiconductor component 30C, the interposer 40 can be replaced with the interposer 40F and the above-described semiconductor device PKG1 can be replaced with the semiconductor device PKG8 with the exception of the above-described differences, redundant descriptions will be omitted.

Eighth Modification

Figure 21:
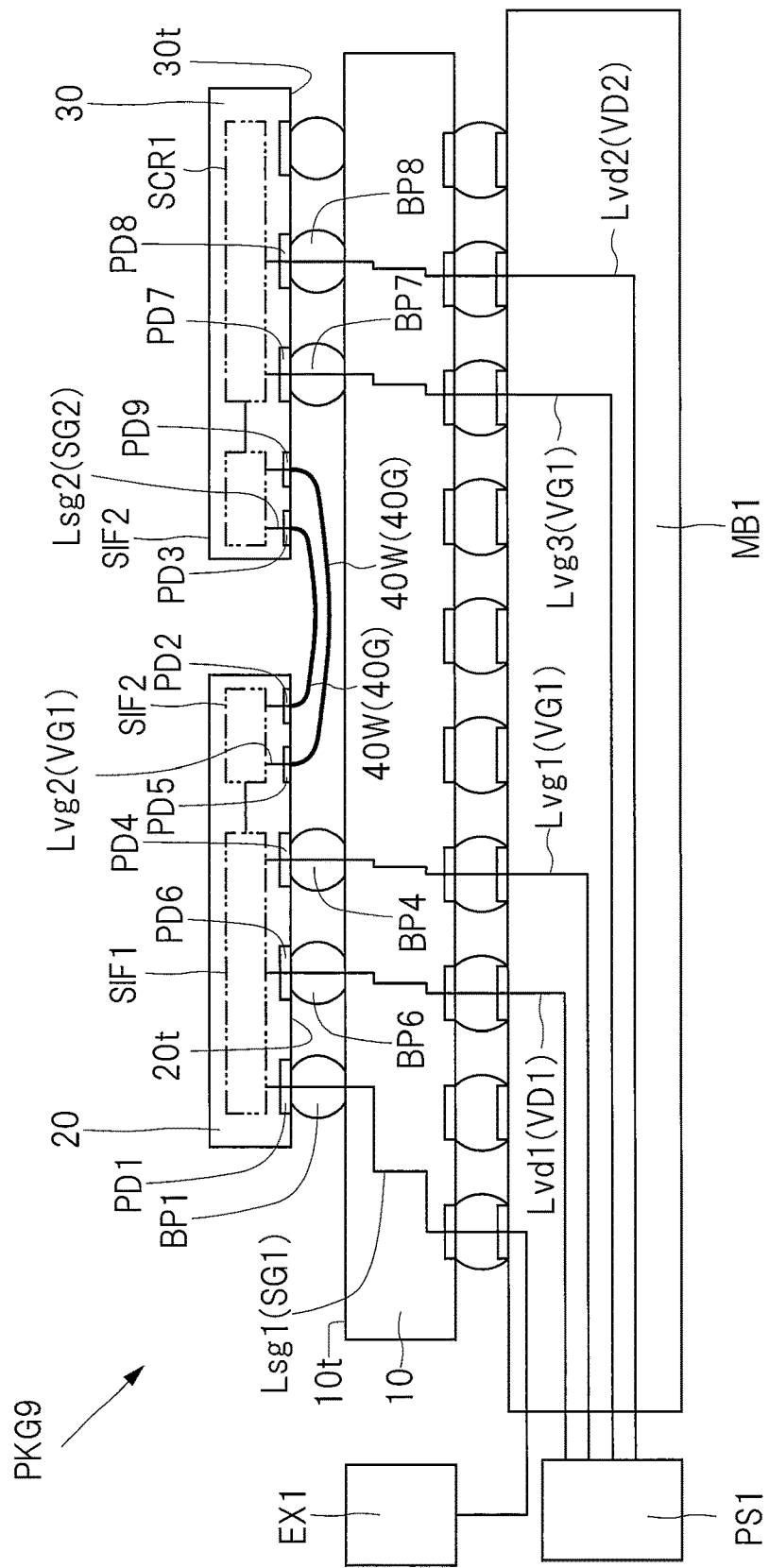
FIG. 21 is an explanatory drawing schematically showing a configuration example of a semiconductor device according to another modification of FIG. 1.

FIG. 21 is an explanatory drawing schematically showing a configuration example of the semiconductor device according to another modification of FIG. 1. In FIG. 1, the interposer which is the wiring substrate having the plurality of wirings insulated from one another has been described as the wiring member electrically connecting the semiconductor component 20 and the semiconductor component 30 to each other. The wiring member such as the wiring member 40G within the semiconductor device PKG9 shown in FIG. 21 electrically connecting the semiconductor component 20 and the semiconductor component 30 to each other may be constituted by a plurality of wires 40 W each having one end connected to the terminal PD2 (or terminal PD5) of the semiconductor component 20 and the other end connected to the terminal PD3 (or terminal PD9) of the semiconductor component 30. In this case, it is preferable that the plurality of wires 40 W are encapsulated in a resin body (for example, see the resin body 56 shown in FIG. 4) in order to suppress the plurality of wires 40 W from coming into contact with one another.

Ninth Modification

Figure 22:
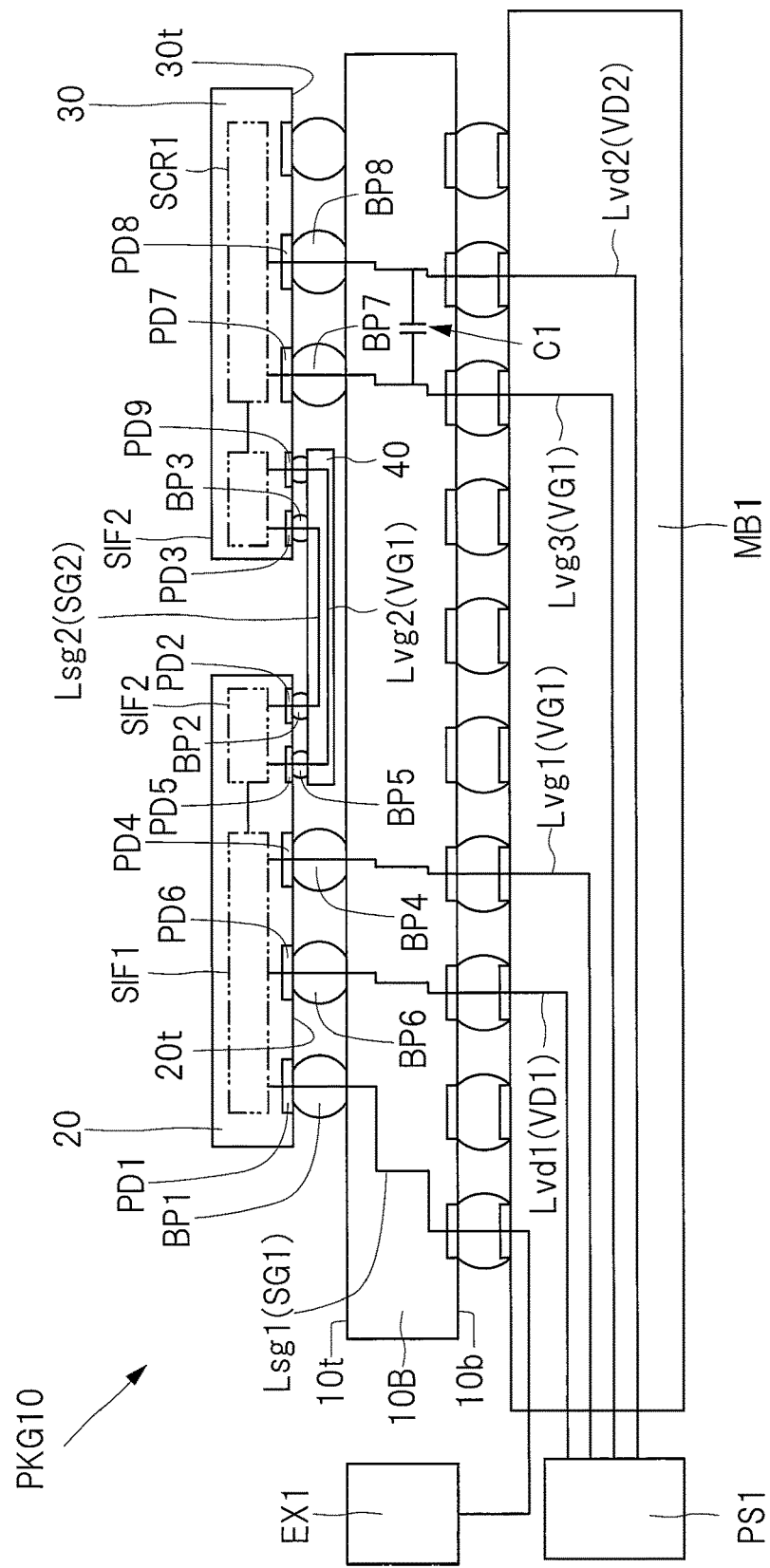
FIG. 22 is an explanatory drawing schematically showing a configuration example of a semiconductor device according to another modification of FIG. 1.
Figure 23:
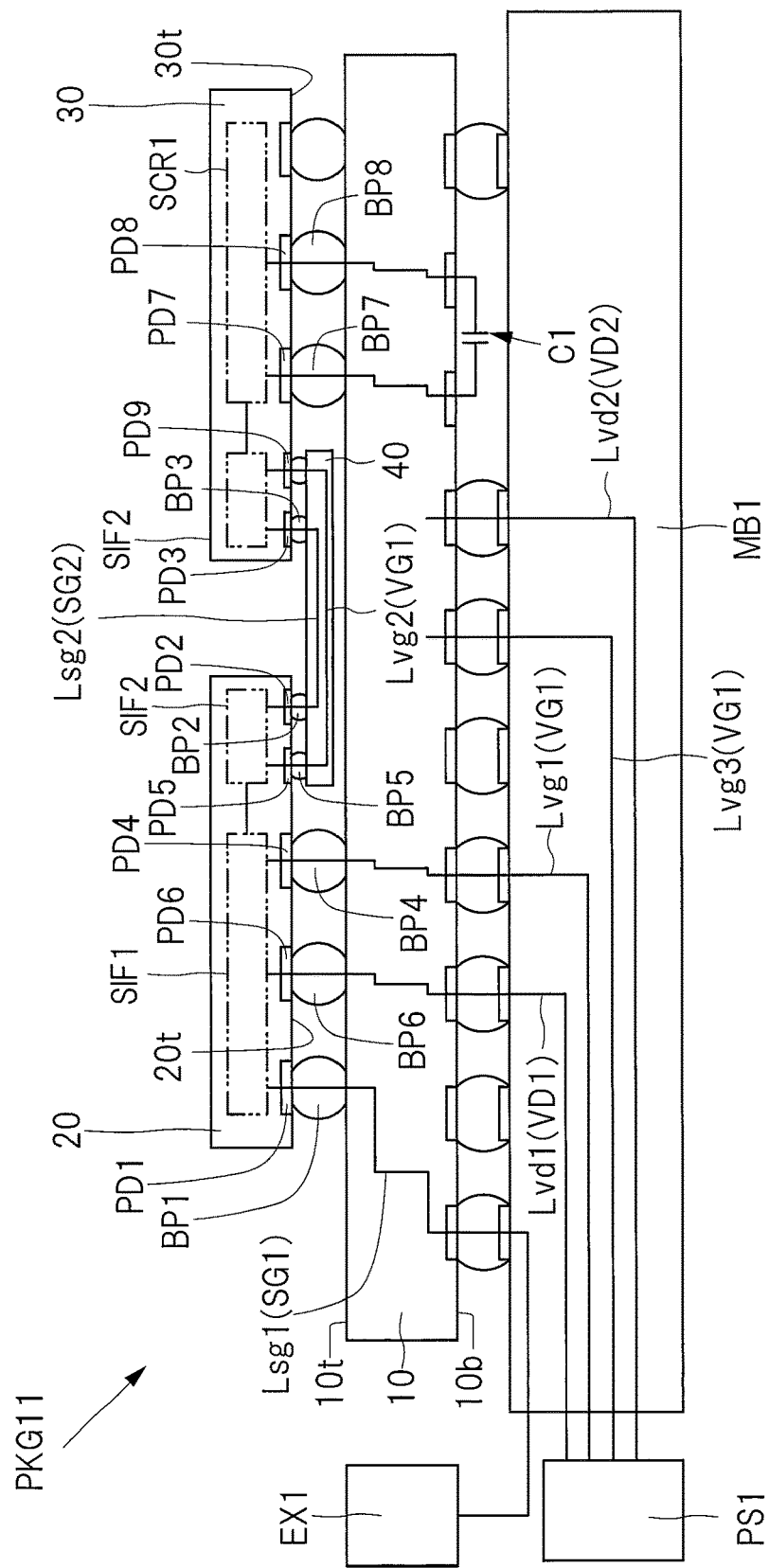
FIG. 23 is an explanatory drawing schematically showing a configuration example of a semiconductor device according to a modification of FIG. 22.

FIG. 22 is an explanatory drawing schematically showing a configuration example of the semiconductor device according to another modification of FIG. 1. In addition, FIG. 23 is an explanatory drawing schematically showing a configuration example of the semiconductor device according to a modification of FIG. 22. In FIG. 1, an embodiment in which the wiring substrate 10 and the terminal PD8 that allows the power-supply potential VD2 to be supplied to the semiconductor component 30 are connected to each other without the interposer 40 interposed therebetween in order to stabilize the power-supply potential VD2 has been described. As in the semiconductor device PKG10 shown in FIG. 22, a capacitor C1 may be arranged between the upper surface 10t and the lower surface 10b of the wiring substrate 10B at a position in which the capacitor C1 and the semiconductor component 30 overlap each other in the thickness direction.

The capacitor C1 shown in FIG. 22 is a substrate-embedded capacitor arranged between the upper surface 10t and the lower surface 10b of the wiring substrate 10B. The capacitor C1 has one electrode connected to the wiring path Lvd2 and the other electrode connected to the wiring path Lvg3. In other words, the capacitor C1 is arranged so as to be connected in parallel with respect to the wiring paths that supply power for driving the core circuit SCR1 (such as the arithmetic processing circuit). In this case, the capacitor C1 can serve as a bypass capacitor that bypasses noise (signals) in the wiring path Lvd2 to the wiring path Lvg3 side. In addition, by reducing a loop (path distance) of the current flowed through the core circuit SCR1 of the semiconductor component 30, the capacitor C1 can serve as a decoupling capacitor that reduces an adverse effect caused by an impedance component in the wiring path Lvd2 and the wiring path Lvg3. Further, by connecting the capacitor C1 to the vicinity of a circuit that consumes the supplied power, the capacitor C1 can serve as a battery that suppresses a phenomenon in which a drive voltage instantaneously drops.

In addition, as a further modification of FIG. 22, the capacitor C1 arranged at the position in which the capacitor C1 and the semiconductor component 30 overlap each other in the thickness direction as in the capacitor C1 within the semiconductor device PKG11 shown in FIG. 23 may be a surface-mount capacitor mounted on the lower surface 10b side of the wiring substrate 10. In the case of the surface-mount capacitor, the capacitor C1 is mounted after the wiring substrate 10 is completed, so that the manufacturing process can be simplified as compared to the substrate-embedded capacitor shown in FIG. 22. On the other hand, by utilizing the substrate-embedded capacitor C1 shown in FIG. 22, the wiring path distance between the capacitor C1 and the core circuit SCR1 can be shortened as compared to the surface-mount capacitor.

In such a semiconductor device PKG10 having the capacitor C1 arranged at the position in which the capacitor C1 and the semiconductor component 30 overlap each other in the thickness direction, the power-supply potential VD2 supplied to the core circuit SCR1 can be further stabilized as compared to the semiconductor device PKG1.

In addition, as shown in FIG. 22, it is particularly preferable that the capacitor C1 and the core circuit SCR1 overlap each other in the thickness direction from the viewpoint of shortening the path distance between the core circuit SCR1 and the capacitor C1.

The semiconductor device PKG10 shown in FIG. 22 is identical to the semiconductor device PKG1 described above with reference to FIGS. 1 to 11 with the exception of the above-described differences. In addition, the wiring substrate 10B shown in FIG. 22 is identical to the wiring substrate 10 described above with reference to FIGS. 1 to 11 with the exception of the above-described differences. Since the above-described wiring substrate 10 can be replaced with the wiring substrate 10B and the above-described semiconductor device PKG1 can be replaced with the semiconductor device PKG10 with the exception of the above-described differences, redundant descriptions will be omitted.

Tenth Modification

Figure 24:
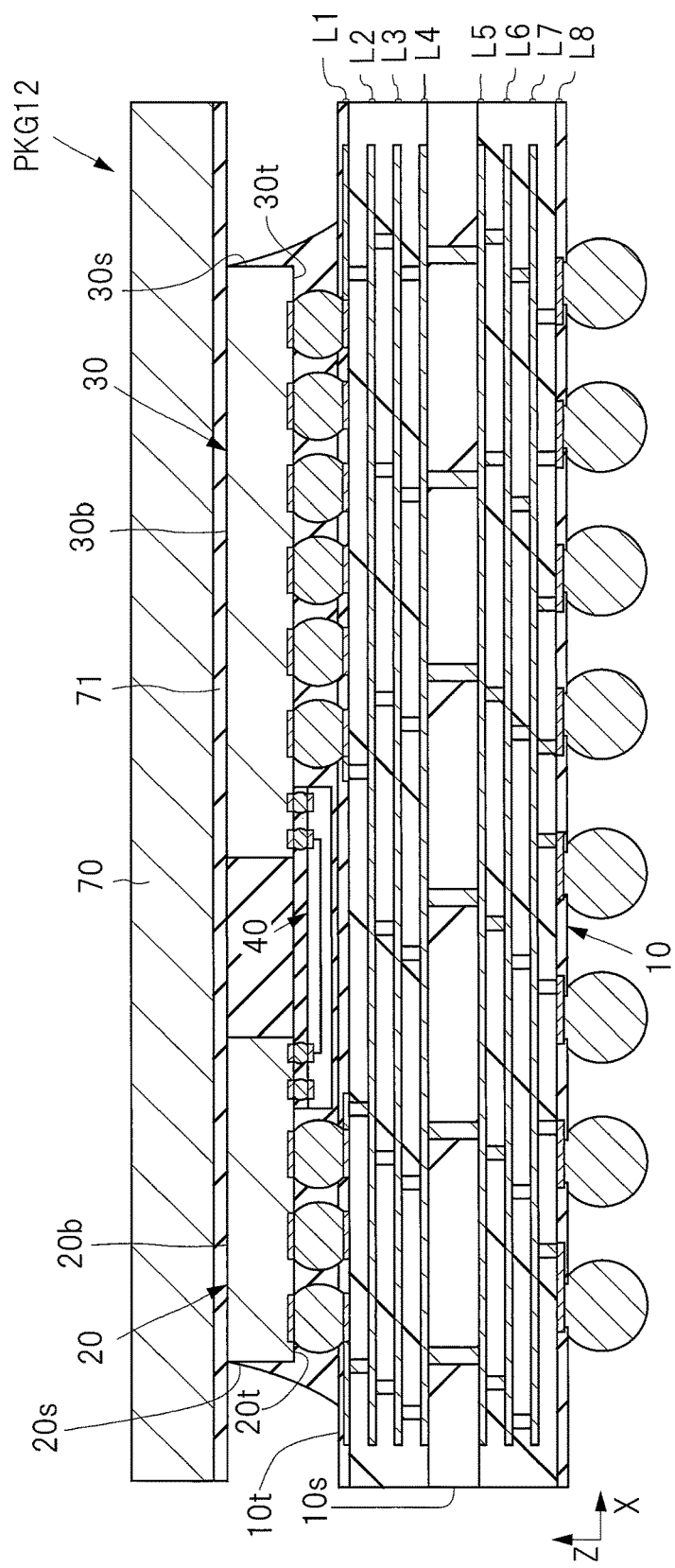
FIG. 24 is an explanatory drawing schematically showing a configuration example of a semiconductor device according to a modification of FIG. 4.

FIG. 24 is an explanatory drawing schematically showing a configuration example of the semiconductor device according to a modification of FIG. 4. In FIGS. 2 and 4, an embodiment in which the rear surface 20b of the semiconductor component 20 and the rear surface 30b of the semiconductor component 30 are exposed has been described. However, as in the semiconductor device PKG12 shown in FIG. 24, a heat sink 70 may be attached to the rear surface 20b of the semiconductor component 20 and the rear surface 30b of the semiconductor component 30.

In the example shown in FIG. 24, the heat dissipation component 70 is a metal plate and is adhered and fixed to the rear surface 20b of the semiconductor component 20 and the rear surface 30b of the semiconductor component 30 via an adhesive member 71. The adhesive member 71 may be an adhesive member made of resin; however, from the viewpoint of improving heat dissipation properties, it is preferable that the resin material contains a plurality of particles constituted by a heat dissipating material such as metal particles or carbon particles having a thermal conductivity that is higher than its base material.

In the example shown in FIG. 24, a height from the upper surface 10t of the wiring substrate 10 to the rear surface 20b of the semiconductor component 20 is substantially equal to a height from the upper surface 10t of the wiring substrate 10 to the rear surface 30b of the semiconductor component 30. Thus, the heat sink 70 is attached to the rear surface 20b of the semiconductor component 20 and the rear surface 30b of the semiconductor component 30. Although illustrations are omitted, there may be a case where the height from the upper surface 10t of the wiring substrate 10 to the rear surface 20b of the semiconductor component 20 is not equal to the height from the upper surface 10t of the wiring substrate 10 to the rear surface 30b of the semiconductor component 30. In this case, it is preferable that the heat dissipation component 70 is attached to at least the rear surface 30b of the semiconductor component 30. As described above with reference to FIG. 1, the semiconductor component 30 has the core circuit SCR1 and is more likely to generate heat as compared to the semiconductor component 20. Therefore, by attaching the heat dissipation component 70 to the semiconductor component 30 that generates a relatively large amount of heat, heat dissipation properties of the semiconductor device PKG12 can be improved.

Eleventh Modification

Figure 25:
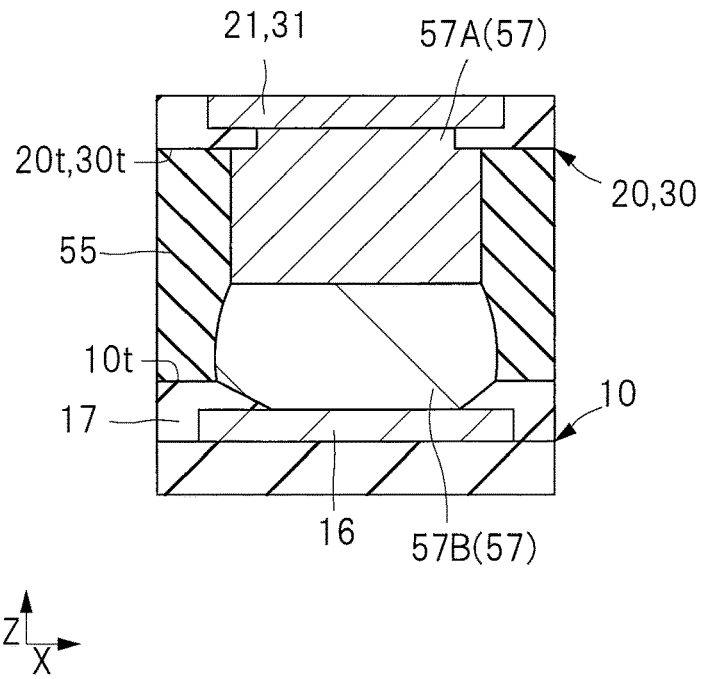
FIG. 25 is an enlarged cross-sectional view showing a modification of a bump electrode shown in FIG. 11 electrically connecting the semiconductor component and the wiring substrate to each other.
Figure 26:
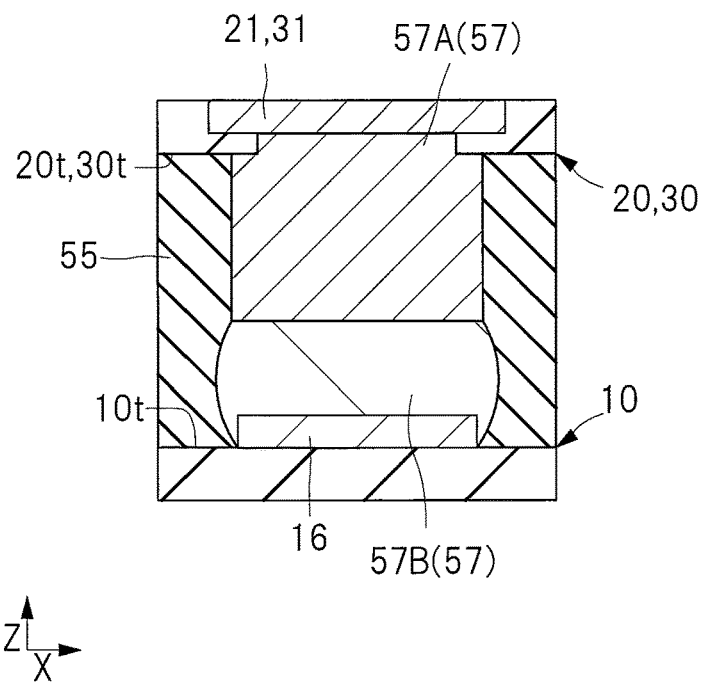
FIG. 26 is an enlarged cross-sectional view showing another modification of a bump electrode shown in FIG. 11 electrically connecting the semiconductor component and the wiring substrate to each other.

FIGS. 25 and 26 are enlarged cross-sectional views each showing a modification of the bump electrode shown in FIG. 11 electrically connecting the semiconductor component and the wiring substrate to each other.

In the example shown in FIG. 11, an embodiment in which the terminal 21 of the semiconductor component 20 and the bonding pad 16 of the wiring substrate 10 are electrically connected to each other via the bump electrode 51 made of a solder material and in which the terminal 31 of the semiconductor component 30 and the bonding pad 16 of the wiring substrate 10 are electrically connected to each other via the bump electrode 52 made of a solder material has been described. Various modifications are applicable to the structures of the bump electrode 51 and bump electrode 52.

For example, the bump electrode may have a structure in which the terminal 21 (or terminal 31) and the bonding pad 16 are electrically connected to each other via the bump electrode 57 comprising a conductive pillar 57A and a solder layer 57B as in a bump electrode 57 shown in FIG. 25.

In addition, in the example shown in FIG. 25, an embodiment having a SMD (solder mask defined) structure in which a portion of the bonding pad 16 is covered by the insulating film 17 is shown by way of example. However, as in the modification shown in FIG. 26, the embodiment may have a NSMD (non-solder mask defined) structure in which the bonding pad 16 is exposed through the insulating film 17 (see FIG. 25).

In the foregoing, the invention made by the present inventors has been concretely described based on the embodiments. However, it goes without saying that the present invention is not limited to the foregoing embodiments, and various modifications can be made within the scope of the present invention.

For example, the modifications can be combined and applied within the scope of the above-described technical ideas of the foregoing embodiments.

Contents of the foregoing embodiments will be partially described below.

[Additional Statement 1]

A semiconductor device comprising:

a wiring substrate that includes a first surface and a second surface located opposite to the first surface;

a first semiconductor component that includes a first main surface and a first rear surface located opposite to the first main surface, and is mounted on the first surface of the wiring substrate in a state where the first main surface and the first surface of the wiring substrate are facing each other;

a second semiconductor component that includes a second main surface and a second rear surface located opposite to the second main surface, and is mounted on the first surface of the wiring substrate in a state where the second main surface and the first surface of the wiring substrate are facing each other; and a first wiring member that includes a plurality of wiring paths electrically connecting the first semiconductor component and the second semiconductor component to each other, wherein a first terminal electrically connected to the wiring substrate via a first bump electrode without the first wiring member interposed therebetween and a second terminal electrically connected to the first wiring member via a second bump electrode are arranged on the first main surface of the first semiconductor component, a third terminal electrically connected to the first wiring member via a third bump electrode and a fourth terminal electrically connected to the wiring substrate via a third bump electrode without the first wiring member interposed therebetween are arranged on the second main surface of the second semiconductor component, and each of the first bump electrode, second bump electrode and third bump electrode is encapsulate with resin.

[Additional Statement 2]

The semiconductor device according to additional statement 1, wherein a volume of each of the second bump electrode and third bump electrode is smaller than a volume of the first bump electrode.

[Additional Statement 3]

The semiconductor device according to additional statement 2, wherein the second bump electrode and the third bump electrode are encapsulated in a first resin body, and the first bump electrode is encapsulated in a second resin body that is separate from the first resin body.

LIST OF REFERENCE SIGNS 10, 10A, 10B: wiring substrate
10b: lower surface (surface, board mounting surface)
10c: cavity (opening, stepped portion)
10s: side surface
10t: upper surface (surface, chip mounting surface)
11: solder ball (external terminal)
12: land (external terminal, solder ball connecting pad)
13: wiring
13P: conductive plane
14: insulating layer
14c: core layer (core layer material, core insulating layer, insulating layer)
15TW: through-hole wiring
15VW: via wiring
16: bonding pad (substrate terminal, semiconductor component connecting terminal)
17: insulating film (solder-resist mask)
20, 30, 30A, 30B, 30C, 60, 61: semiconductor component
20b, 30b: rear surface
20s1, 20s2: side
20t, 30t, 60t: main surface
21, 22, 31, 32, PD1, PD2, OD3, PD4, PD5, PD6, PD7, PD7A, PD8, PD8A, PD9, PD10, PD11, PD12, PD13, PD14: terminal (electrode, component electrode, pad)
23, 33: semiconductor substrate (base member)
23t, 33t: main surface
24, 34: wiring layer
25, 35: passivation film
40, 40A, 40B, 40C, 40D, 40E, 40F, 40h: interposer
40b: lower surface (surface, rear surface)
40G: wiring member
40s: side surface 40t: upper surface (surface, relay terminal positioning surface)
40W: wire
41, 42: bonding pad (terminal, relay board terminal)
43: wiring
44: semiconductor substrate (base member)
44t: main surface
45: insulating layer
46: passivation film
47: terminal
48: through electrode
51, 52, 53, 54, BP1, BP2, BP3, BP4, BP5, BP6, BP7, BP8, BP9, BP12, BP13, BP14, BPh1: bump electrode (conductive member)
53A: conductive pillar
53b: lower surface
53B: solder layer
53t: upper surface
55, 56: resin body
56s: boundary surface
70: heat sink
70: heat dissipation component
71: adhesive member
C1: capacitor
D1, D2: separation distance
DSn, DSp: differential signal transmission path
EX1, EX2: external device
L1, L2, L3, L4, L5, L6, L7, L8, M1, M2, M3, M4, M5: wiring layer
Lsg1, Lsg2, Lsg3, Lsg4: signal transmission path (wiring path)
Lvd1, Lvd2, Lvd3, Lvg1, Lvg2, Lvg3, Lvg4, Lvg5: wiring path
MB1: mounting board (motherboard)
PKG1, PKG2, PKG3, PKG4, PKG5, PKG6, PKG7, PKG8, PKG9, PKG10, PKG11, PKG12, PKGh1: semiconductor device
PS1: potential-supply unit
SCR1: core circuit (main circuit)
SG1, SG2, SG3, SG4: signals
SIF1: external interface circuit (external input/output circuit)
SIF2, SIF3, SIF4: internal interface circuit (internal input/output circuit)
SME1: memory circuit (main memory circuit, memory circuit)
VD1, VD2, VD3: power-supply potential
VG1: ground potential

The invention claimed is:

1. A semiconductor device comprising:
a first semiconductor component;
a second semiconductor component;
a wiring substrate on which each of the first semiconductor component and second semiconductor component is mounted; and
a first wiring member that includes a plurality of wiring paths electrically connecting the first semiconductor component and the second semiconductor component to each other,
wherein the first semiconductor component includes a first main surface on which a first terminal for transmitting a first signal between the first semiconductor component and the outside and a second terminal for transmitting a second signal between the first semiconductor component and the second semiconductor component are arranged,
the second semiconductor component includes a second main surface on which a third terminal for transmitting the second signal between the second semiconductor component and the first semiconductor component is arranged,
the first signal is transmitted at a higher frequency than the second signal,
the first terminal of the first semiconductor component is electrically connected to the wiring substrate via a first bump electrode without the first wiring member interposed therebetween, and
the second terminal of the first semiconductor component and the third terminal of the second semiconductor component are electrically connected to each other via the first wiring member.

2. The semiconductor device according to claim 1, wherein a separation distance between the second terminal of the first semiconductor component and the third terminal of the second semiconductor component is shorter than a separation distance between the first terminal of the first semiconductor component and the third terminal of the second semiconductor component.

3. The semiconductor device according to claim 2, wherein the second terminal is electrically connected to the first wiring member via a second bump electrode, and
the third terminal is electrically connected to the first wiring member via a third bump electrode.

4. The semiconductor device according to claim 3, wherein a fourth terminal and a fifth terminal that allow a ground potential to be supplied are arranged on the first main surface of the first semiconductor component,
the fourth terminal is electrically connected to the wiring substrate via a fourth bump electrode without the first wiring member interposed therebetween, and
the fifth terminal is electrically connected to the first wiring member via a fifth bump electrode.

5. The semiconductor device according to claim 4, wherein the separation distance between the second terminal of the first semiconductor component and the third terminal of the second semiconductor component is shorter than a separation distance between the first terminal and the second terminal of the first semiconductor component.

6. The semiconductor device according to claim 5, wherein the fourth terminal is arranged between the first terminal and the second terminal.

7. The semiconductor device according to claim 6, wherein the separation distance between the second terminal of the first semiconductor component and the third terminal of the second semiconductor component is shorter than a separation distance between the fourth terminal and the second terminal of the first semiconductor component.

8. The semiconductor device according to claim 6, wherein a sixth terminal that allows a power-supply potential to be supplied is arranged on the first main surface of the first semiconductor component, and
the sixth terminal is electrically connected to the wiring substrate via a sixth bump electrode without the first wiring member interposed therebetween.

9. The semiconductor device according to claim 8, wherein the sixth terminal is arranged between the first terminal and the second terminal.

10. The semiconductor device according to claim 3,
wherein a seventh terminal that allows a ground potential to be supplied is arranged on the second main surface of the second semiconductor component, and the seventh terminal is electrically connected to the wiring substrate via a seventh bump electrode without the first wiring member interposed therebetween.

11. The semiconductor device according to claim 10,
wherein an eighth terminal that allows a power-supply potential to be supplied is arranged on the second main surface of the second semiconductor component, and the eighth terminal is electrically connected to the wiring substrate via an eighth bump electrode without the first wiring member interposed therebetween.

12. The semiconductor device according to claim 3,
wherein the first wiring member has a portion positioned between the first semiconductor component and the wiring substrate and another portion positioned between the second semiconductor component and the wiring substrate in a thickness direction of the wiring substrate.

13. The semiconductor device according to claim 3,
wherein each of the first bump electrode, second bump electrode and third bump electrode is encapsulated with resin.

14. The semiconductor device according to claim 13,
wherein a volume of each of the second bump electrode and third bump electrode is smaller than a volume of the first bump electrode.

15. The semiconductor device according to claim 14,
wherein the second bump electrode and the third bump electrode are encapsulated in a first resin body, and the first bump electrode is encapsulated in a second resin body that is separate from the first resin body.

* * * * *